(12) United States Patent
Baek et al.

(10) Patent No.: US 9,787,328 B2
(45) Date of Patent: Oct. 10, 2017

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG ELECTRONICS INC., Seoul (KR)

(72) Inventors: Jongseob Baek, Seoul (KR); Seoyoung Back, Seoul (KR); Woosuk Ko, Seoul (KR); Sungryong Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/744,490

(22) Filed: Jun. 19, 2015

(65) Prior Publication Data

US 2016/0056923 A1 Feb. 25, 2016

Related U.S. Application Data

(60) Provisional application No. 62/039,921, filed on Aug. 21, 2014, provisional application No. 62/051,966, filed on Sep. 18, 2014.

(51) Int. Cl.
*H03K 9/00* (2006.01)
*H03M 13/27* (2006.01)
(Continued)

(52) U.S. Cl.
CPC ... *H03M 13/2792* (2013.01); *H03M 13/1102* (2013.01); *H04B 7/046* (2013.01);
(Continued)

(58) Field of Classification Search
CPC . H04L 27/2647; H04L 1/0071; H04L 1/0048; H04L 27/2649; H04L 65/476;
(Continued)

(56) References Cited

U.S. PATENT DOCUMENTS

2010/0251078 A1  9/2010 Yokokawa et al.
2010/0290561 A1* 11/2010 Ko ..................... H04L 27/2627
                                                 375/298
(Continued)

FOREIGN PATENT DOCUMENTS

EP         2472751 A1    7/2012
KR       10-1079106 A    4/2010
(Continued)

OTHER PUBLICATIONS

International Search Report from PCT/KR2015/005458, dated Sep. 25, 2015; International Filing date Jun. 1, 2015; Korean Intellectual Property Office, (Government Complex-Daejeon, Dunsan-dong) 4-dong, 189 Cheongsa-ro, Seo-gu, Daejeon (35208).
(Continued)

*Primary Examiner* — Janice Tieu
(74) *Attorney, Agent, or Firm* — Dentons US LLP

(57) ABSTRACT

The present invention provides a method of transmitting broadcast signals. The method includes, formatting, by an input formatting block, input streams into plural PLPs (Physical Layer Pipes); encoding, by an encoder, data in the plural PLPs; processing, by a framing and interleaving block, the encoded data in the plural PLPs to output at least one signal frame; and waveform modulating, by a waveform generation block, data in the at least one signal frame and transmitting, by the waveform generation block, broadcast signals having the waveform modulated data.

10 Claims, 55 Drawing Sheets

(51) Int. Cl.

| | | |
|---|---|---|
| *H04L 1/00* | (2006.01) | |
| *H04B 7/06* | (2006.01) | |
| *H04B 7/04* | (2017.01) | |
| *H04L 27/26* | (2006.01) | |
| *H04L 29/06* | (2006.01) | |
| *H03M 13/11* | (2006.01) | |
| *H04B 7/0413* | (2017.01) | |

(52) U.S. Cl.
CPC ......... *H04B 7/0606* (2013.01); *H04L 1/0041* (2013.01); *H04L 1/0042* (2013.01); *H04L 1/0048* (2013.01); *H04L 1/0057* (2013.01); *H04L 1/0071* (2013.01); *H04L 1/0083* (2013.01); *H04L 27/2649* (2013.01); *H04L 65/4076* (2013.01); *H04B 7/0413* (2013.01); *H04L 2001/0093* (2013.01)

(58) Field of Classification Search
CPC .......... H04L 1/0057; H04L 2001/0093; H04B 1/1027; H04B 7/0413; H04B 7/0606; H04B 7/046; H04N 5/4401
USPC .................................................. 375/316, 346
See application file for complete search history.

(56) References Cited

U.S. PATENT DOCUMENTS

| | | |
|---|---|---|
| 2012/0243561 A1 | 9/2012 | Loghin et al. |
| 2012/0272117 A1 | 10/2012 | Stadelmeier et al. |
| 2013/0117624 A1 | 5/2013 | Nicolas et al. |
| 2014/0143639 A1 | 5/2014 | Loghin et al. |
| 2014/0269960 A1* | 9/2014 | Petrov ................. H04L 27/3444 375/261 |
| 2015/0304070 A1 | 10/2015 | Baek et al. |
| 2015/0358114 A1 | 12/2015 | Baek et al. |
| 2016/0233983 A1* | 8/2016 | Jeong ................. H03M 13/1102 |

FOREIGN PATENT DOCUMENTS

| | | |
|---|---|---|
| KR | 10-2013-0119281 A | 10/2013 |
| KR | 10-2013-0121881 A | 11/2013 |
| KR | 10-2014-0061326 A | 5/2014 |
| KR | 10-2014-0086949 A | 7/2014 |
| WO | 2011-105786 A2 | 9/2011 |

OTHER PUBLICATIONS

Written Opinion of the ISA from PCTKR2015/005458, dated Sep. 25, 2015; International Filing date Jun. 1, 2015, Korean Intellectual Property Office, (Goverment Complex-Daejeon, Dunsan-dong) 4-dong, 189 Cheongsa-ro, Seo-gu, Daejeon (35208).

International Search Report and Written Opinion from PCT/KR2015/005467, dated Sep. 16, 2015, 27 pages.

* cited by examiner

| Content | Bits |
|---|---|
| PHY_PROFILE | 3 |
| FFT_SIZE | 2 |
| GI_FRACTION | 3 |
| EAC_FLAG | 1 |
| PILOT_MODE | 1 |
| PAPR_FLAG | 1 |
| FRU_CONFIGURE | 3 |
| RESERVED | 7 |

FIG. 13

| Content | Bits |
|---|---|
| PREAMBLE_DATA<br>NUM_FRAME_FRU<br>PAYLOAD_TYPE<br>NUM_FSS<br>SYSTEM_VERSION | 20<br>2<br>3<br>2<br>8 |
| CELL_ID<br>NETWORK_ID<br>SYSTEM_ID | 16<br>16<br>16 |
| for i = 0:3<br>    FRU_PHY_PROFILE<br>    FRU_FRAME_LENGTH<br>    FRU_GI_FRACTION<br>    RESERVED<br>end | <br>3<br>2<br>3<br>4 |
| PLS2_FEC_TYPE<br>PLS2_MOD<br>PLS2_SIZE_CELL<br>PLS2_STAT_SIZE_BIT<br>PLS2_SYN_SIZE_BIT<br>PLS2_REP_FLAG<br>PLS2_REP_SIZE_CELL<br>PLS2_NEXT_FEC_TYPE<br>PLS2_NEXT_MODE<br>PLS2_NEXT_REP_FLAG<br>PLS2_NEXT_REP_SIZE_CELL<br>PLS2_NEXT_REP_STAT_SIZE_BIT<br>PLS2_NEXT_REP_DYN_SIZE_BIT<br>PLS2_AP_MODE<br>PLS2_AP_SIZE_CELL<br>PLS2_NEXT_AP_MODE<br>PLS2_NEXT_AP_SIZE_CELL | 2<br>3<br>15<br>14<br>14<br>1<br>15<br>2<br>3<br>1<br>15<br>14<br>14<br>2<br>15<br>2<br>15 |
| RESERVED<br>CRC 32 | 32<br>32 |

FIG. 14

| Content | Bits |
|---|---|
| FIC_FLAG | 1 |
| AUX_FLAG | 1 |
| NUM_DP | 6 |
| for i = 1 : NUM_DP | |
|     DP_ID | 6 |
|     DP_TYPE | 3 |
|     DP_GROUP_ID | 8 |
|     BASE_DP_ID | 6 |
|     DP_FEC_TYPE | 2 |
|     DP_COD | 4 |
|     DP_MOD | 4 |
|     DP_SSD_FLAG | 1 |
|     if PHY_PROFILE = '010' | |
|         DP_MIMO | 3 |
|     end | |
|     DP_TI_TYPE | 1 |
|     DP_TI_LENGTH | 2 |
|     DP_TI_BYPASS | 1 |
|     DP_FRAME_INTERVAL | 2 |
|     DP_FIRST_FRAME_IDX | 5 |
|     DP_NUM_BLOCK_MAX | 10 |
|     DP_PAYLOAD_TYPE | 2 |
|     DP_INBAND_MODE | 2 |
|     DP_PROTOCOL_TYPE | 2 |
|     DP_CRC_MODE | 2 |
|     if DP_PAYLOAD_TYPE == TS('00') | |
|         DNP_MODE | 2 |
|         ISSY_MODE | 2 |
|         HC_MODE_TS | 2 |
|         if HC_MODE_TS == '01' or '10' | |
|             PID | 13 |
|         end | |
|     if DP_PAYLOAD_TYPE == IP('01') | |
|         HC_MODE_IP | 2 |
|     end | |
|     RESERVED | 8 |
| end | |
| if FIC_FLAG == 1 | |
|     FIC_VERSION | 8 |
|     FIC_LENGTH_BYTE | 13 |
|     RESERVED | 8 |
| end | |
| if AUX_FLAG == 1 | |
|     NUM_AUX | 4 |
|     AUX_CONFIG_RFU | 8 |
|     for - 1 : NUM_AUX | |
|         AUX_STREAM_TYPE | 4 |
|         AUX_PRIVATE_CONF | 28 |
|     end | |
| end | |

| Content | | Bit |
|---|---|---|
| FRAME_INDEX | | 5 |
| PLS_CHANGE_COUNTER | | 4 |
| FIC_CHANGE_COUNTER | | 4 |
| RESERVED | | 16 |
| for i = 1: NUM_DP | | |
| | DP_ID | 6 |
| | DP_START | 15 (or 13) |
| | DP_NUM_BLOCK | 10 |
| end | RESERVED | 8 |
| EAC_FLAG | | 1 |
| EAS_WAKE_UP_VERSION_NUM | | 8 |
| if EAC_FLAG = 1 | | |
| | EAC_LENGTH_BYTE | 12 |
| else | | |
| | EAC_COUNTER | 12 |
| end | | |
| for i=1:NUM_AUX | | |
| | AUX_PRIVATE_DYN | 48 |
| end | | |
| CRC 32 | | 32 |

FIG. 25
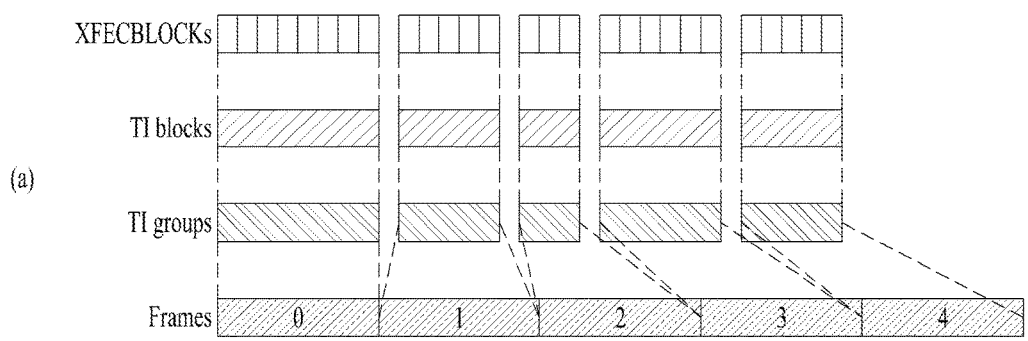
(a)
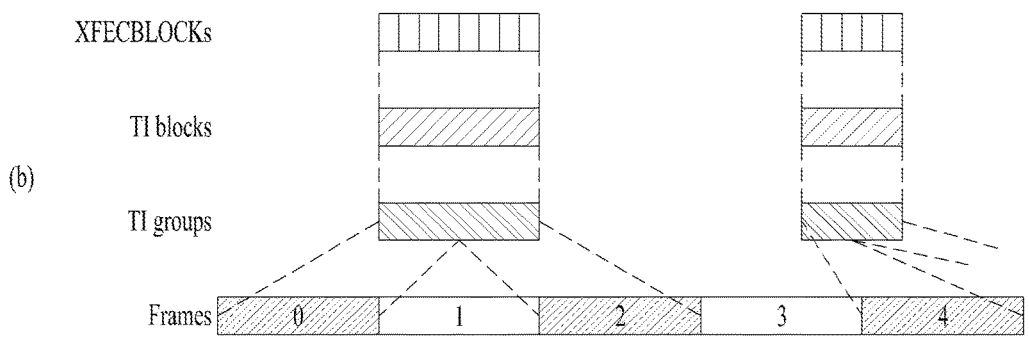
(b)
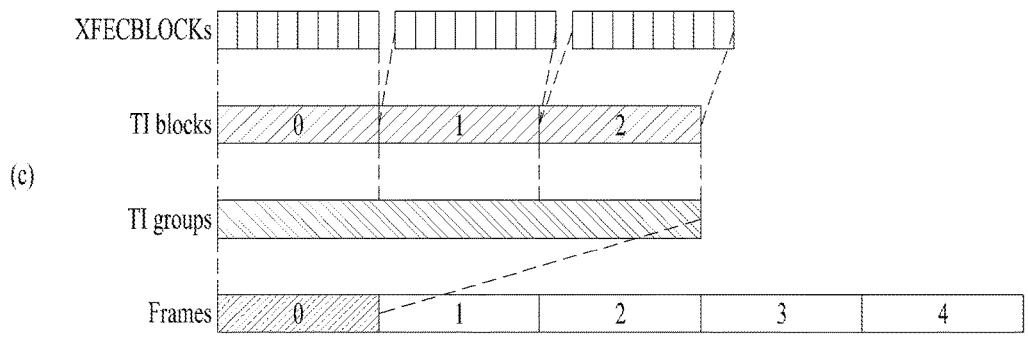
(c)

FIG. 26
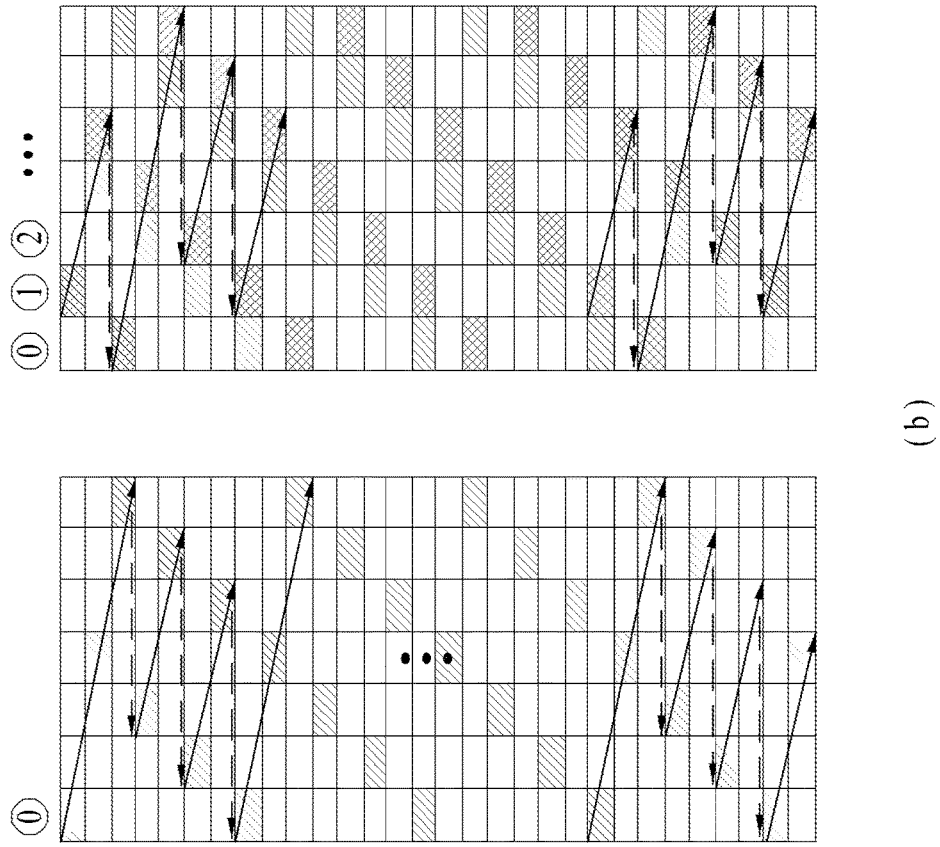
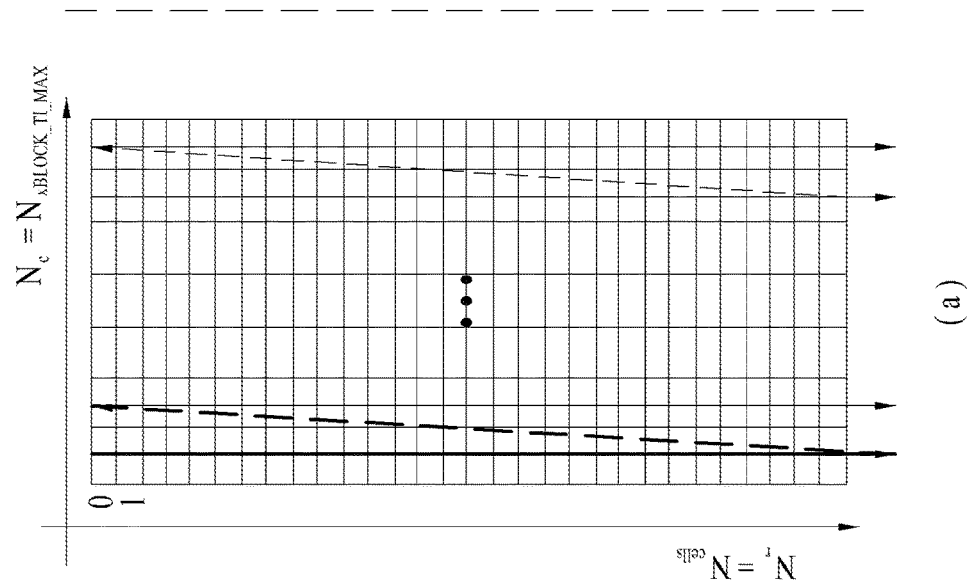

FIG. 42 t42010 — $X_j = [X_j(0), X_j(1), \ldots, X_j(N_{cells}-2), X_j(N_{cells}-1)]$ t42020 — $F_j = [F_j(0), F_j(1), \ldots, F_j(N_{cells}-2), F_j(N_{cells}-1)]$, t42030 — $F_j(k) = X_j(C_j(k))$

FIG. 43

$F_j(k) = X_j(C_j(k))$ where $C_j(k) = (T(k) + S_j) \bmod N_{cells}$

FIG. 48 t48010 — $G(r) = [g_{r,0}, g_{r,1}, g_{r,2}, \ldots, g_{r,Ncells-2}, g_{r,Ncells-1}]$ t48020 — $T(r) = [t_{r,0}, t_{r,1}, t_{r,2}, \ldots, t_{r,Ncells-2}, t_{r,Ncells-1}]$ t48030 — $t_{r,q} = g_{r,L_{r(q)}}$, for $q = 0, \ldots, N_{cells}-1$ t48040 — $L_{r(q)} = [L_0(q) + P(r)] \bmod N_{cells}$,

FIG. 49 t49010 — $T(r) = [t_{r,0}, t_{r,1}, t_{r,2}, \ldots, t_{r,Ncells-2}, t_{r,Ncells-1}]$ t49020 — $D(r) = [d_{r,0}, d_{r,1}, d_{r,2}, \ldots, d_{r,Ncells-2}, d_{r,Ncells-1}]$ t49030 — $d_{r,Q(q)} = t_{r,q}$, for $q = 0, \ldots, N_{cells}-1$ $Cr\_cnt = 0, \mu_2 = 0;$
for $q = 0 : N_{cells} - 1$
   if $(q \leq \alpha N_{IU}[L_{IU,min}/\alpha]-1)$
      $\mu_1 = mod([q/\alpha], N_{IU});$
      $Q_{(q)} = \sum_{k=0}^{\mu_1} L_{IU}(k-1) + \alpha[q/\alpha N_{IU})] + mod(q,\alpha);$
   else
      $Q_{(q)} = \sum_{k=0}^{\mu_2} L_{IU}(k-1) + \alpha[L_{,min}/\alpha] + Cr\_cnt;$
      $Cr\_cnt = Cr\_cnt + 1;$
      if $mod(Cr_{cnt}, L_{IU,diff}(\mu_2)) = 0$
         $Cr\_cnt = 0, \mu_2 = \mu_2 + 1;$
      end
   end
end where $L_{IU}(-1) = 0, L_{IU,diff}(k) = L_{IU}(k) - \alpha[L_{IU,min}/\alpha]$ if mod($L_{IU}(0), \alpha$)=0, $\omega = [L_{IU}(k)/\alpha]$,
else, $\omega = [L_{IU}(0)/\alpha]+1$
end for p = 0 : $\omega$ -1
  for k = 0 : $L_{IU}$ -1
    if ((p+1)$\alpha \leq L_{IU}(k)$)
      $C_p(k) = \alpha$,
    else
      $C_p(k) = $ mod($L_{IU}(k),\alpha$),
    end
  end
end FIG. 65
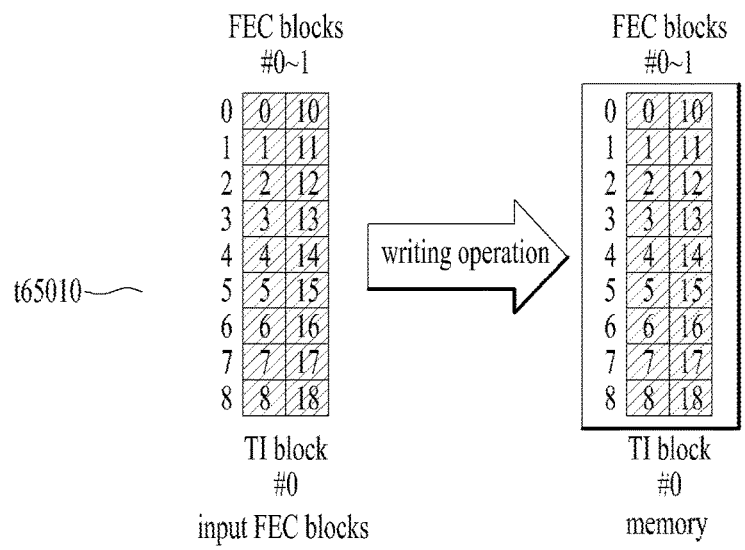
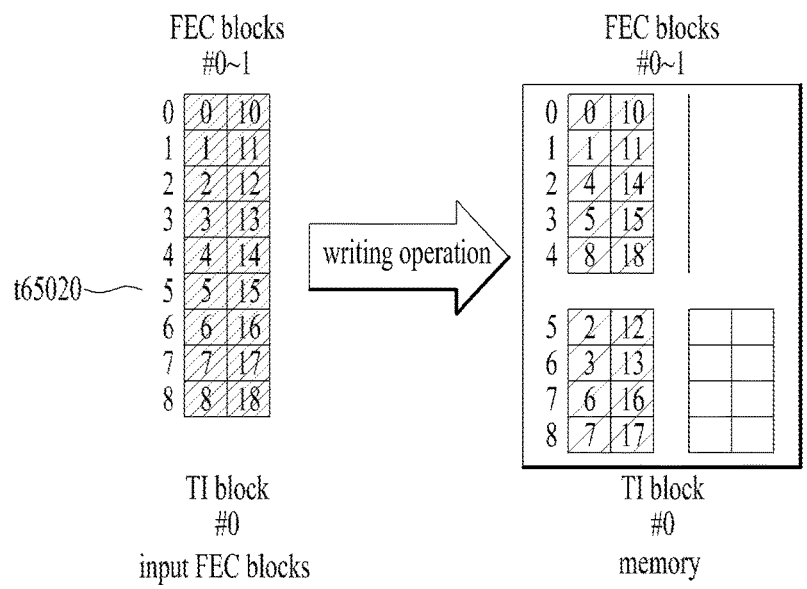

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

Pursuant to 35 U.S.C. §119(a), this application claims the benefit of U.S. Provisional Applications No. 62/039,921, filed on Aug. 21, 2014, and 62/051,966, filed on Sep. 18, 2014, which is hereby incorporated by reference as if fully set forth herein.

BACKGROUND OF THE INVENTION

Field of the Invention

The present invention relates to an apparatus for transmitting broadcast signals, an apparatus for receiving broadcast signals and methods for transmitting and receiving broadcast signals.

Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

Accordingly, the present invention is directed to an apparatus for transmitting broadcast signals and an apparatus for receiving broadcast signals for future broadcast services and methods for transmitting and receiving broadcast signals for future broadcast services.

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

To achieve the object and other advantages and in accordance with the purpose of the invention, as embodied and broadly described herein, the present invention provides a method of transmitting broadcast signals. The method of transmitting broadcast signals includes formatting, by an input formatting block, input streams into plural PLPs (Physical Layer Pipes); encoding, by an encoder, data in the plural PLPs; processing, by a framing and interleaving block, the encoded data in the plural PLPs to output at least one signal frame; and waveform modulating, by a waveform generation block, data in the at least one signal frame and transmitting, by the waveform generation block, broadcast signals having the waveform modulated data.

Preferably, the processing the encoded data further includes: time interleaving, by a time interleaver, the encoded data in the plural PLPs; frame mapping, by a framer, the time interleaved data onto the at least one signal frame; and frequency interleaving, by a frequency interleaver, the data in the at least one signal frame.

In other aspect, the present invention provides a method of receiving broadcast signals. The method of receiving broadcast signals includes receiving, by a waveform block, broadcast signals having at least one signal frame and demodulating, by the waveform block, data in the at least one signal frame; processing, by a parsing and deinterleaving block, the demodulated data in the at least one signal frame to output plural PLPs (Physical Layer Pipes); decoding, by a decoder, data in the plural PLPs; and output processing, by an output processing block, the decoded data in the plural PLPs to output output streams.

Preferably, the processing the demodulated data further includes: frequency deinterleaving, by a frequency deinterleaver, the demodulated data in the at least one signal frame; frame parsing, by a frame parser, the plural PLPs from the at least one signal frame; and time deinterleaving, by a time deinterleaver, the data in the plural PLPs.

In another aspect, the present invention provides an apparatus for transmitting broadcast signals. The apparatus for transmitting broadcast signals includes an input formatting block that formats input streams into plural PLPs (Physical Layer Pipes); an encoder that encodes data in the plural PLPs; a framing and interleaving block that processes the encoded data in the plural PLPs to output at least one signal frame; and a waveform generation block that waveform modulates data in the at least one signal frame and transmits broadcast signals having the waveform modulated data.

Preferably, the framing and interleaving block further includes: a time interleaver that time interleaves the encoded data in the plural PLPs; a framer that frame maps the time interleaved data onto the at least one signal frame; and a frequency interleaver that frequency interleaves the data in the at least one signal frame.

In another aspect, the present invention provides an apparatus for receiving broadcast signals. The apparatus for receiving broadcast signals includes a waveform block that receives broadcast signals having at least one signal frame and demodulates data in the at least one signal frame; a parsing and deinterleaving block that processes the demodulated data in the at least one signal frame to output plural PLPs (Physical Layer Pipes); a decoder that decodes data in the plural PLPs; and an output processing block that output processes the decoded data in the plural PLPs to output output streams.

Preferably, the parsing and deinterleaving block further includes: a frequency deinterleaver that frequency deinterleaves the demodulated data in the at least one signal frame; a frame parser that frame parses the plural PLPs from the at least one signal frame; and a time deinterleaver that time deinterleaves the data in the plural PLPs.

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 13 illustrates PLS1 data according to an embodiment of the present invention.

FIG. 14 illustrates PLS2 data according to an embodiment of the present invention.

FIG. 25 illustrates a time interleaving according to an embodiment of the present invention.

FIG. 26 illustrates the basic operation of a twisted row-column block interleaver according to an embodiment of the present invention.

FIG. 42 is a view mathematically expressing linear writing & random reading operation of the cell interleaver according to another embodiment of the present invention.

FIG. 43 is a view mathematically expressing a permutation sequence generating method of the cell interleaver according to another embodiment of the present invention cell interleaver.

FIG. 48 shows mathematical expressions of the operation corresponding to stage A in the operation of the cell interleaver according to another embodiment of the present invention.

FIG. 49 shows mathematical expressions of the operation corresponding to stage B in the operation of the cell interleaver according to another embodiment of the present invention.

FIG. 65 illustrates an operation of the block interleaver in the time interleaver varying with the number of IUs according to another embodiment of the present invention.

DETAILED DESCRIPTION OF THE INVENTION

Figure 1:
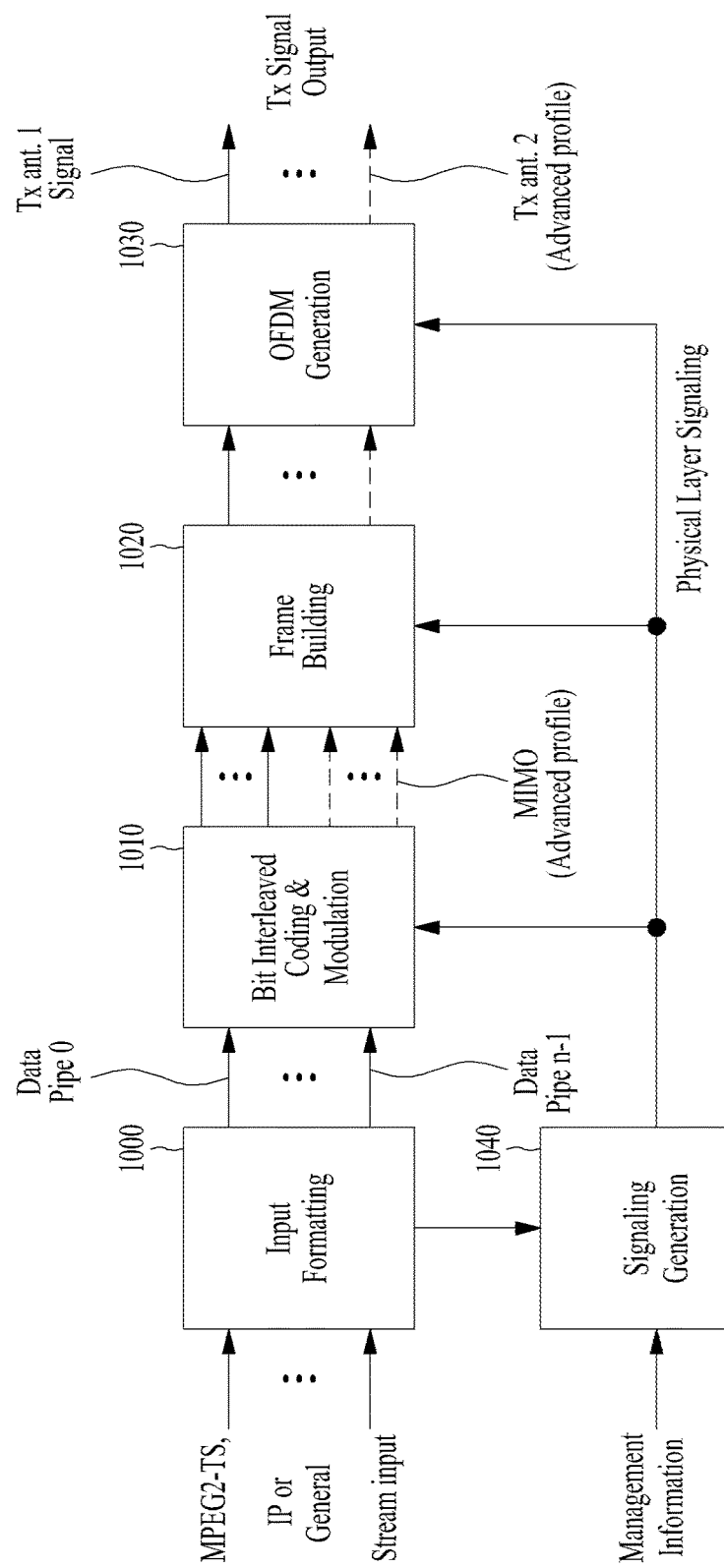
FIG. 1 illustrates a structure of an apparatus for transmitting broadcast signals for future broadcast services according to an embodiment of the present invention.

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles (base, handheld and advanced profiles), each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| | |
|---|---|
| LDPC codeword length | 16K, 64K bits |
| Constellation size | 4~10 bpcu (bits per channel use) |
| Time de-interleaving memory size | $\leq 2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| | |
|---|---|
| LDPC codeword length | 16K bits |
| Constellation size | 2~8 bpcu |
| Time de-interleaving memory size | $\leq 2^{18}$ data cells |
| Pilot patterns | Pilot patterns for mobile and indoor reception |
| FFT size | 8K, 16K points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| | |
|---|---|
| LDPC codeword length | 16K, 64K bits |
| Constellation size | 8~12 bpcu |
| Time de-interleaving memory size | $\leq 2^{19}$ data cells |
| Pilot patterns | Pilot pattern for fixed reception |
| FFT size | 16K, 32K points |

In this case, the base profile can be used as a profile for both the terrestrial broadcast service and the mobile broadcast service. That is, the base profile can be used to define a concept of a profile which includes the mobile profile. Also, the advanced profile can be divided advanced profile for a base profile with MIMO and advanced profile for a handheld profile with MIMO. Moreover, the three profiles can be changed according to intention of the designer.

The following terms and definitions may apply to the present invention. The following terms and definitions can be changed according to design.

auxiliary stream: sequence of cells carrying data of as yet undefined modulation and coding, which may be used for future extensions or as required by broadcasters or network operators base data pipe: data pipe that carries service signaling data baseband frame (or BBFRAME): set of $K_{bch}$ bits which form the input to one FEC encoding process (BCH and LDPC encoding)

cell: modulation value that is carried by one carrier of the OFDM transmission coded block: LDPC-encoded block of PLS1 data or one of the LDPC-encoded blocks of PLS2 data data pipe: logical channel in the physical layer that carries service data or related metadata, which may carry one or multiple service(s) or service component(s).

data pipe unit: a basic unit for allocating data cells to a DP in a frame.

data symbol: OFDM symbol in a frame which is not a preamble symbol (the frame signaling symbol and frame edge symbol is included in the data symbol)

DP_ID: this 8-bit field identifies uniquely a DP within the system identified by the SYSTEM_ID dummy cell: cell carrying a pseudo-random value used to fill the remaining capacity not used for PLS signaling, DPs or auxiliary streams emergency alert channel: part of a frame that carries EAS information data frame: physical layer time slot that starts with a preamble and ends with a frame edge symbol frame repetition unit: a set of frames belonging to same or different physical layer profile including a FEF, which is repeated eight times in a super-frame fast information channel: a logical channel in a frame that carries the mapping information between a service and the corresponding base DP FECBLOCK: set of LDPC-encoded bits of a DP data FFT size: nominal FFT size used for a particular mode, equal to the active symbol period $T_S$ expressed in cycles of the elementary period T frame signaling symbol: OFDM symbol with higher pilot density used at the start of a frame in certain combinations of FFT size, guard interval and scattered pilot pattern, which carries a part of the PLS data frame edge symbol: OFDM symbol with higher pilot density used at the end of a frame in certain combinations of FFT size, guard interval and scattered pilot pattern frame-group: the set of all the frames having the same PHY profile type in a super-frame.

future extension frame: physical layer time slot within the super-frame that could be used for future extension, which starts with a preamble Futurecast UTB system: proposed physical layer broadcasting system, of which the input is one or more MPEG2-TS or IP or general stream(s) and of which the output is an RF signal input stream: A stream of data for an ensemble of services delivered to the end users by the system.

normal data symbol: data symbol excluding the frame signaling symbol and the frame edge symbol PHY profile: subset of all configurations that a corresponding receiver should implement PLS: physical layer signaling data consisting of PLS1 and PLS2

PLS1: a first set of PLS data carried in the FSS symbols having a fixed size, coding and modulation, which carries basic information about the system as well as the parameters needed to decode the PLS2

NOTE: PLS1 data remains constant for the duration of a frame-group.

PLS2: a second set of PLS data transmitted in the FSS symbol, which carries more detailed PLS data about the system and the DPs PLS2 dynamic data: PLS2 data that may dynamically change frame-by-frame PLS2 static data: PLS2 data that remains static for the duration of a frame-group preamble signaling data: signaling data carried by the preamble symbol and used to identify the basic mode of the system preamble symbol: fixed-length pilot symbol that carries basic PLS data and is located in the beginning of a frame NOTE: The preamble symbol is mainly used for fast initial band scan to detect the system signal, its timing, frequency offset, and FFT-size.

reserved for future use: not defined by the present document but may be defined in future super-frame: set of eight frame repetition units time interleaving block (TI block): set of cells within which time interleaving is carried out, corresponding to one use of the time interleaver memory TI group: unit over which dynamic capacity allocation for a particular DP is carried out, made up of an integer, dynamically varying number of XFECBLOCKs.

NOTE: The TI group may be mapped directly to one frame or may be mapped to multiple frames. It may contain one or more TI blocks.

Type 1 DP: DP of a frame where all DPs are mapped into the frame in TDM fashion

Type 2 DP: DP of a frame where all DPs are mapped into the frame in FDM fashion

XFECBLOCK: set of N cells cells carrying all the bits of one LDPC FECBLOCK

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

Figure 2:
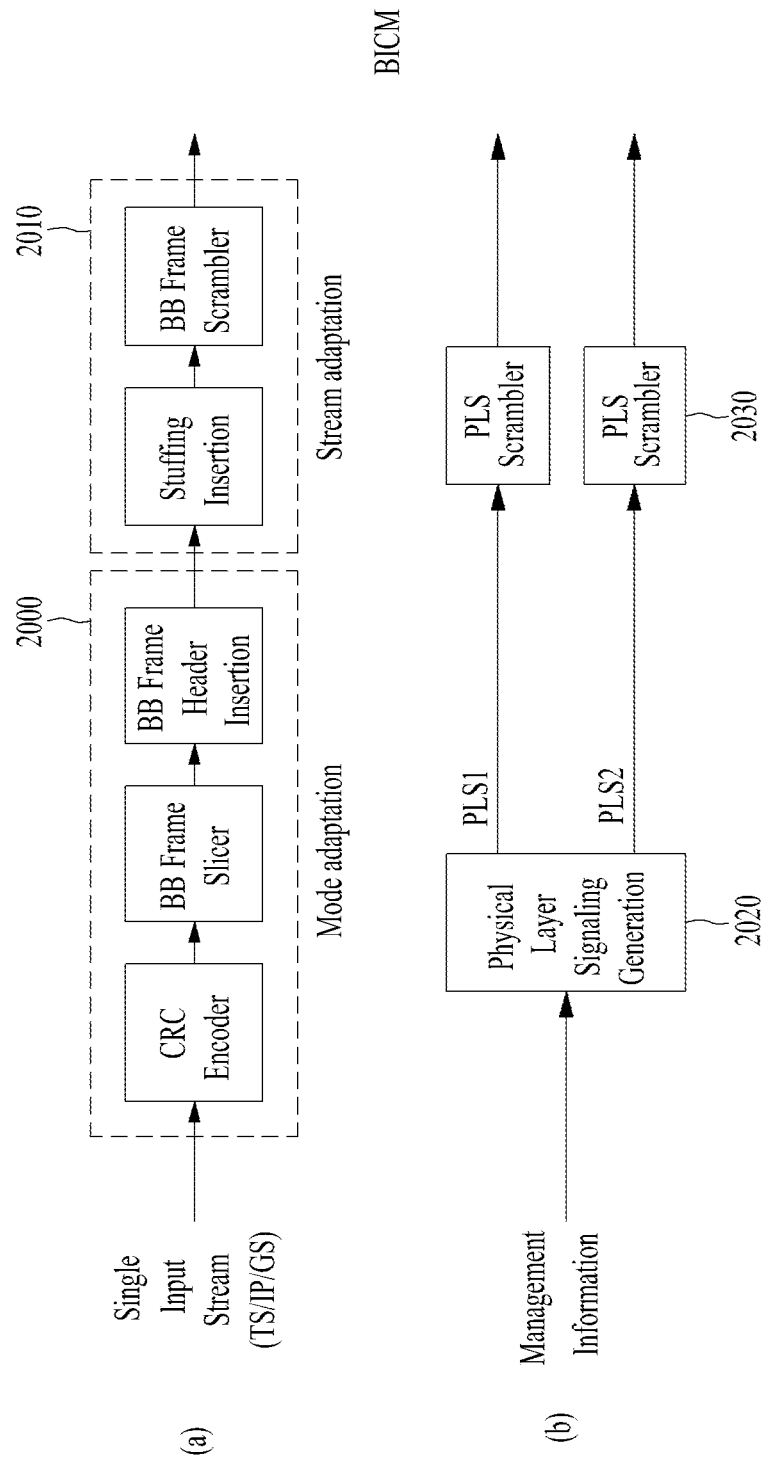
FIG. 2 illustrates an input formatting block according to one embodiment of the present invention.
Figure 3:
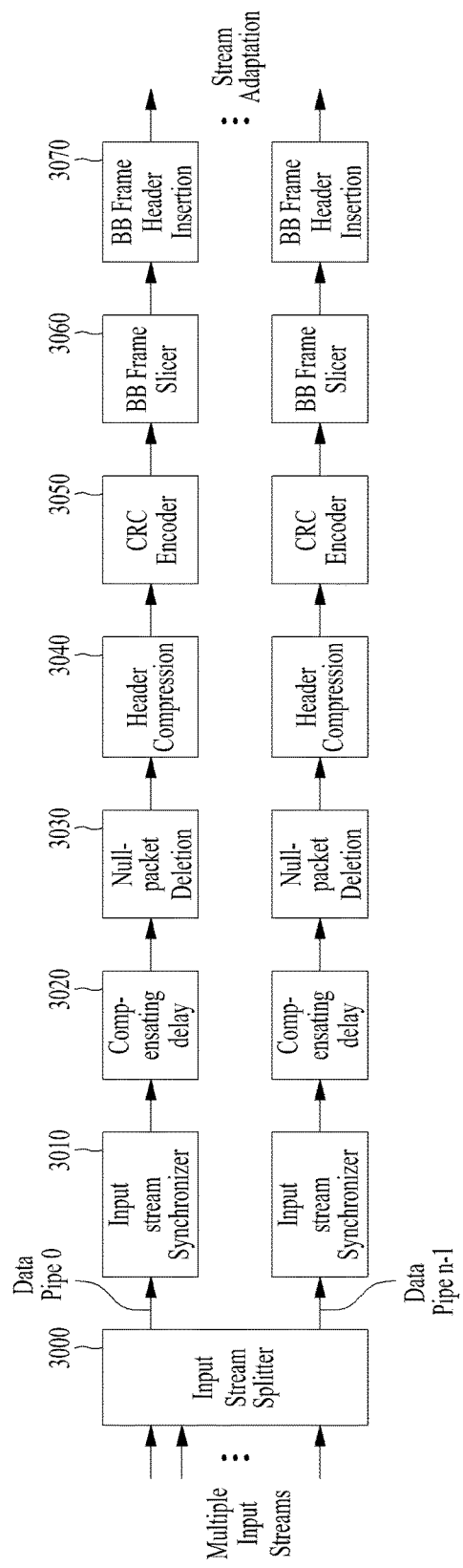
FIG. 3 illustrates an input formatting block according to another embodiment of the present invention.
Figure 4:
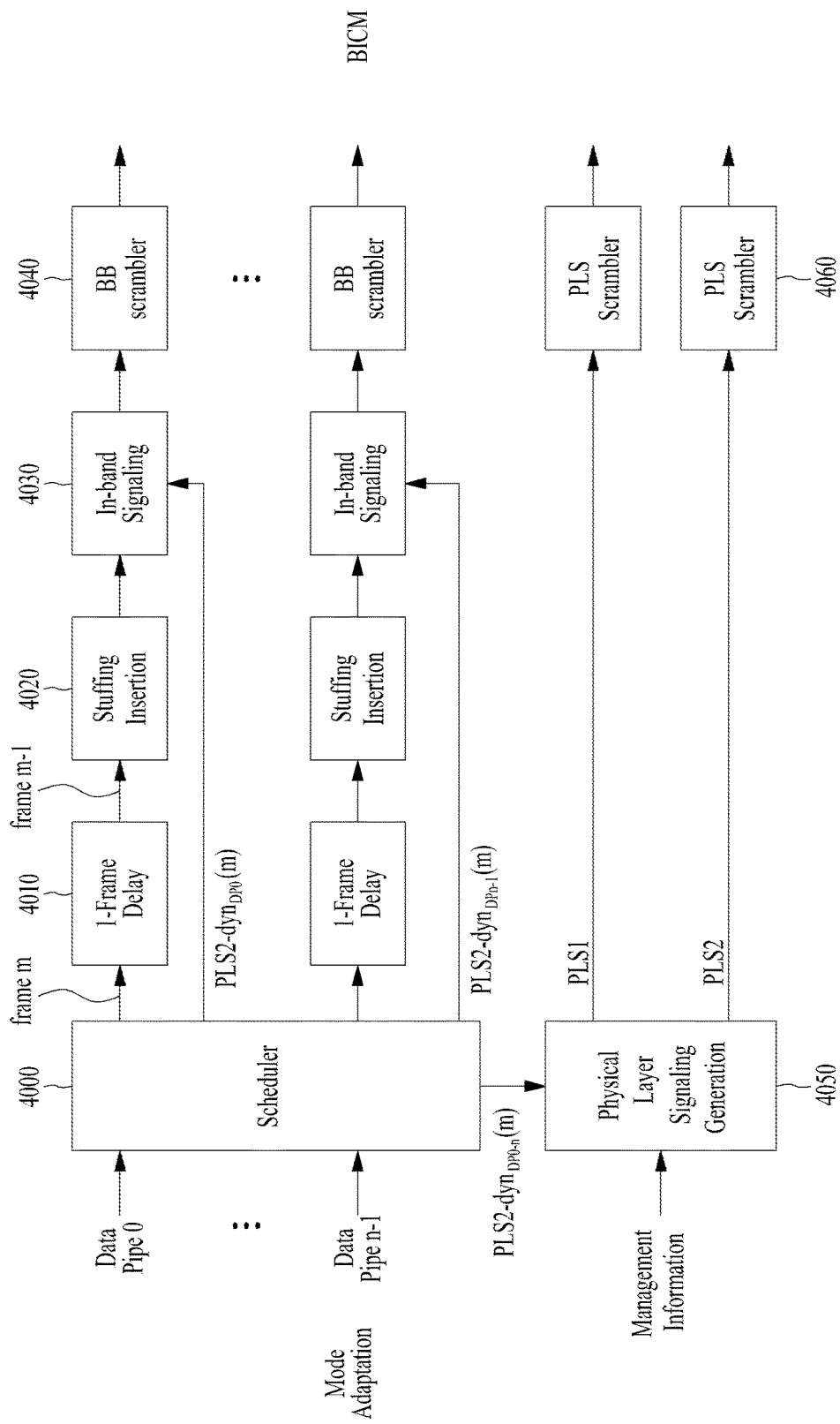
FIG. 4 illustrates an input formatting block according to another embodiment of the present invention.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feedback shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FECBLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

Figure 5:
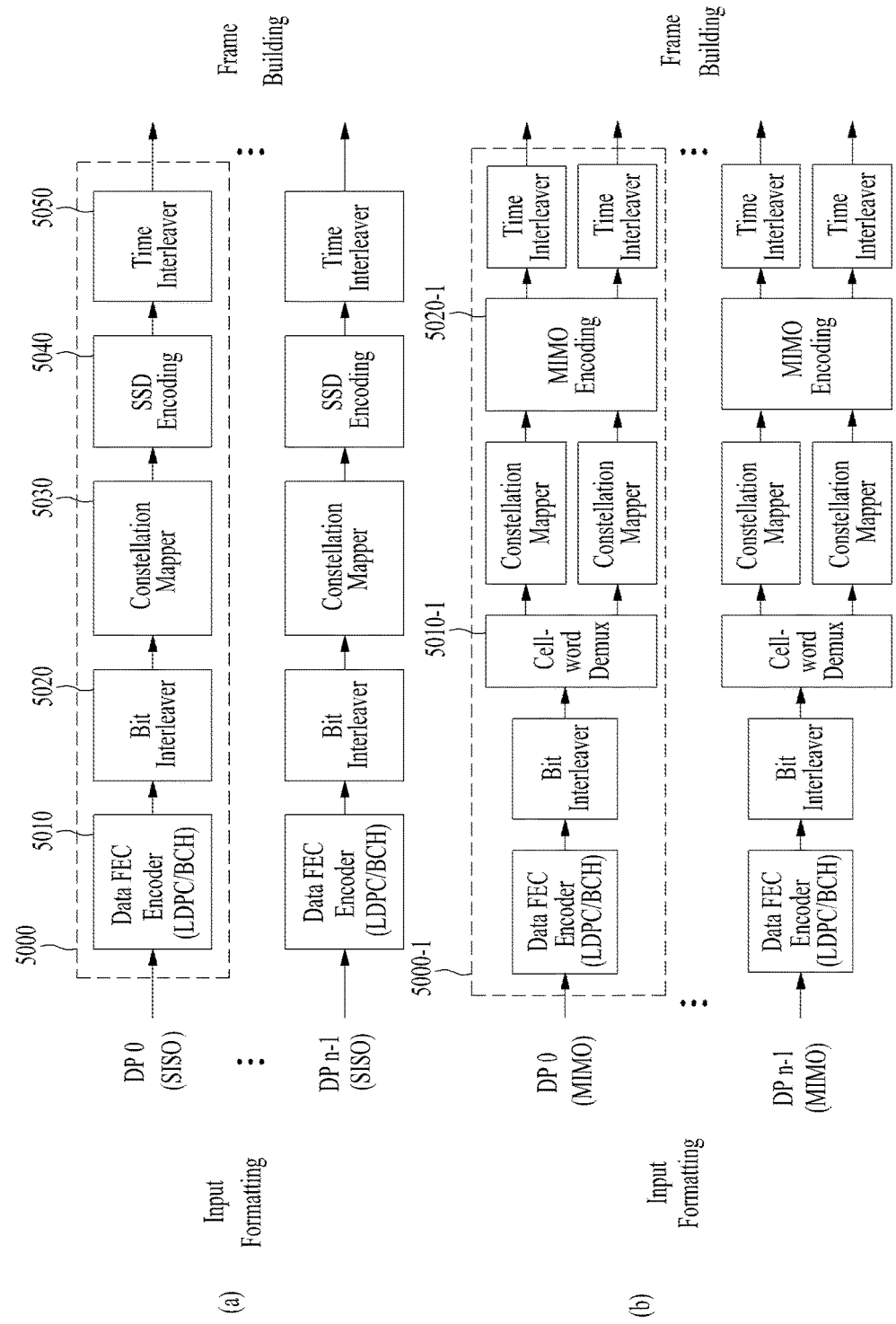
FIG. 5 illustrates a BICM block according to an embodiment of the present invention.

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, $e_l$. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ ($e_{1,i}$ and $e_{2,i}$) are fed to the input of the MIMO Encoder. Paired MIMO Encoder output (g1,i and g2,i) is transmitted by the same carrier k and OFDM symbol l of their respective TX antennas.

The above-described blocks may be omitted or replaced by blocks having similar or identical functions.

Figure 6:
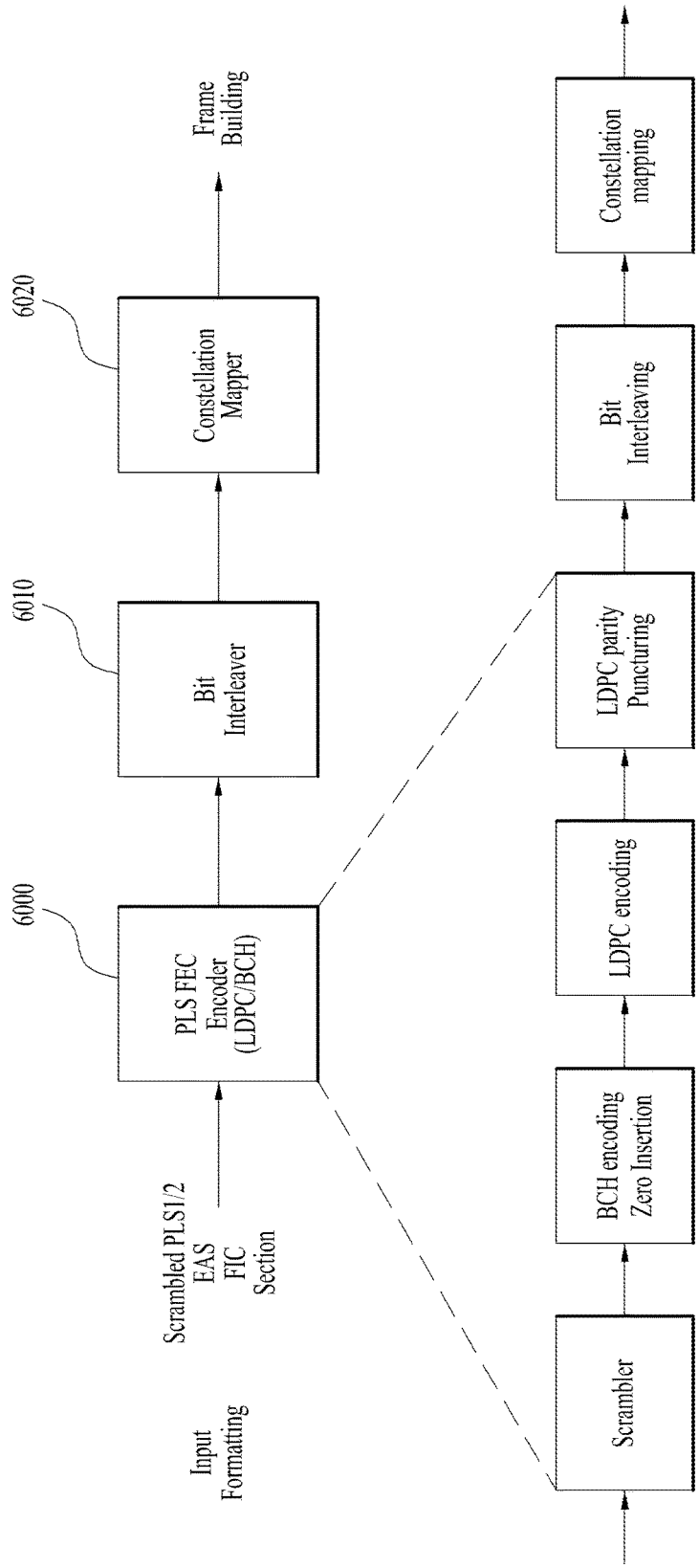
FIG. 6 illustrates a BICM block according to another embodiment of the present invention.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010, and a constellation mapper 6020.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS1/2 data, EAC and FIC section.

The scrambler can scramble PLS1 data and PLS2 data before BCH encoding and shortened and punctured LDPC encoding.

The BCH encoding/zero insertion block can perform outer encoding on the scrambled PLS1/2 data using the shortened BCH code for PLS protection and insert zero bits after the BCH encoding. For PLS1 data only, the output bits of the zero insertion may be permutted before LDPC encoding.

The LDPC encoding block can encode the output of the BCH encoding/zero insertion block using LDPC code. To generate a complete coded block, $C_{ldpc}$, parity bits, $P_{ldpc}$ are encoded systematically from each zero-inserted PLS information block, $I_{ldpc}$ and appended after it.

$$C_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}]$$ [Expression 1]

The LDPC code parameters for PLS1 and PLS2 are as following table 4.

TABLE 4

| Signaling Type | $K_{sig}$ | $K_{bch}$ | $N_{bch\_parity}$ | $K_{ldpc}$ (=$N_{bch}$) | $N_{ldpc}$ | $N_{ldpc\_parity}$ | code rate | $Q_{ldpc}$ |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC parity puncturing block can perform puncturing on the PLS1 data and PLS 2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit interleaved PLS1 data and PLS2 data onto constellations.

The above-described blocks may be omitted or replaced by blocks having similar or identical functions.

Figure 7:
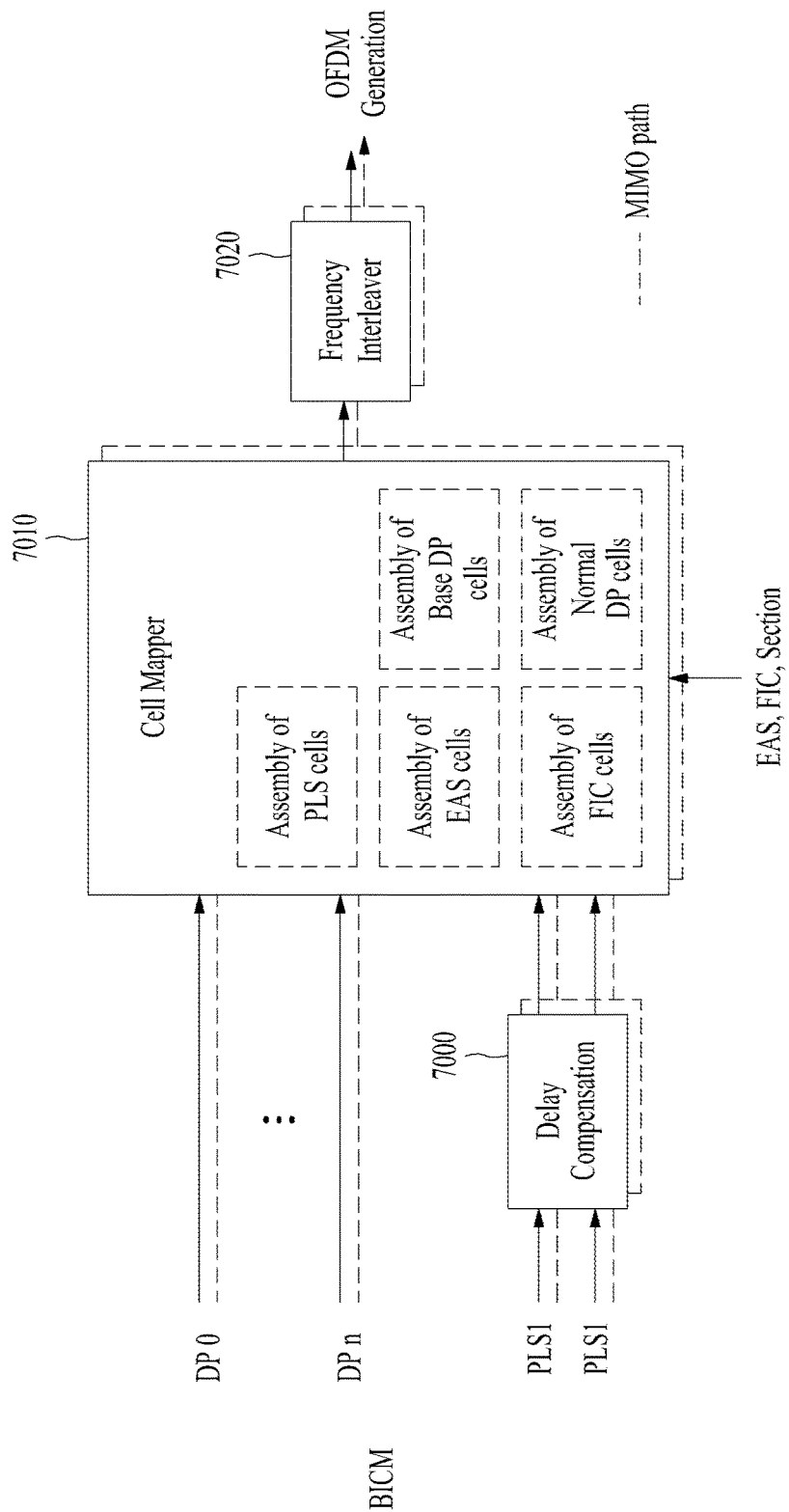
FIG. 7 illustrates a frame building block according to one embodiment of the present invention.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI (program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame.

The above-described blocks may be omitted or replaced by blocks having similar or identical functions.

Figure 8:
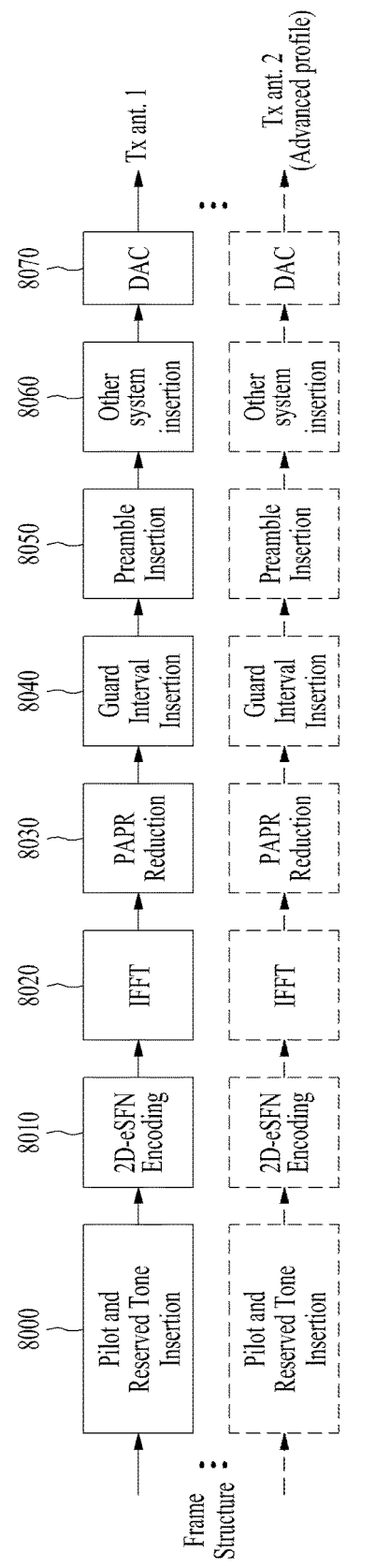
FIG. 8 illustrates an OFDM generation block according to an embodiment of the present invention.

FIG. 8 illustrates an OFDM generation block according to an embodiment of the present invention.

The OFDM generation block illustrated in FIG. 8 corresponds to an embodiment of the OFDM generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots, continual pilots, edge pilots, FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 7800 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

Figure 9:
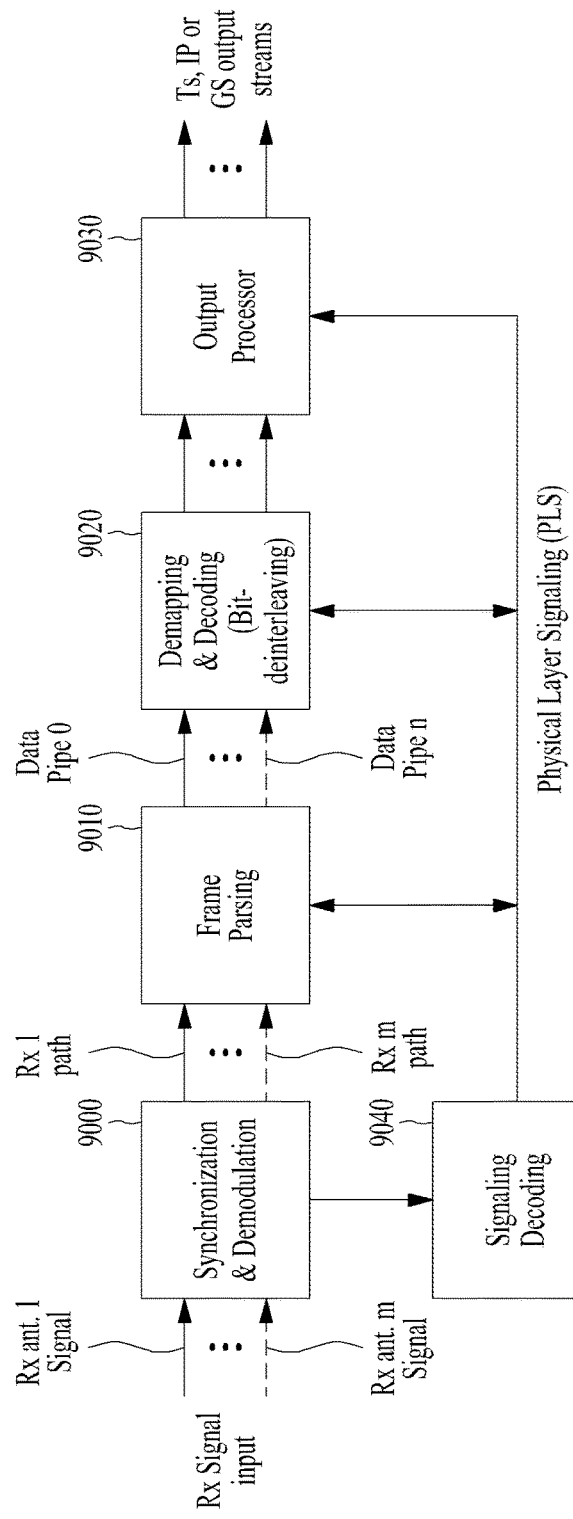
FIG. 9 illustrates a structure of an apparatus for receiving broadcast signals for future broadcast services according to an embodiment of the present invention.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9010 can parse input signal frames and extract data through which a service selected by a user is transmitted. If the apparatus for transmitting broadcast signals performs interleaving, the frame parsing module 9010 can carry out deinterleaving corresponding to a reverse procedure of interleaving. In this case, the positions of a signal and data that need to be extracted can be obtained by decoding data output from the signaling decoding module 9040 to restore scheduling information generated by the apparatus for transmitting broadcast signals.

The demapping & decoding module 9020 can convert the input signals into bit domain data and then deinterleave the same as necessary. The demapping & decoding module 9020 can perform demapping for mapping applied for transmission efficiency and correct an error generated on a transmission channel through decoding. In this case, the demapping & decoding module 9020 can obtain transmission parameters necessary for demapping and decoding by decoding the data output from the signaling decoding module 9040.

The output processor 9030 can perform reverse procedures of various compression/signal processing procedures which are applied by the apparatus for transmitting broadcast signals to improve transmission efficiency. In this case, the output processor 9030 can acquire necessary control information from data output from the signaling decoding module 9040. The output of the output processor 8300 corresponds to a signal input to the apparatus for transmitting broadcast signals and may be MPEG-TSs, IP streams (v4 or v6) and generic streams.

The signaling decoding module 9040 can obtain PLS information from the signal demodulated by the synchronization & demodulation module 9000. As described above, the frame parsing module 9010, demapping & decoding module 9020 and output processor 9030 can execute functions thereof using the data output from the signaling decoding module 9040.

Figure 10:
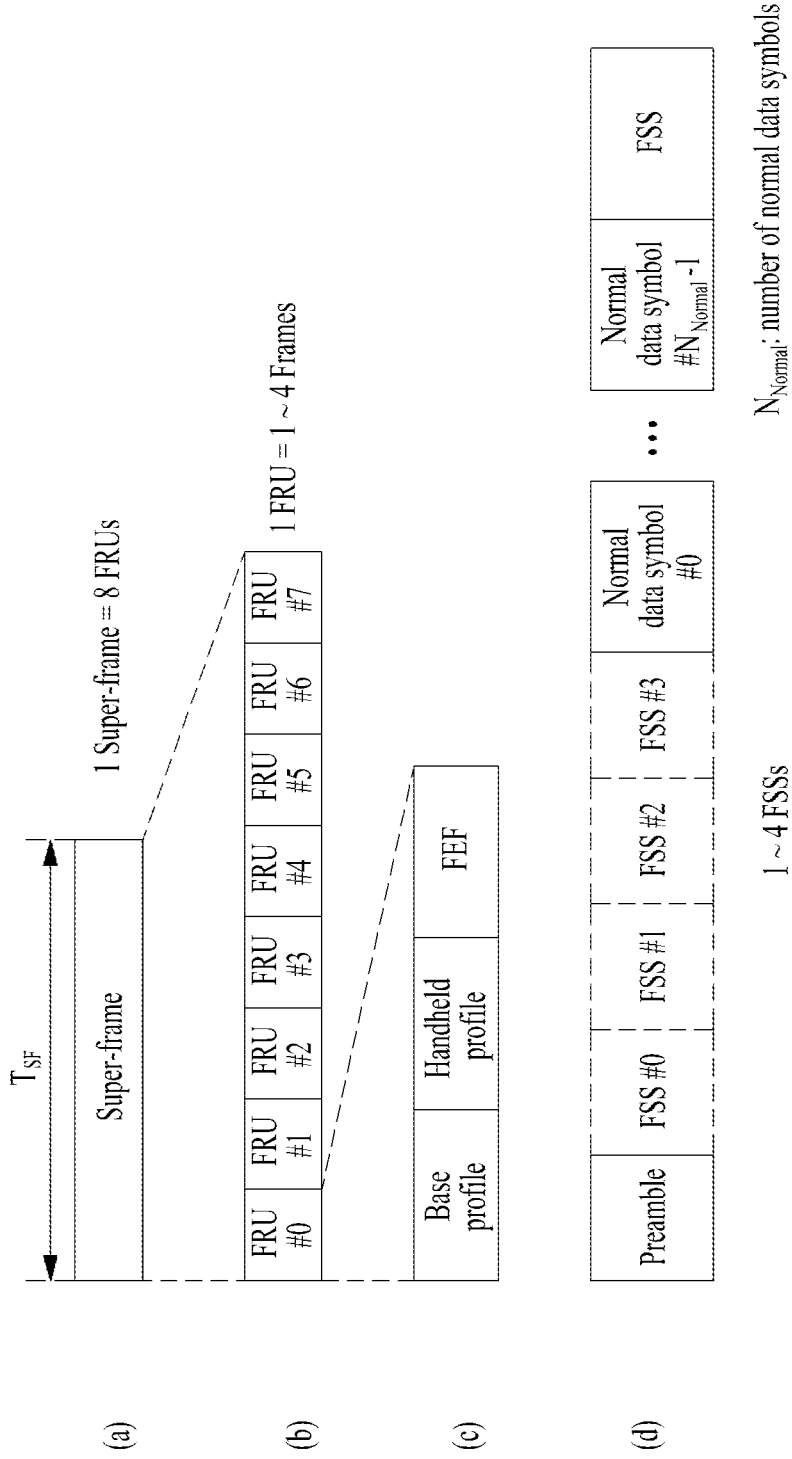
FIG. 10 illustrates a frame structure according to an embodiment of the present invention.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Futurecast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

Figures 11, 12:
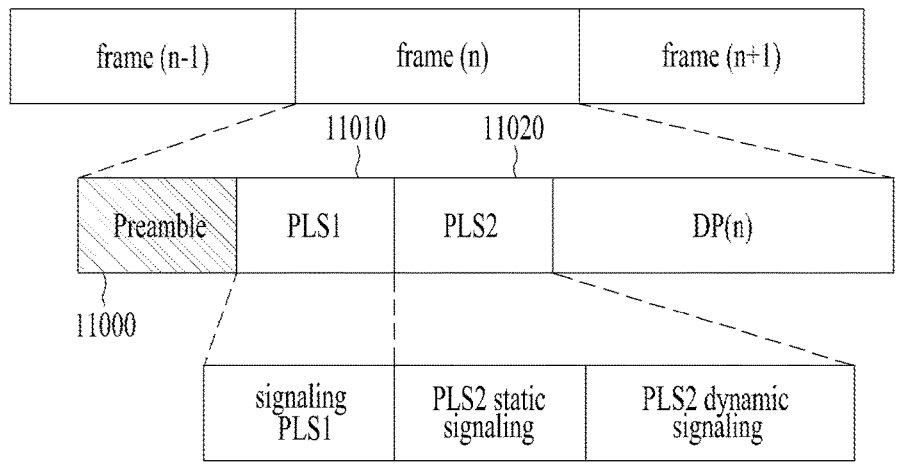
FIG. 11 illustrates a signaling hierarchy structure of the frame according to an embodiment of the present invention.
FIG. 12 illustrates preamble signaling data according to an embodiment of the present invention.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY profile |
| --- | --- |
| 000 | Base profile |
| 001 | Handheld profile |
| 010 | Advanced profiled |
| 011~110 | Reserved |
| 111 | FEF |

FFT_SIZE: This 2 bit field indicates the FFT size of the current frame within a frame-group, as described in below table 6.

TABLE 6

| Value | FFT size |
| --- | --- |
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
| --- | --- |
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams

TABLE 8

|  | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| value | Payload type |
|---|---|
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the $(i+1)^{th}$ (i is the loop index) frame of the associated FRU. This field uses the same signaling format as shown in the table 8.

FRU_FRAME_LENGTH: This 2-bit field indicates the length of the $(i+1)^{th}$ frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the $(i+1)^{th}$ frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Content | PLS2 FEC type |
|---|---|
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
|---|---|
| 000 | BPSK |
| 001 | QPSK |
| 010 | QAM-16 |
| 011 | NUQ-64 |
| 100~111 | Reserved |

PLS2_SIZE_CELL: This 15-bit field indicates $C_{total\_partial\_block}$, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates $C_{total\_partial\_block}$, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to the table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates $C_{total\_partial\_block}$, The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
|---|---|
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
| --- | --- |
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
| --- | --- |
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
| --- | --- |
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
| --- | --- |
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
| --- | --- |
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates $P_I$, the number of the frames to which each TI group is mapped, and there is one TI-block per TI group ($N_{TI}=1$). The allowed $P_I$ values with 2-bit field are defined in the below table 18.

If the DP_TI_TYPE is set to the value '0', this field indicates the number of TI-blocks $N_{TI}$ per TI group, and there is one TI group per frame ($P_I=1$). The allowed $P_I$ values with 2-bit field are defined in the below table 18.

TABLE 18

| 2-bit field | $P_I$ | $N_{TI}$ |
| --- | --- | --- |
| 00 | 1 | 1 |
| 01 | 2 | 2 |
| 10 | 4 | 3 |
| 11 | 8 | 4 |

DP_FRAME_INTERVAL: This 2-bit field indicates the frame interval ($I_{JUMP}$) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
| --- | --- |
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
| --- | --- |
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
| --- | --- | --- | --- |
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
| --- | --- |
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
| --- | --- |
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
| --- | --- |
| 00 | Not used |
| 01 | ISSY-UP |
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
| --- | --- |
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates the IP header compression mode when DP_PAYLOAD_TYPE is set to IP ('01'). The HC_MODE_IP is signaled according to the below table 26.

TABLE 26

| Value | Header compression mode |
| --- | --- |
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

Figures 15, 16:
FIG. 15 illustrates PLS2 data according to another embodiment of the present invention.
FIG. 16 illustrates a logical structure of a frame according to an embodiment of the present invention.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:

FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| PHY profile | DP_START field size | |
|---|---|---|
| | 64K | 16K |
| Base | 13 bit | 15 bit |
| Handheld | — | 13 bit |
| Advanced | 13 bit | 15 bit |

DP_NUM_BLOCK: This 10-bit field indicates the number of FEC blocks in the current TI group for the current DP. The value of DP_NUM_BLOCK ranges from 0 to 1023

RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention.

As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

Figure 17:
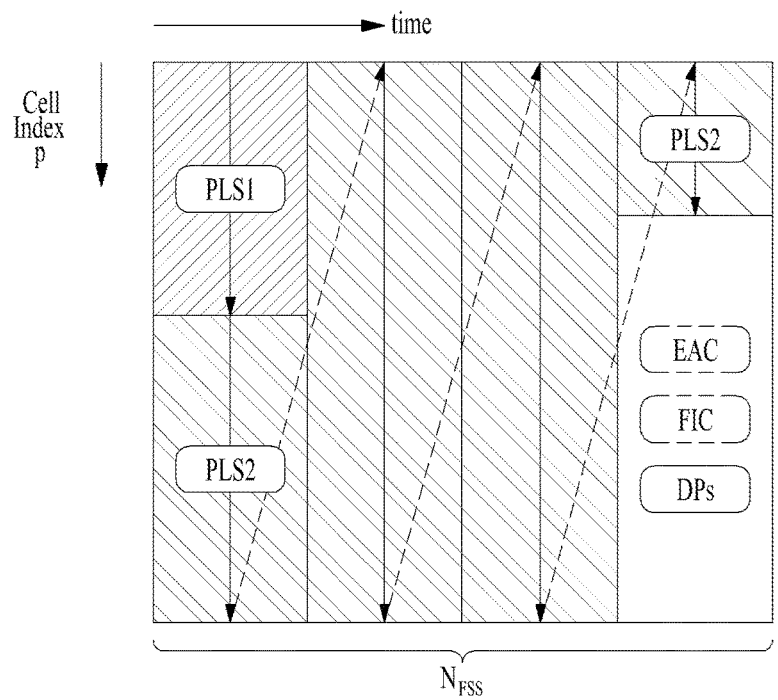
FIG. 17 illustrates PLS mapping according to an embodiment of the present invention.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) $N_{FSS}$ is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the $N_{FSS}$ FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

Figure 18:
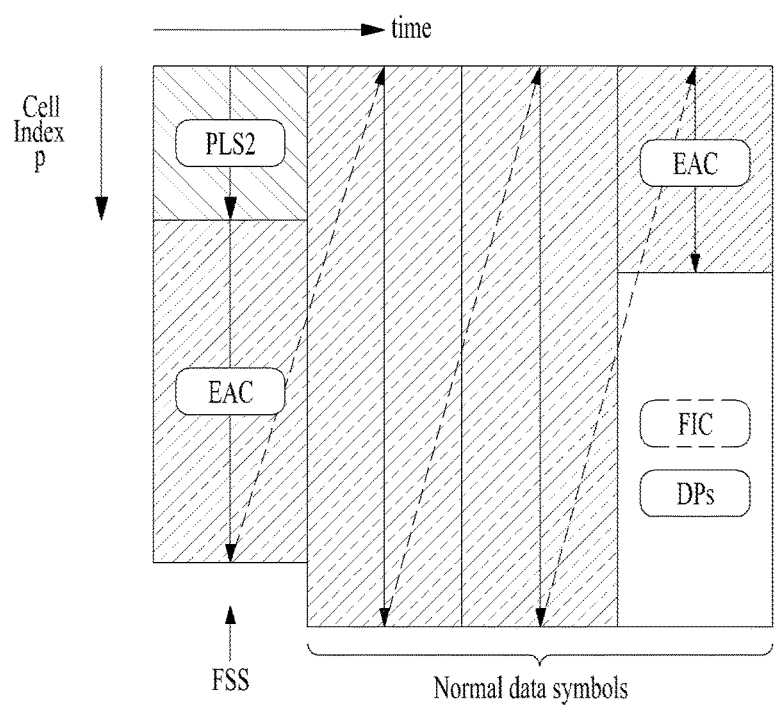
FIG. 18 illustrates EAC mapping according to an embodiment of the present invention.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

Figure 19:
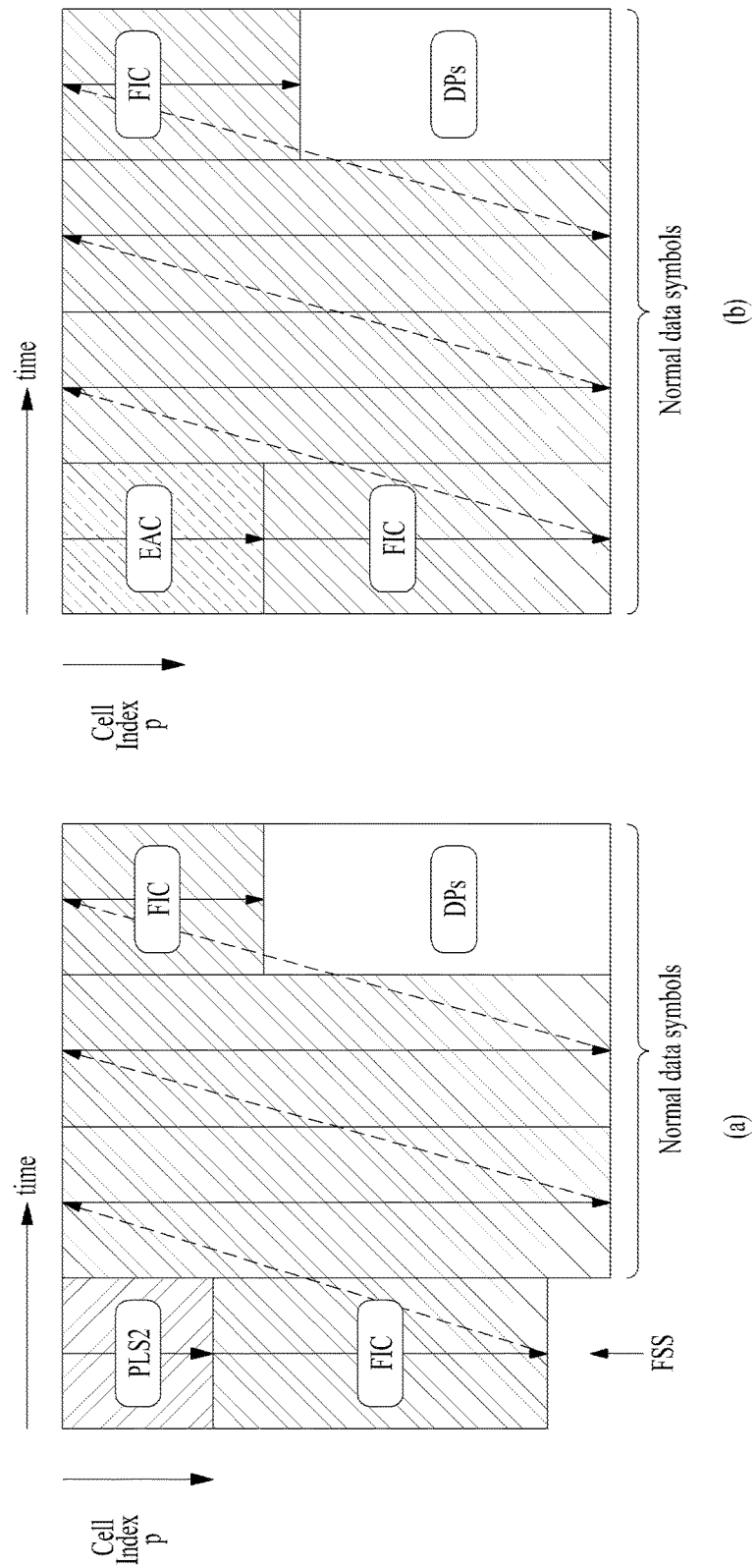
FIG. 19 illustrates FIC mapping according to an embodiment of the present invention.

FIG. 19 illustrates FIC mapping according to an embodiment of the present invention.

(a) shows an example mapping of FIC cell without EAC and (b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

Figure 20:
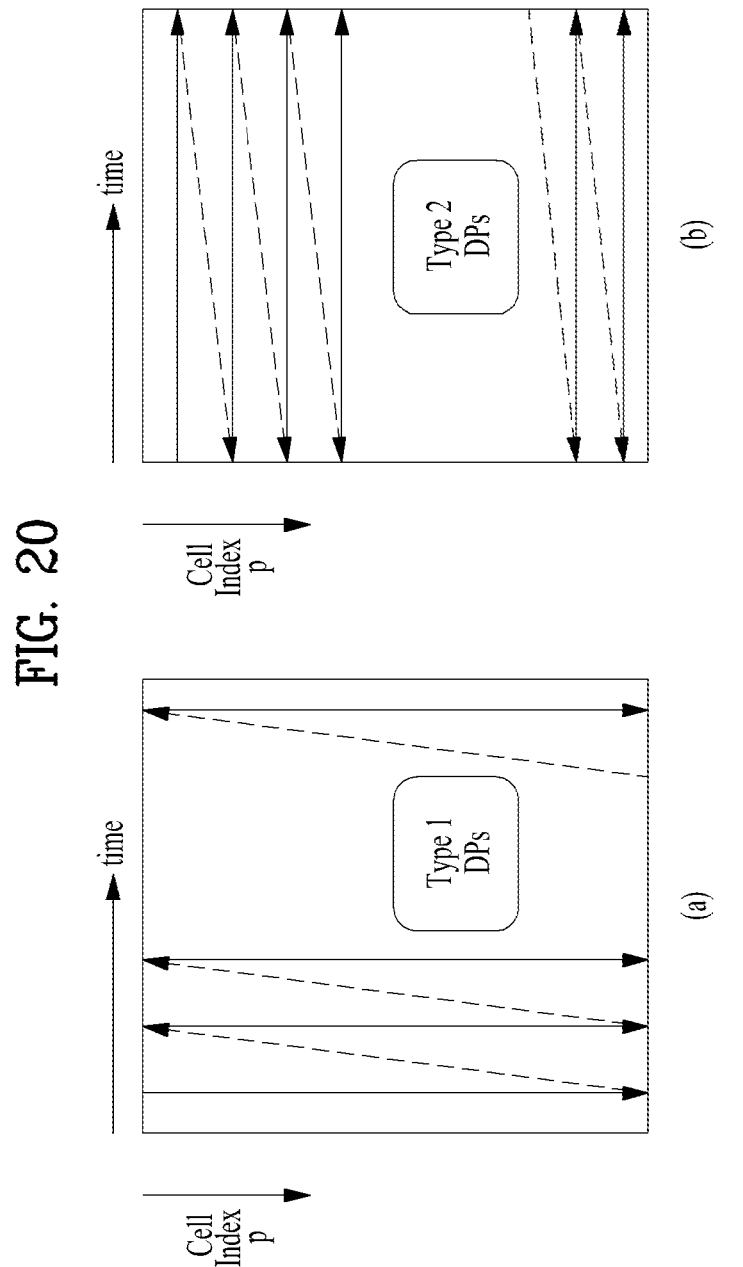
FIG. 20 illustrates a type of DP according to an embodiment of the present invention.

FIG. 20 illustrates a type of DP according to an embodiment of the present invention.

(a) shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM
Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{DP} \quad \text{[Expression 2]}$$

where $D_{DP1}$ is the number of OFDM cells occupied by Type 1 DPs, $D_{DP2}$ is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

Figure 21:
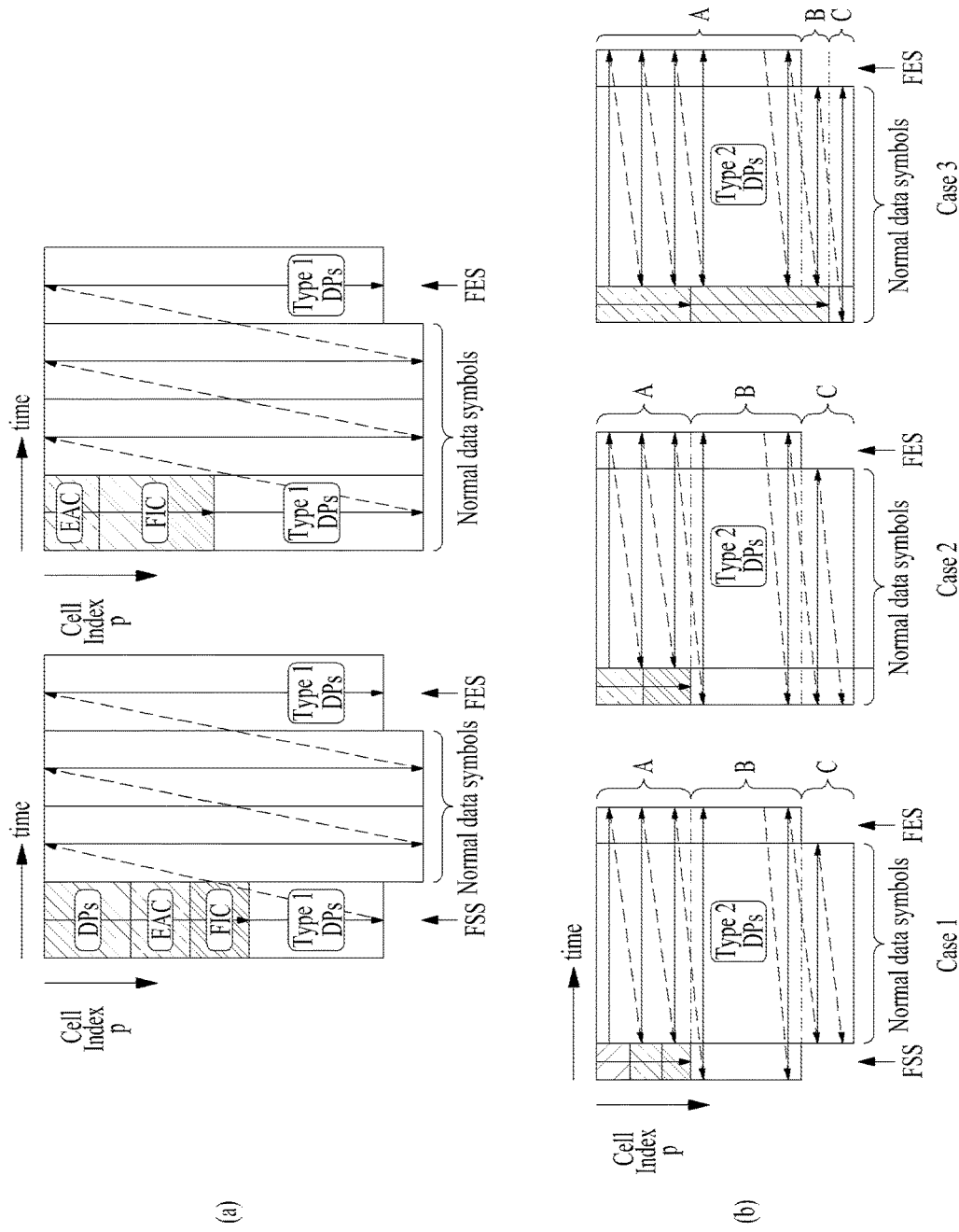
FIG. 21 illustrates DP mapping according to an embodiment of the present invention.

FIG. 21 illustrates DP mapping according to an embodiment of the present invention.

(a) shows an addressing of OFDM cells for mapping type 1 DPs and (b) shows an an addressing of OFDM cells for mapping for type 2 DPs.

Addressing of OFDM cells for mapping Type 1 DPs $(0, \ldots, D_{DP1}-1)$ is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs $(0, \ldots, D_{DP2}-1)$ is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than $C_{FSS}$. The third case, shown on the right side in (b), is the same as the second case except that the number of FIC cells mapped on that symbol exceeds $C_{FSS}$.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A Cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, $N_{cells}$, is dependent on the FECBLOCK size, $N_{ldpc}$, and the number of transmitted bits per constellation symbol. A DPU is defined as the greatest common divisor of all possible values of the number of cells in a XFECBLOCK, $N_{cells}$, supported in a given PHY profile. The length of a DPU in cells is defined as $L_{DPU}$. Since each PHY profile supports different combinations of FECBLOCK size and a different number of bits per constellation symbol, $L_{DPU}$ is defined on a PHY profile basis.

Figure 22:
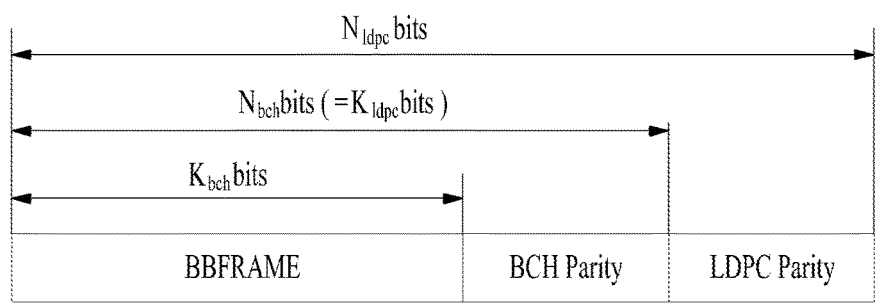
FIG. 22 illustrates an FEC structure according to an embodiment of the present invention.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF ($K_{bch}$ bits), and then LDPC encoding is applied to BCH-encoded BBF ($K_{ldpc}$ bits=$N_{bch}$ bits) as illustrated in FIG. 22.

The value of $N_{ldpc}$ is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | $N_{ldpc}$ | $K_{ldpc}$ | $K_{bch}$ | BCH error correction capability | $N_{bch}$-$K_{bch}$ |
|---|---|---|---|---|---|
| 5/15 | 64800 | 21600 | 21408 | 12 | 192 |
| 6/15 | | 25920 | 25728 | | |
| 7/15 | | 30240 | 30048 | | |
| 8/15 | | 34560 | 34368 | | |
| 9/15 | | 38880 | 38688 | | |
| 10/15 | | 43200 | 43008 | | |
| 11/15 | | 47520 | 47328 | | |
| 12/15 | | 51840 | 51648 | | |
| 13/15 | | 56160 | 55968 | | |

TABLE 29

| LDPC Rate | $N_{ldpc}$ | $K_{ldpc}$ | $K_{bch}$ | BCH error correction capability | $N_{bch}$-$K_{bch}$ |
|---|---|---|---|---|---|
| 5/15 | 16200 | 5400 | 5232 | 12 | 168 |
| 6/15 | | 6480 | 6312 | | |
| 7/15 | | 7560 | 7392 | | |
| 8/15 | | 8640 | 8472 | | |
| 9/15 | | 9720 | 9552 | | |
| 10/15 | | 10800 | 10632 | | |
| 11/15 | | 11880 | 11712 | | |
| 12/15 | | 12960 | 12792 | | |
| 13/15 | | 14040 | 13872 | | |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed $B_{ldpc}$ (FECBLOCK), $P_{ldpc}$ (parity bits) is encoded systematically from each $I_{ldpc}$ (BCH-encoded BBF), and appended to $I_{ldpc}$. The completed $B_{ldpc}$ (FECBLOCK) are expressed as follow Expression.

$$B_{ldpc}=[I_{ldpc}P_{ldpc}]=[i_0, i_1, \ldots, i_{K_{ldpc}-1}, p_0, p_1, \ldots, p_{N_{ldpc}-K_{ldpc}-1}] \quad \text{[Expression 3]}$$

The parameters for long FECBLOCK and short FECBLOCK are given in the above table 28 and 29, respectively.

The detailed procedure to calculate $N_{ldpc}$-$K_{ldpc}$ parity bits for long FECBLOCK, is as follows:

1) Initialize the parity bits, $$p_0=p_1=p_2=\ldots=p_{N_{ldpc}-K_{ldpc}-1}=0 \quad \text{[Expression 4]}$$

2) Accumulate the first information bit—$i_0$, at parity bit addresses specified in the first row of an addresses of parity check matrix. The details of addresses of parity check matrix will be described later. For example, for rate 13/15:

$$p_{983}=p_{983}\oplus i_0 \quad p_{2815}=p_{2815}\oplus i_0$$

$$p_{4837}=p_{4837}\oplus i_0 \quad p_{4989}=p_{4989}\oplus i_0$$

$$p_{6138}=p_{6138}\oplus i_0 \quad p_{6458}=p_{6458}\oplus i_0$$

$$p_{6921}=p_{6921}\oplus i_0 \quad p_{6974}=p_{6974}\oplus i_0$$

$$p_{7572}=p_{7572}\oplus i_0 \quad p_{8260}=p_{8260}\oplus i_0$$

$$p_{8496}=p_{8496}\oplus i_0 \quad \text{[Expression 5]}$$

3) For the next 359 information bits, $i_s$, s=1, 2, ..., 359 accumulate $i_s$ at parity bit addresses using following Expression.

$$\{x+(s \bmod 360) \times Q_{ldpc}\} \bmod(N_{ldpc}-K_{ldpc}) \quad \text{[Expression 6]}$$

where x denotes the address of the parity bit accumulator corresponding to the first bit $i_0$, and $Q_{ldpc}$ is a code rate dependent constant specified in the addresses of parity check matrix. Continuing with the example, $Q_{ldpc}$=24 for rate 13/15, so for information bit $i_1$, the following operations are performed:

$$p_{1007}=p_{1007}\oplus i_1 \quad p_{2839}=p_{2839}\oplus i_1$$

$$p_{4861}=p_{4861}\oplus i_1 \quad p_{5013}=p_{5013}\oplus i_1$$

$$p_{6162}=p_{6162}\oplus i_1 \quad p_{6482}=p_{6482}\oplus i_1$$

$$p_{6945}=p_{6945}\oplus i_1 \quad p_{6998}=p_{6998}\oplus i_1$$

$$p_{7596}=p_{7596}\oplus i_1 \quad p_{8284}=p_{8284}\oplus i_1$$

$$p_{8520}=p_{8520}\oplus i_1 \quad \text{[Expression 7]}$$

4) For the 361$^{st}$ information bit $i_{360}$, the addresses of the parity bit accumulators are given in the second row of the addresses of parity check matrix. In a similar manner the addresses of the parity bit accumulators for the following 359 information bits $i_s$, s=361, 362, ..., 719 are obtained using the Expression 6, where x denotes the address of the parity bit accumulator corresponding to the information bit $i_{360}$, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$p_i=p_i\oplus p_{i-1}, i=1,2,\ldots N_{ldpc}-K_{ldpc}-1 \quad \text{[Expression 8]}$$

where final content of $p_i$, i=0, 1, ... $N_{ldpc}$-$K_{ldpc}$-1 is equal to the parity bit $p_i$.

TABLE 30

| Code Rate | $Q_{ldpc}$ |
| --- | --- |
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | $Q_{ldpc}$ |
| --- | --- |
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

Figure 23:
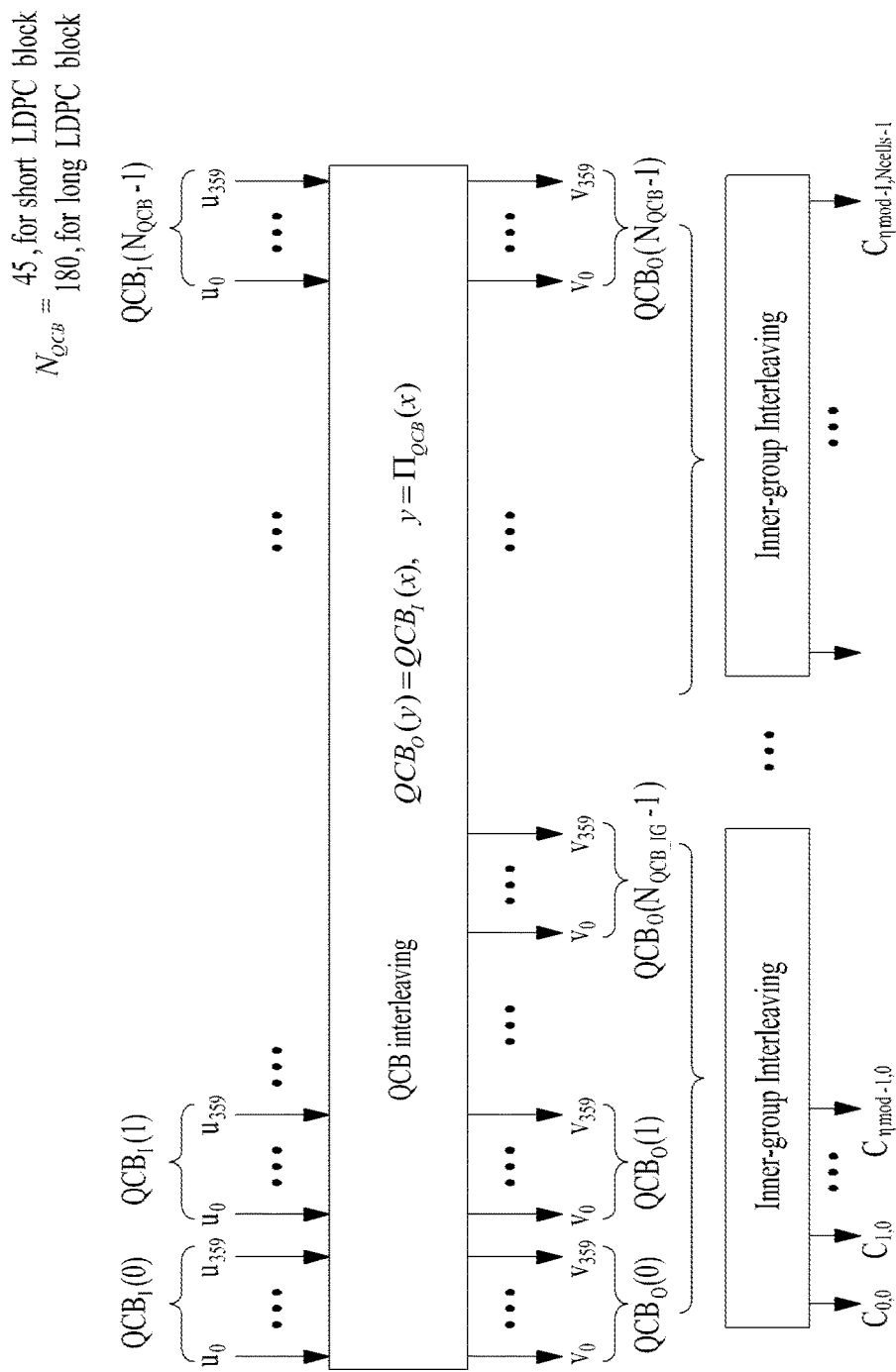
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

(a) shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where $N_{cells}=64800/\eta_{mod}$ or $16200/\eta_{mod}$ according to the FECBLOCK length. The QCB interleaving pattern is unique to each combination of modulation type and LDPC code rate.

After QCB interleaving, inner-group interleaving is performed according to modulation type and order ($\eta_{mod}$) which is defined in the below table 32. The number of QC blocks for one inner-group, $N_{QCB\_IG}$, is also defined.

TABLE 32

| Modulation type | $\eta_{mod}$ | $N_{QCB\_IG}$ |
| --- | --- | --- |
| QAM-16 | 4 | 2 |
| NUC-16 | 4 | 4 |
| NUQ-64 | 6 | 3 |
| NUC-64 | 6 | 6 |
| NUQ-256 | 8 | 4 |
| NUC-256 | 8 | 8 |

TABLE 32-continued

| Modulation type | $\eta_{mod}$ | $N_{QCB\_IG}$ |
| --- | --- | --- |
| NUQ-1024 | 10 | 5 |
| NUC-1024 | 10 | 10 |

The inner-group interleaving process is performed with $N_{QCB\_IG}$ QC blocks of the QCB interleaving output. Inner-group interleaving has a process of writing and reading the bits of the inner-group using 360 columns and $N_{QCB\_IG}$ rows. In the write operation, the bits from the QCB interleaving output are written row-wise. The read operation is performed column-wise to read out m bits from each row, where m is equal to 1 for NUC and 2 for NUQ.

Figure 24:
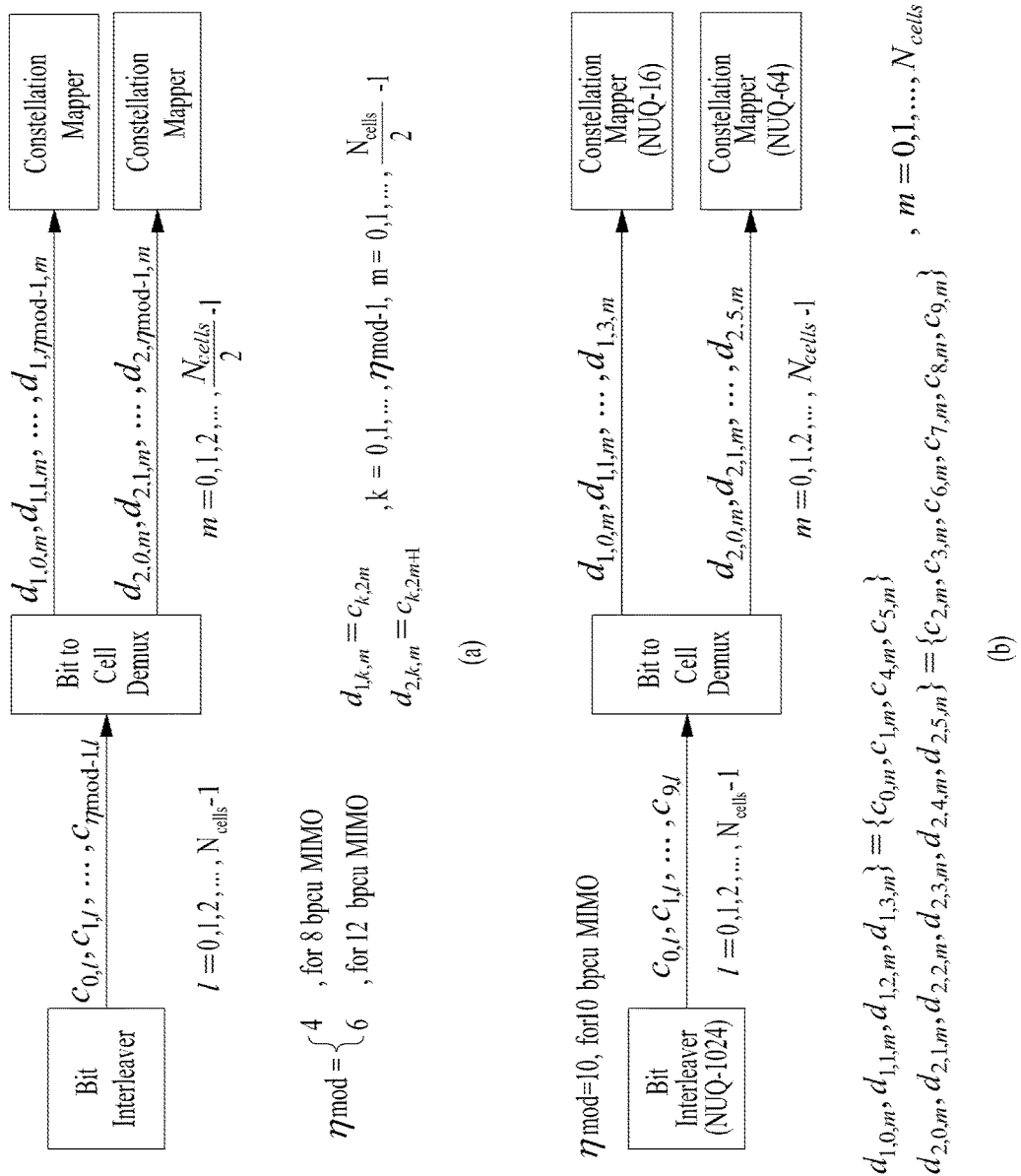
FIG. 24 illustrates a cell-word demultiplexing according to an embodiment of the present invention.

FIG. 24 illustrates a cell-word demultiplexing according to an embodiment of the present invention.

(a) shows a cell-word demultiplexing for 8 and 12 bpcu MIMO and (b) shows a cell-word demultiplexing for 10 bpcu MIMO.

Each cell word $(c_{0,l}, c_{1,l}, \ldots, c_{\eta_{mod}-1,l})$ of the bit interleaving output is demultiplexed into $(d_{1,0,m}, d_{1,1,m} \ldots, d_{1,\eta_{mod}-1,m})$ and $(d_{2,0,m}, d_{2,1,m} \ldots, d_{2,\eta_{mod}-1,m})$ as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word $(c_{0,l}, c_{1,l}, \ldots, c_{9,l})$ of the Bit Interleaver output is demultiplexed into $(d_{1,0,m}, d_{1,1,m} \ldots, d_{1,3,m})$ and $(d_{2,0,m}, d_{2,1,m} \ldots, d_{2,5,m})$, as shown in (b).

FIG. 25 illustrates a time interleaving according to an embodiment of the present invention.

(a) to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks $N_{TI}$ per TI group. For DP_TI_TYPE='1', this parameter is the number of frames $P_I$ spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames $I_{JUMP}$ between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFECBLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by $N_{xBLOCK\_Group}(n)$ and is signaled as DP_NUM_BLOCK in the PLS2-DYN data. Note that $N_{xBLOCK\_Group}(n)$ may vary from the minimum value of 0 to the maximum value $N_{xBLOCK\_Group\_MAX}$ (corresponding to DP_NUM_BLOCK_MAX) of which the largest value is 1023.

Each TI group is either mapped directly onto one frame or spread over $P_I$ frames. Each TI group is also divided into more than one TI blocks($N_{TI}$), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Modes | Descriptions |
|---|---|
| Option-1 | Each TI group contains one TI block and is mapped directly to one frame as shown in (a). This option is signaled in the PLS2-STAT by DP_TI_TYPE = '0' and DP_TI_LENGTH = '1' ($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{JUMP}$ = 2). This provides greater time diversity for low data-rate services. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = $N_{TI}$, while $P_I$ = 1. |

In each DP, the TI memory stores the input XFECBLOCKs (output XFECBLOCKs from the SSD/MIMO encoding block). Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1}, \ldots,$$
$$d_{n,s,N_{xBLOCK\_TI}(n,s)-1,0}, \ldots, d_{n,s,N_{xBLOCK\_TI}(n,s)-1,N_{cells}-1}),$$

where $d_{n,s,r,q}$ is the qth cell of the rth XFECBLOCK in the sth TI block of the nth TI group and represents the outputs of SSD and MIMO encodings as follows.

$$d_{n,s,r,q} = \begin{cases} f_{n,s,r,q}, & \text{the output of } SSD \text{ encoding} \\ g_{n,s,r,q}, & \text{the output of } MIMO \text{ encoding} \end{cases}$$

In addition, assume that output XFECBLOCKs from the time interleaver are defined as $$(h_{n,s,0}, h_{n,s,1}, \ldots, h_{n,s,i}, \ldots, h_{n,s,N_{xBLOCK\_TI}(n,s)\times N_{cells}-1}),$$

where $h_{n,s,i}$ is the ith output cell (for i=0, ..., $N_{xBLOCK\_TI}$ (n,s)×$N_{cells}$−1) in the sth TI block of the nth TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the sth TI block of the nth TI group, the number of rows $N_r$ of a TI memory is equal to the number of cells $N_{cells}$, i.e., $N_r = N_{cells}$ while the number of columns $N_c$ is equal to the number $N_{xBLOCK\_TI}(n,s)$.

FIG. 26 illustrates the basic operation of a twisted row-column block interleaver according to an embodiment of the present invention.

shows a writing operation in the time interleaver and (b) shows a reading operation in the time interleaver The first XFECBLOCK is written column-wise into the first column of the TI memory, and the second XFECBLOCK is written into the next column, and so on as shown in (a). Then, in the interleaving array, cells are read out diagonal-wise. During diagonal-wise reading from the first row (rightwards along the row beginning with the left-most column) to the last row, $N_r$ cells are read out as shown in (b). In detail, assuming $z_{n,s,i}$ (i=0, ..., $N_r N_c$) as the TI memory cell position to be read sequentially, the reading process in such an interleaving array is performed by calculating the row index $R_{n,s,i}$, the column index $C_{n,s,i}$, and the associated twisting parameter $T_{n,s,i}$ as follows expression.

$$\text{GENERATE}(R_{n,s,i}, C_{n,s,i}) = \quad \text{[Expression 9]}$$
$$\{$$
$$R_{n,s,i} = \text{mod}(i, N_r),$$
$$T_{n,s,i} = \text{mod}(S_{shift} \times R_{n,s,i}, N_c),$$
$$C_{n,s,i} = \text{mod}\left(T_{n,s,i} + \left\lfloor \frac{i}{N_r} \right\rfloor, N_c\right)$$
$$\}$$

where $S_{shift}$ is a common shift value for the diagonal-wise reading process regardless of $N_{xBLOCK\_TI}(n,s)$, and it is determined by $N_{xBLOCK\_TI\_MAX}$ given in the PLS2-STAT as follows expression.

$$\text{for} \begin{cases} N'_{xBLOCK\_TI\_MAX} = N_{xBLOCK\_TI\_MAX} + 1, & \text{if } N_{xBLOCK\_TI\_MAX} \text{mod} 2 = 0 \\ N'_{xBLOCK\_TI\_MAX} = N_{xBLOCK\_TI\_MAX}, & \text{if } N_{xBLOCK\_TI\_MAX} \text{mod} 2 = 1 \end{cases}, \quad \text{[Expression 10]}$$

-continued $$S_{shift} = \frac{N'_{xBLOCK\_TI\_MAX} - 1}{2}$$

As a result, the cell positions to be read are calculated by a coordinate as $z_{n,s,i} = N_r C_{n,s,i} + R_{n,s,i}$.

Figure 27:
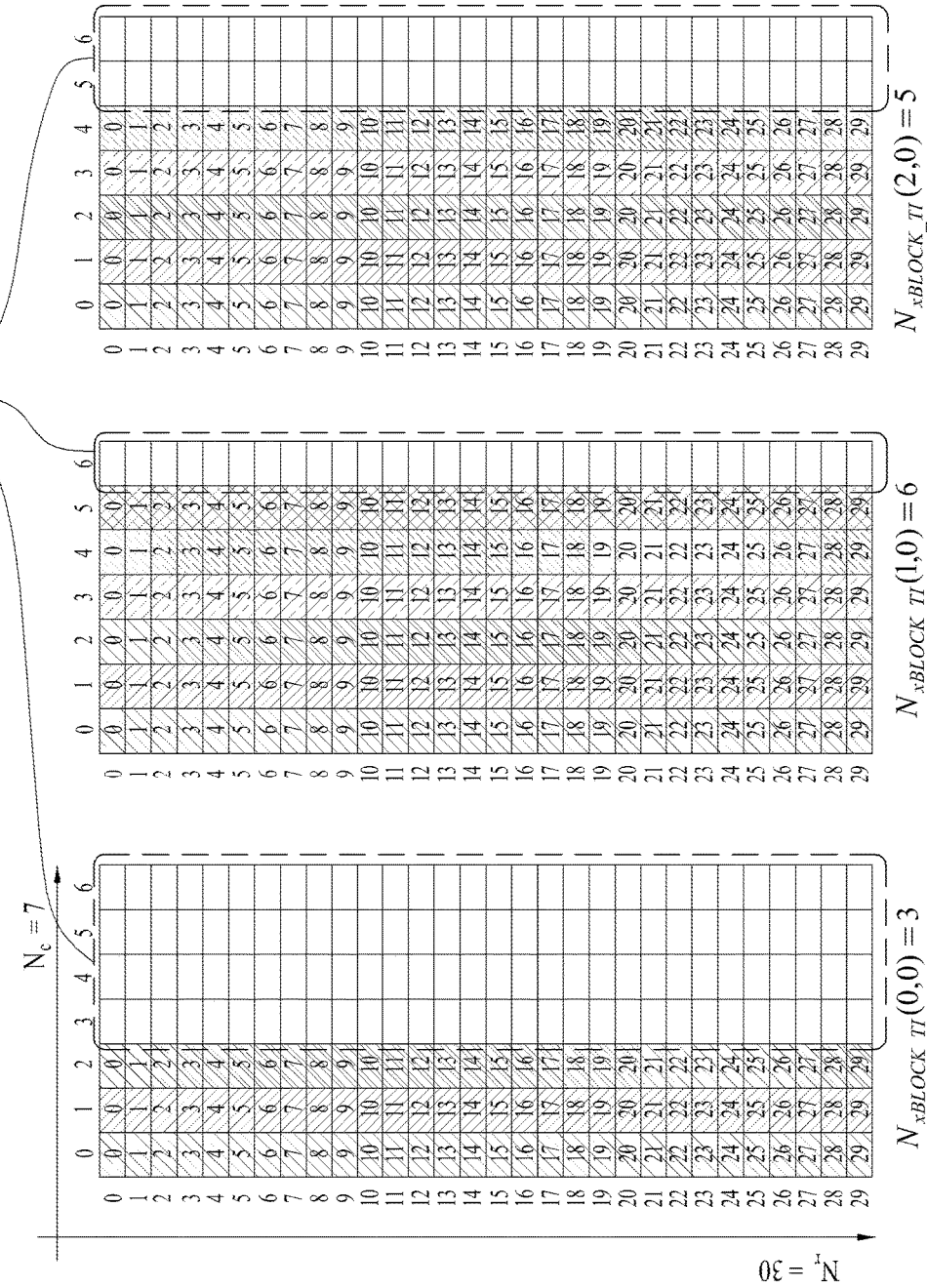
FIG. 27 illustrates an operation of a twisted row-column block interleaver according to another embodiment of the present invention.

FIG. 27 illustrates an operation of a twisted row-column block interleaver according to another embodiment of the present invention.

More specifically, FIG. 27 illustrates the interleaving array in the TI memory for each TI group, including virtual XFECBLOCKs when $N_{xBLOCK\_TI}(0,0)=3$, $N_{xBLOCK\_TI}(1,0)=6$, $N_{xBLOCK\_TI}(2,0)=5$.

The variable number $N_{xBLOCK\_TI}(n,s) = N_r$ will be less than or equal to $N'_{xBLOCK\_TI\_MAX}$. Thus, in order to achieve a single-memory deinterleaving at the receiver side, regardless of $N_{xBLOCK\_TI}(n,s)$, the interleaving array for use in a twisted row column block interleaver is set to the size of $N_r \times c = N_{cells} \times N'_{xBLOCK\_TI\_MAX}$ by inserting the virtual XFECBLOCKs into the TI memory and the reading process is accomplished as follow expression.

[Expression 11]
$$p = 0;$$
$$\text{for } i = 0; i < N_{cells} N'_{xBLOCK\_TI\_MAX}; i = i + 1$$
$$\{ \text{GENERATE}(R_{n,s,i}, C_{n,s,i});$$
$$V_i = N_r C_{n,s,j} + R_{n,s,j}$$
$$\text{if } V_i < N_{cells} N_{xBLOCK\_TI}(n, s)$$
$$\{$$
$$Z_{n,s,p} = V_i; p = p + 1;$$
$$\}$$
$$\}$$

The number of TI groups is set to 3. The option of time interleaver is signaled in the PLS2-STAT data by DP_TI_TYPE='0', DP_FRAME_INTERVAL='1', and DP_TI_LENGTH='1', $I_{JUMP}=1$, and $P_1=1$. The number of XFECBLOCKs, each of which has $N_{cells}=30$ cells, per TI group is signaled in the PLS2-DYN data by $N_{xBLOCK\_TI}(0, 0)=3$, $N_{xBLOCK\_TI}(1,0)=6$, and $N_{xBLOCK\_TI}(2,0)=5$, respectively. The maximum number of XFECBLOCK is signaled in the PLS2-STAT data by $N_{xBLOCK\_Group\_MAX}$, which leads to $\lfloor N_{xBLOCK\_Group\_MAX}/N_{TI} \rfloor = N_{xBLOCK\_TI\_MAX}=6$.

Figure 28:
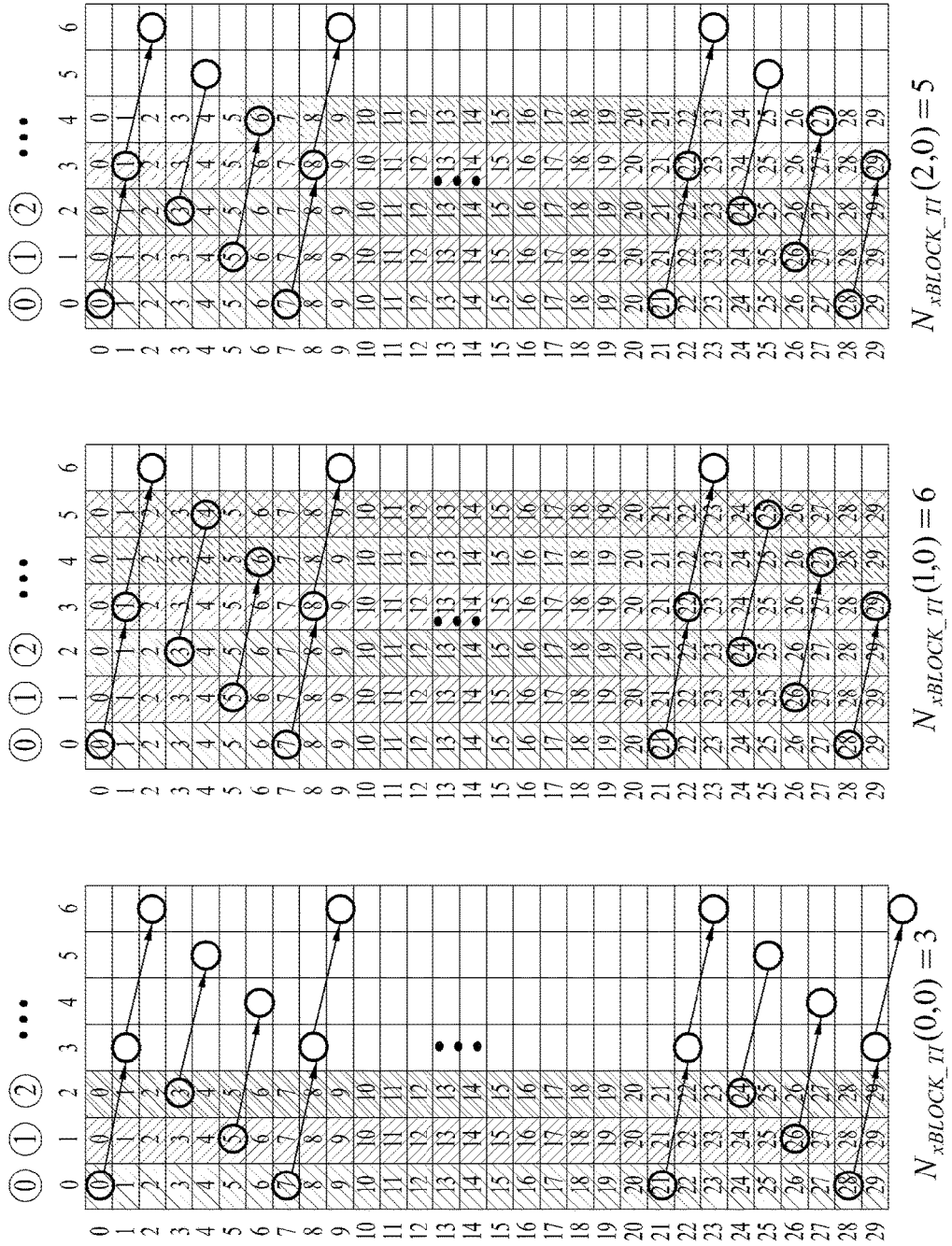
FIG. 28 illustrates a diagonal-wise reading pattern of a twisted row-column block interleaver according to an embodiment of the present invention.

FIG. 28 illustrates a diagonal-wise reading pattern of a twisted row-column block interleaver according to an embodiment of the present invention.

More specifically FIG. 28 shows a diagonal-wise reading pattern from each interleaving array with parameters of $N_{xBLOCK\_TI\_MAX}=7$ and $S_{shift}=(7-1)/2=3$. Note that in the reading process shown as pseudocode above, if $V_i \geq N_{cells} N_{xBLOCK\_TI}(n,s)$, the value of $V_i$ is skipped and the next calculated value of $V_i$ is used.

Figure 29:
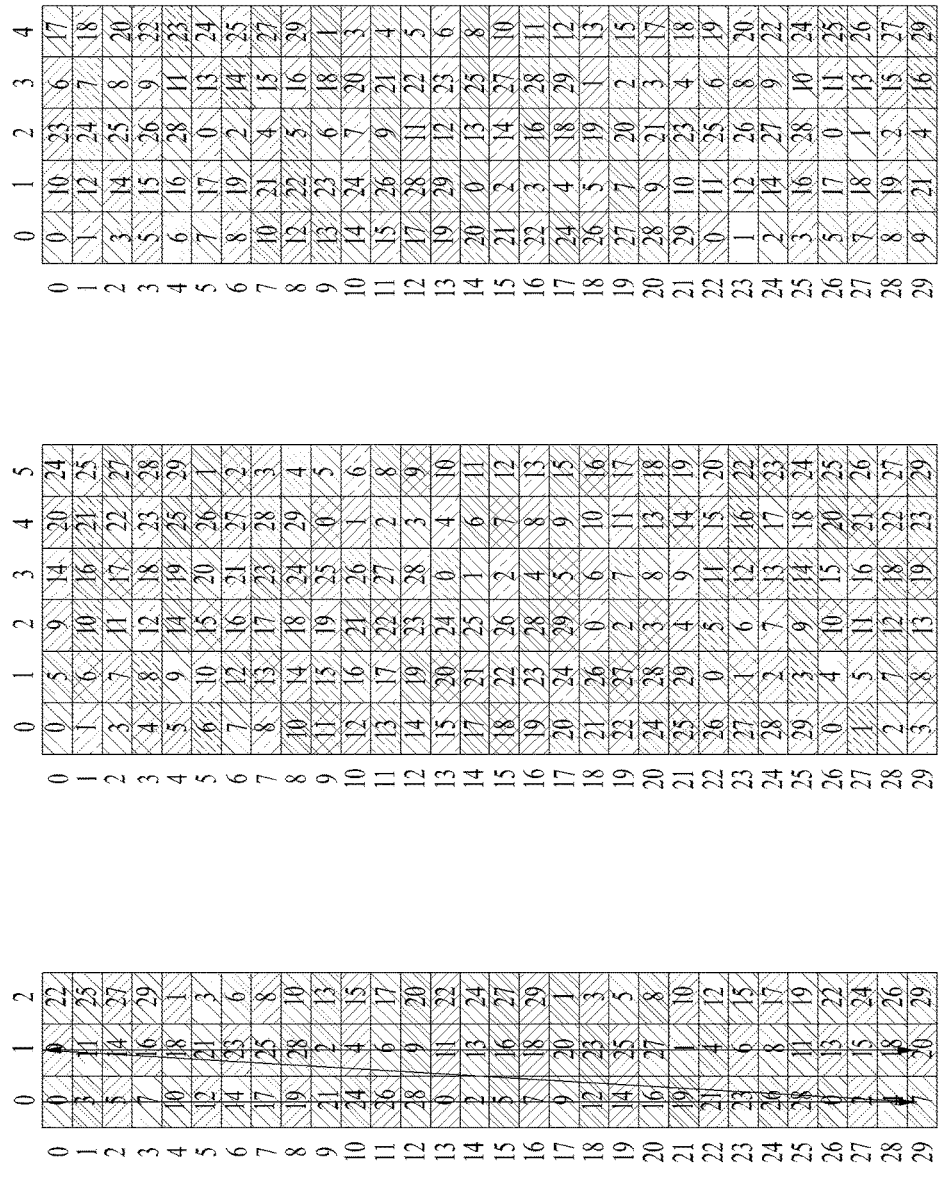
FIG. 29 illustrates interleaved XFECBLOCKs from each interleaving array according to an embodiment of the present invention.

FIG. 29 illustrates interleaved XFECBLOCKs from each interleaving array according to an embodiment of the present invention.

FIG. 29 illustrates the interleaved XFECBLOCKs from each interleaving array with parameters of $N'_{xBLOCK\_TI\_MAX}=7$ and $S_{shift}=3$.

Figure 30:
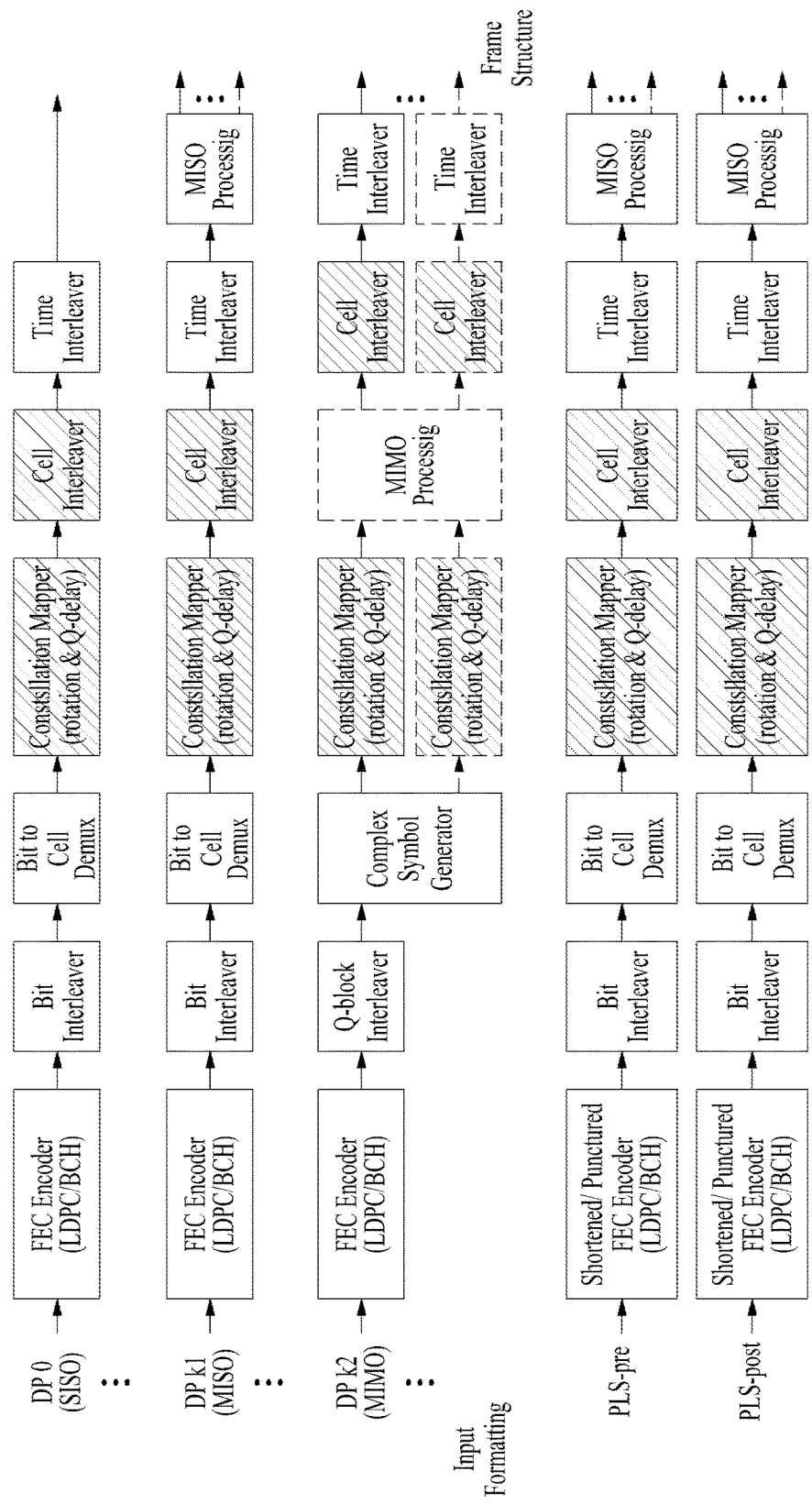
FIG. 30 is a view illustrating a coding & modulation module according to another embodiment of the present invention.

FIG. 30 is a view illustrating a coding & modulation module according to another embodiment of the present invention.

As described above, a constellation mapper allocates input bit words to one constellation. In this case, a rotation & Q-delay block may be additionally used. The rotation & Q-delay block may rotate input constellations based on rotation angles, divide the same into in-phase (I) components and quadrature-phase (Q) components, and then delay only the Q components by an arbitrary value. After that, newly paired I components and Q components are remapped to new constellations. The constellation mapper and the rotation & Q-delay block may be omitted or may be replaced by other blocks having the same or similar functions.

As described above, a cell interleaver randomly mixes and outputs cells corresponding to one FEC block in such a manner that the cells corresponding to each FEC block are output in a different order from cells corresponding to another FEC block. The cell interleaver may be omitted or may be replaced by another block having the same or similar function.

In the coding & modulation module according to another embodiment of the present invention, the shaded blocks are modified from the above-described coding & modulation module.

The coding & modulation module according to another embodiment of the present invention may perform periodic-random I/Q interleaving. The periodic-random I/Q interleaving technology may correspond to operations of the Q-delay block and the cell interleaver in this figure. In addition, according to an embodiment, when cell interleaving is omitted, periodic-random I/Q interleaving may be performed before time interleaving. Furthermore, according to another embodiment, when the cell interleaver is omitted, a time interleaver may perform periodic-random I/Q interleaving. In this case, the time interleaver may perform only the periodic-random I/Q interleaving operation, or perform the periodic-random I/Q interleaving operation and the above-described operation of the time interleaver in the next-generation broadcast system.

Overall, periodic-random I/Q interleaving may divide input constellations rotated based on rotation angles into I components and Q components, delay only the Q components by an arbitrary value, and then periodically and randomly mix the components. Periodic-random I/Q interleaving may be performed by one block differently from the above block diagram. In addition, as described above, periodic-random I/Q interleaving may be a technology performed by the time interleaver according to an embodiment. A detailed description of the operation principle of periodic-random I/Q interleaving will be given later.

Figure 31:
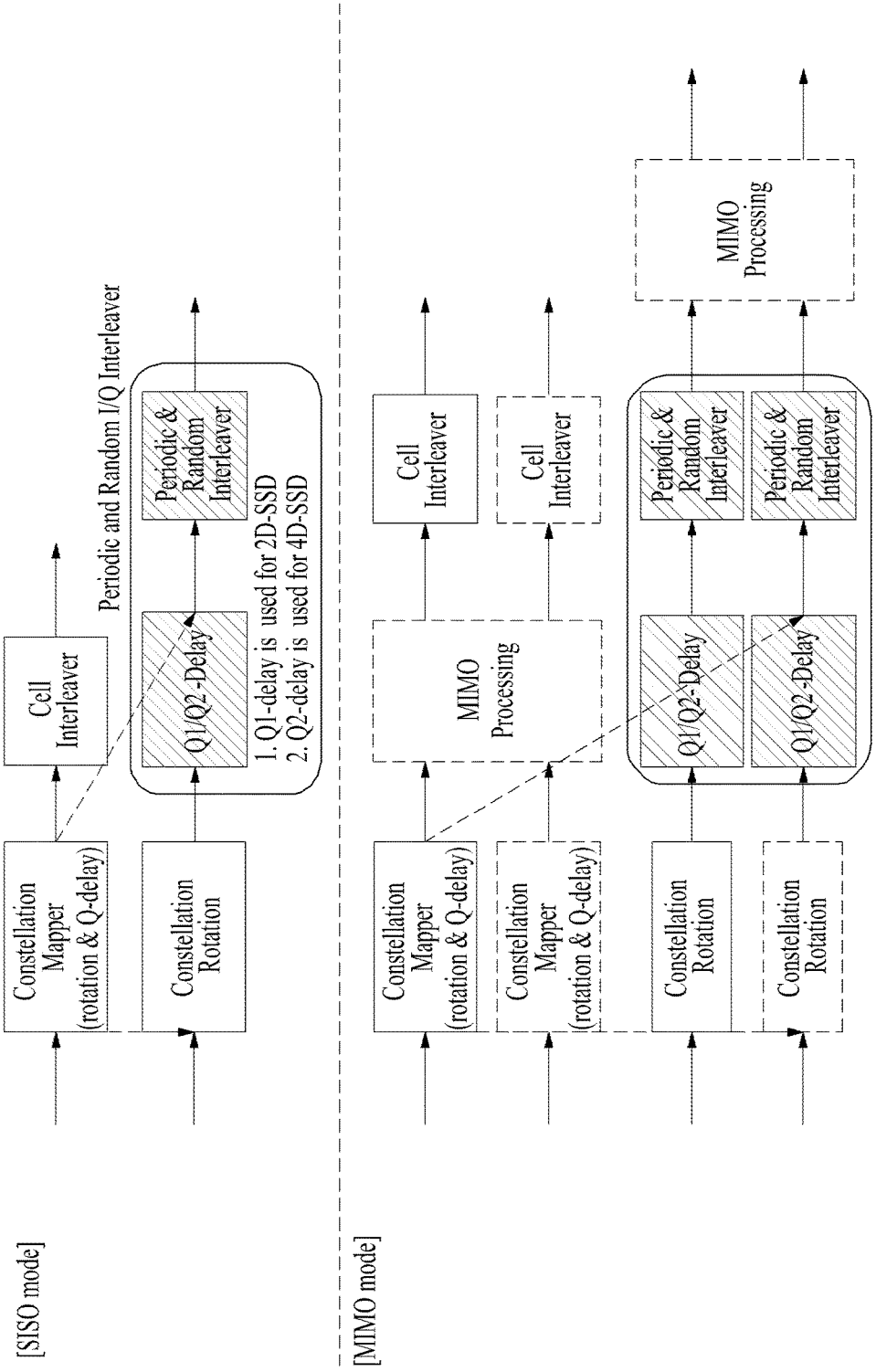
FIG. 31 is a view illustrating a periodic-random I/Q interleaving technology according to an embodiment of the present invention.

FIG. 31 is a view illustrating a periodic-random I/Q interleaving technology according to an embodiment of the present invention.

This figure illustrates, as described above, an embodiment in which the constellation mapper and the cell interleaver are replaced by a Q1/Q2-delay block and the above-described periodic-random I/Q interleaver. Here, the periodic-random I/Q interleaving technology may be a concept including the Q1/Q2-delay block and the periodic-random I/Q interleaver. In the following description, the periodic-random I/Q interleaver may refer to only the periodic-random I/Q interleaver of this figure, or refer to the whole periodic-random I/Q interleaving technology including the Q1/Q2-delay block.

The first block diagram illustrates an embodiment replaced in single-input and single-output (SISO) mode, and the second block diagram illustrates an embodiment replaced in multiple-input and multiple-output (MIMO) mode.

The Q1/Q2-delay block may divide I components and Q components and then delay only Q components. A delay value in this case may be determined based on use of 2D-SSD and use of 4D-SSD. The Q1-delay block may be used in the case of 2D-SSD, and the Q2-delay block may be used in the case of 4D-SSD.

The periodic-random I/Q interleaver may periodically write and randomly read output of the Q1/Q2-delay block in and from memory. A period used in this case may be determined based on use of 2D-SSD and use of 4D-SSD.

Figure 32:
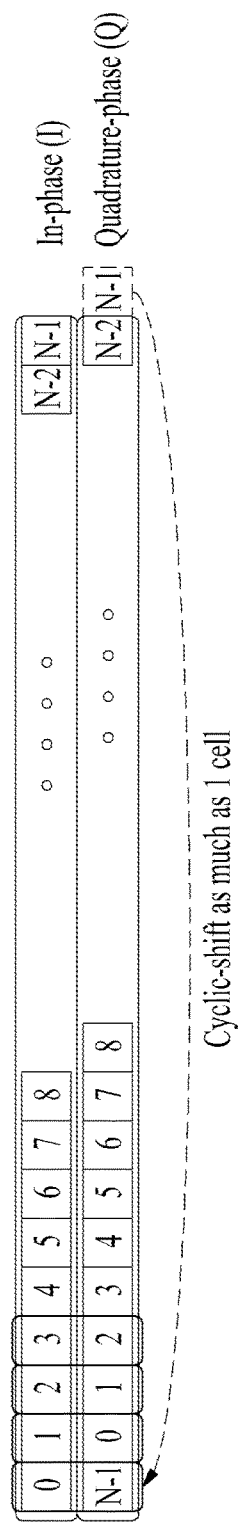
FIG. 32 is a view illustrating a Q1-delay process in the case of 2D-SSD, according to an embodiment of the present invention.

FIG. 32 is a view illustrating a Q1-delay process in the case of 2D-SSD, according to an embodiment of the present invention.

A description is now given of an operation process of a periodic-random I/Q interleaving technology including the Q1-delay block and the periodic-random I/Q interleaver in consideration of 2D-SSD. Here, the size of memory and the number of input cells are assumed as N.

When 2D-SSD is considered, the Q1-delay block may delay the Q components by one cell, and then an output signal thereof may be input to the periodic-random I/Q interleaver. In the figure illustrating the Q1-delay process according to an embodiment of the present invention, it is shown that the I components are constantly maintained and only the Q components are delayed by one cell. Since cyclic shifting is performed, an $(N-1)^{th}$ Q component is paired with a $0^{th}$ I component.

Figure 33:
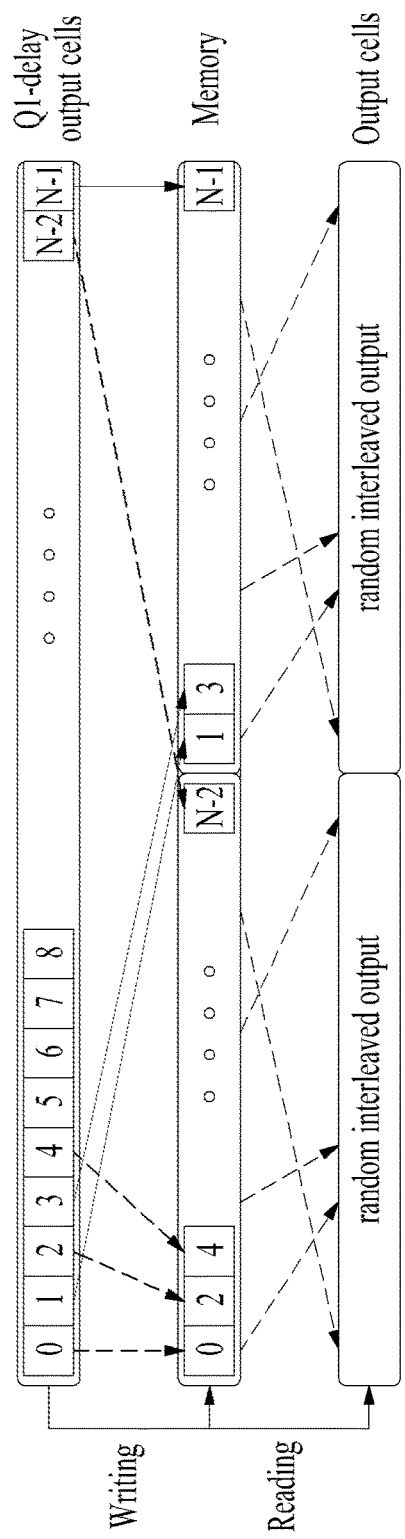
FIG. 33 is a view illustrating operation of the periodic-random I/Q interleaver in the case of 2D-SSD, according to an embodiment of the present invention.

FIG. 33 is a view illustrating operation of the periodic-random I/Q interleaver in the case of 2D-SSD, according to an embodiment of the present invention.

When 2D-SSD is considered, the output signal of the Q1-delay block is input to the memory and an input period in this case may be set to 2 to separate neighboring I/Q components of 2D-SSD as far as possible. As such, $0^{th}$, $2^{nd}$, $4^{th}$, ..., $(N-2)^{th}$ cells may be written in the memory, and then $1^{st}$, $3^{rd}$, $5^{th}$, ..., $(N-1)^{th}$ cells may be written in the memory. Consequently, this writing process relates to an operation for improving periodicity of the interleaver.

After that, the random interleaver may read the signal stored in the memory and thus the interleaved signal may be ultimately output. The reading process in this case may be performed based on an output index of the random interleaver. The size of the random interleaver may be N/2, or the size of an index generated by the random interleaver may be N/2. Accordingly, 2 random interleavers may be necessary for the reading process. The output memory index of the random interleaver may be generated using a quadratic polynomial (QP) algorithm or a pseudo-random binary sequence (PRBS) generator. In addition, the same random interleaver may be used for 2 periods in consideration of a writing period, and thus the principle of the writing process for spreading neighboring I/Q components as far as possible may be constantly maintained.

The above-described writing process may be expressed as given by the following equation.

$$\pi_w(k) = \frac{N}{2}\mathrm{mod}(k, 2) + \left\lfloor \frac{k}{2} \right\rfloor, \quad [\text{Expression 12}]$$

$$0 \le k \le N-1$$

N: total cell number

-continued $\lfloor \cdot \rfloor$: floor operation mod: modulus operation $\pi_w(k)$: writing memory– index for the $k^{th}$ cell

In addition, the above-described reading process may be expressed as given by the following equation.

$$\pi_r(k') = \left(\gamma + q \times \frac{k(k+1)}{2}\right)\mathrm{mod}\,\frac{N}{2} \quad [\text{Expression 13}]$$

for $k' = 0, \ldots, 2^n,$ where $\lceil \log_2(N/4) \rceil < n \le \lceil \log_2(N/2) \rceil$ if $0 \le \pi_r(k') \le \frac{N}{2} - 1,$ $\pi_r(k) = \frac{N}{2}g + \pi_r(k')$ for $k = 0, \ldots, \frac{N}{2} - 1,$ $g = 0, 1$ N: total cell number $\lceil \cdot \rceil$: ceil operation mod: modulus operation $\gamma$: an offset value of a quadratic polynomial(QP)

g: reading period, i.e., g = 2 in the case of 2D – SSD $\pi_r(k')$: output value of QP for the $k'$ order $\pi_r(k)$: reading memory– index for the $k^{th}$ cell

As shown in the above equations, the writing process improves spreading property of the interleaver while the reading process improves randomness property of the interleaver.

The random interleaving process generates the memory index using, for example, a QP algorithm. In this case, when the generated index is greater than N/2−1, the index may not be used as a memory index value but may be discarded, and the QP algorithm may be executed once again. If the re-generated index is less than N/2−1, the index may be used as a memory index value to perform the reading process. Here, the QP algorithm may be replaced by an arbitrary random interleaver such as PRBS.

Figure 34:
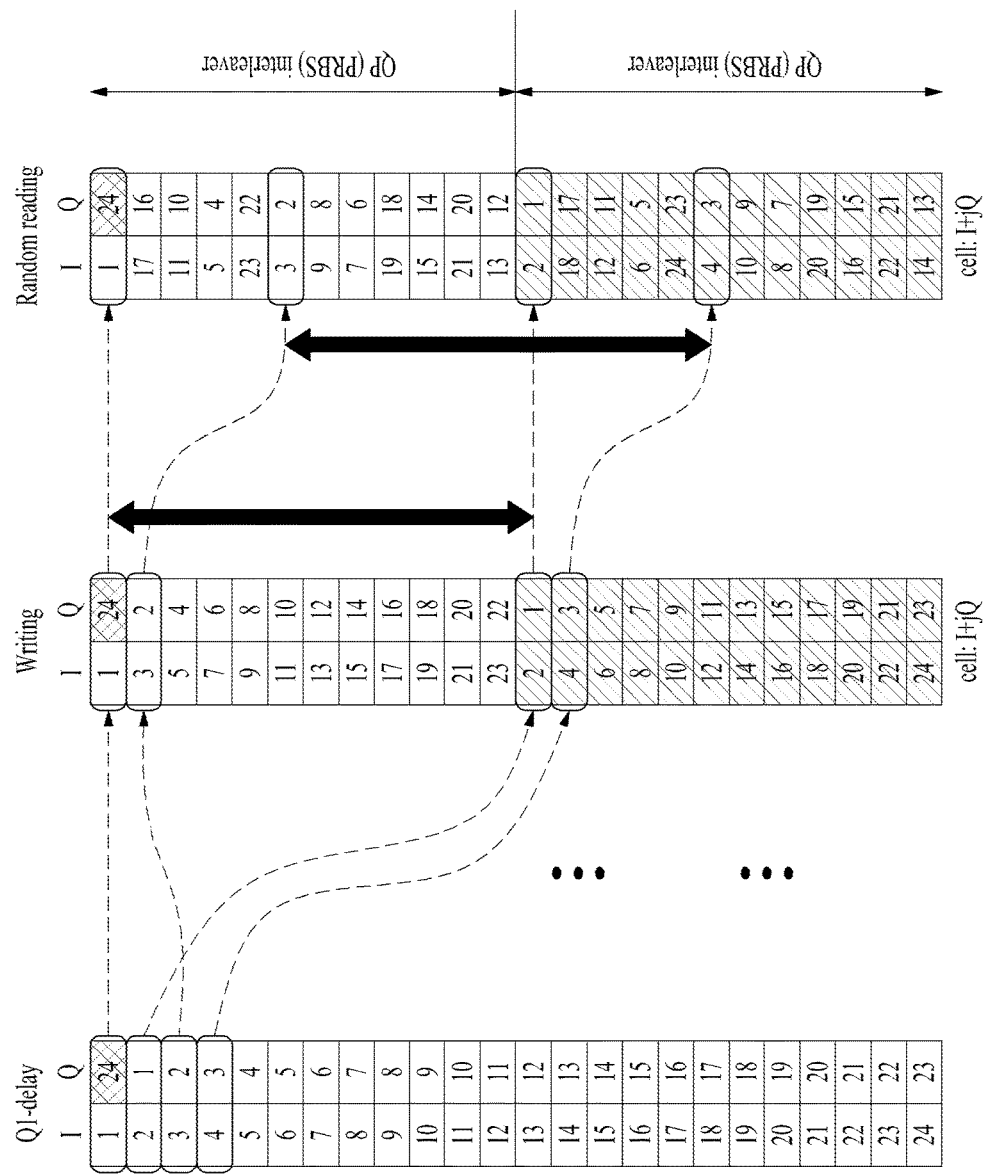
FIG. 34 is a view illustrating operation of the periodic-random I/Q interleaving technology in the case of 2D-SSD when N is 24, according to an embodiment of the present invention.

FIG. 34 is a view illustrating operation of the periodic-random I/Q interleaving technology in the case of 2D-SSD when N is 24, according to an embodiment of the present invention.

Even when N=24, periodic-random I/Q interleaving operates as described above. Q components are delayed by one cell through the Q1-delay block, a memory writing process is performed based on an input period of 2, and a memory reading process is performed, thereby performing random interleaving.

The effect of the periodic-random I/Q interleaving technology may be shown using the example of the case in which N=24. When an output signal is compared to an input signal, it is shown that the periodic-random I/Q interleaving technology includes both spreading and randomness properties.

Figure 35:
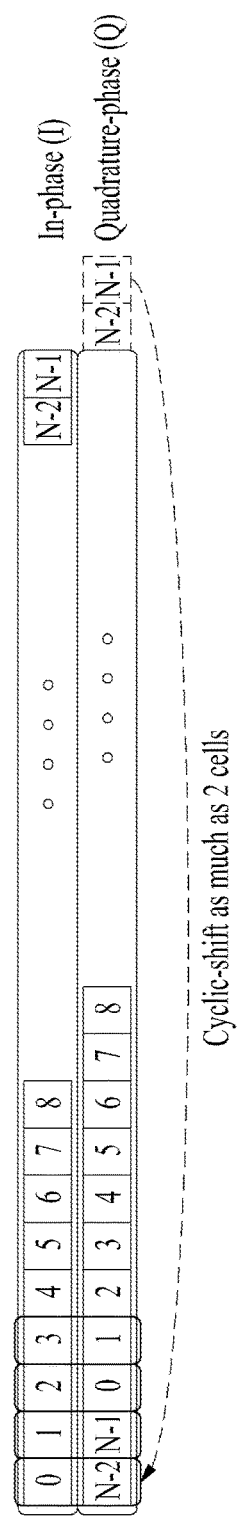
FIG. 35 is a view illustrating a Q2-delay process in the case of 4D-SSD, according to an embodiment of the present invention.

FIG. 35 is a view illustrating a Q2-delay process in the case of 4D-SSD, according to an embodiment of the present invention.

A description is now given of an operation process of a periodic-random I/Q interleaving technology including the Q2-delay block and the periodic-random I/Q interleaver in consideration of 4D-SSD. Here, the size of memory and the number of input cells are assumed as N.

When 4D-SSD is considered, the Q2-delay block may delay the Q components by two cells, and then an output signal thereof may be input to the periodic-random I/Q interleaver. In the figure illustrating the Q2-delay process according to an embodiment of the present invention, it is shown that the I components are constantly maintained and only the Q components are delayed by two cells. Since cyclic shifting is performed, $(N-2)^{th}$ and $(N-1)^{th}$ Q components are paired with $0^{th}$ and $1^{st}$ I components.

Figure 36:
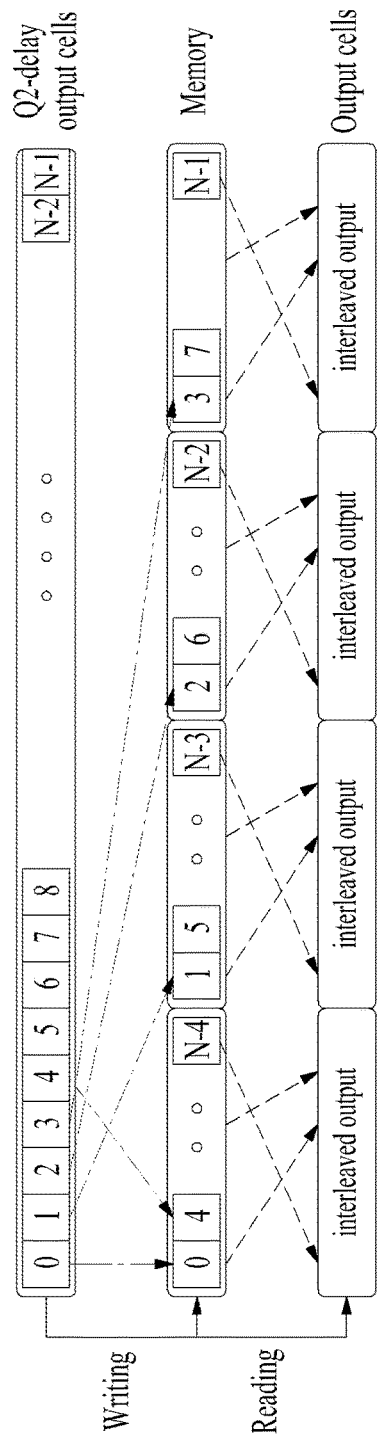
FIG. 36 is a view illustrating operation of the periodic-random I/Q interleaver in the case of 4D-SSD, according to an embodiment of the present invention.

FIG. 36 is a view illustrating operation of the periodic-random I/Q interleaver in the case of 4D-SSD, according to an embodiment of the present invention.

When 4D-SSD is considered, the output signal of the Q2-delay block is input to the memory and an input period in this case may be set to 4 to separate I/Q components of two neighboring cells of 4D-SSD as far as possible. As such, $0^{th}, 4^{th}, 8^{th}, \ldots, (N-4)^{th}$ cells may be written in the memory, and then $1^{st}, 5^{th}, 9^{th}, \ldots, (N-3)^{th}$ cells, $2^{nd}, 6^{th}, 10^{th}, \ldots, (N-2)^{th}$ cells, and $3^{rd}, 7^{th}, 11^{th}, \ldots, (N-1)^{th}$ cells may be written in the memory. Consequently, this writing process relates to an operation for improving periodicity of the interleaver.

After that, the random interleaver may read the signal stored in the memory and thus the interleaved signal may be ultimately output. The reading process in this case may be performed based on an output index of the random interleaver. The size of the random interleaver may be N/4, or the size of an index generated by the random interleaver may be N/4. Accordingly, 4 random interleavers may be necessary for the reading process. The output memory index of the random interleaver may be generated using a quadratic polynomial (QP) algorithm or a pseudo-random binary sequence (PRBS) generator. In addition, the same random interleaver may be used for 4 periods in consideration of a writing period, and thus the principle of the writing process for spreading I/Q components of two neighboring cells as far as possible may be constantly maintained.

The above-described writing process may be expressed as given by the following equation.

$$\pi_w(k) = \frac{N}{4}\mathrm{mod}(k, 2) + \left\lfloor \frac{k}{4} \right\rfloor, \quad \text{[Expression 14]}$$

$0 \le k \le N-1$ $N$: total cell number $\lfloor \cdot \rfloor$: floor operation mod: modulus operation $\pi_w(k)$: writing memory-index for the $k^{th}$ cell In addition, the above-described reading process may be expressed as given by the following equation.

$$\pi_r(k') = \left(\gamma + q \times \frac{k(k+1)}{2}\right)\mathrm{mod}\,\frac{N}{4} \quad \text{[Expression 15]}$$

for $k' = 0, \ldots 2^n,$ where $\lceil \log_2(N/8) \rceil < n \le \lceil \log_2(N/4) \rceil$ if $0 \le \pi_r(k') \le \frac{N}{4} - 1,$ $\pi_r(k) = \frac{N}{4}g + \pi_r(k')$ for $k = 0, \ldots, \frac{N}{4} - 1,$ $g = 0, 1, 2, 3$ $N$: total cell number $\lceil \cdot \rceil$: ceil operation mod: modulus operation $\gamma$: an offset value of a quadratic polynomial(QP)

$g$: reading period, i.e., $g = 4$ in the case of $4D - SSD$ $\pi_r(k')$: output value of QP for the $k'$ order $\pi_r(k)$: reading memory-index for the $k^{th}$ cell As shown in the above equations, the writing process improves spreading property of the interleaver while the reading process improves randomness property of the interleaver.

The random interleaving process generates the memory index using, for example, a QP algorithm. In this case, when the generated index is greater than N/4−1, the index may not be used as a memory index value but may be discarded, and the QP algorithm may be executed once again. If the re-generated index is less than N/4−1, the index may be used as a memory index value to perform the reading process. Here, the QP algorithm may be replaced by an arbitrary random interleaver such as PRBS.

Figure 37:
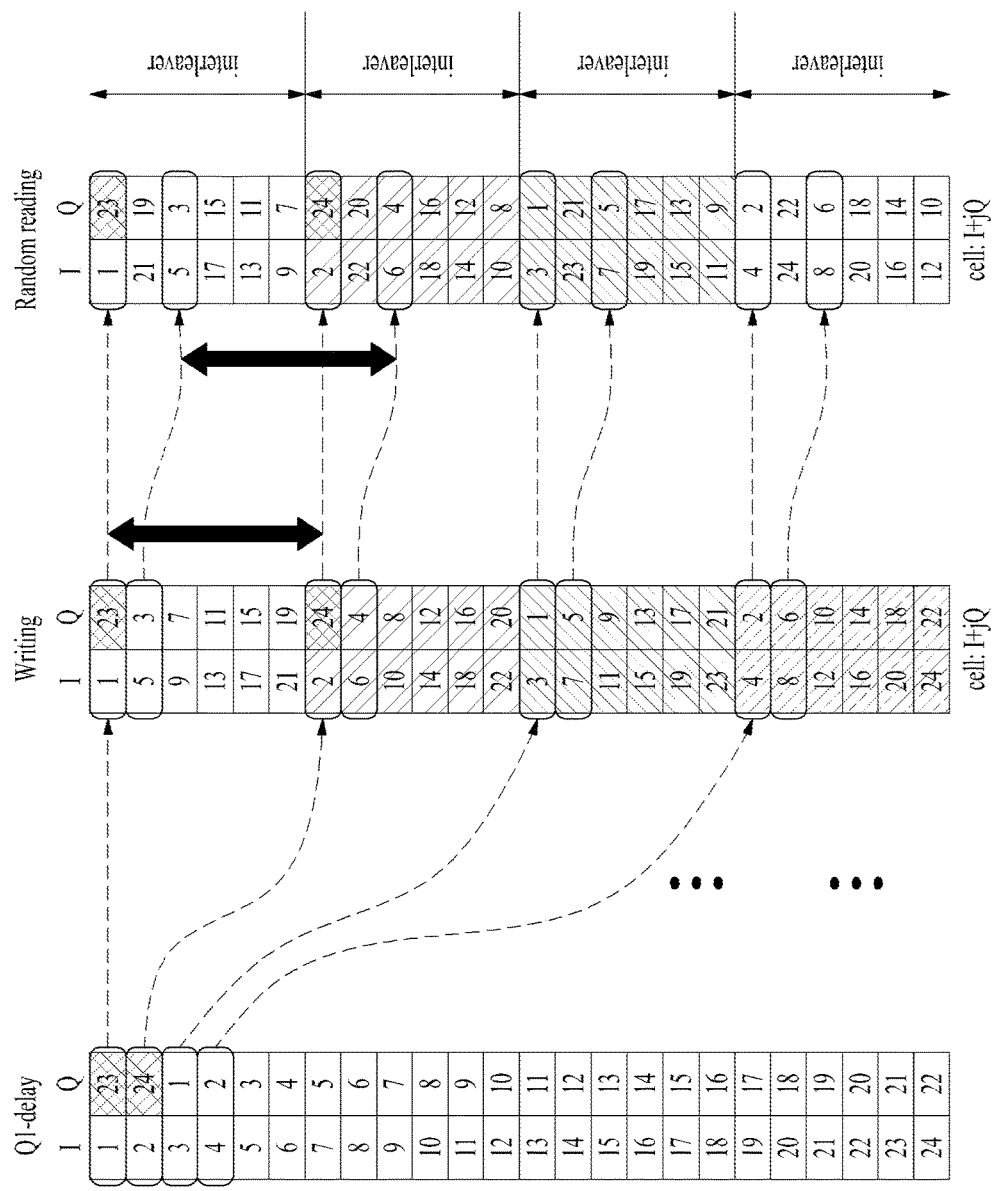
FIG. 37 is a view illustrating operation of the periodic-random I/Q interleaving technology in the case of 4D-SSD when N is 24, according to an embodiment of the present invention.

FIG. 37 is a view illustrating operation of the periodic-random I/Q interleaving technology in the case of 4D-SSD when N is 24, according to an embodiment of the present invention.

Even when N=24, periodic-random I/Q interleaving operates as described above. Q components are delayed by two cells through the Q2-delay block, a memory writing process is performed based on an input period of 4, and a memory reading process is performed, thereby performing random interleaving.

The effect of the periodic-random I/Q interleaving technology may be shown using the example of the case in which N=24. When an output signal is compared to an input signal, it is shown that the periodic-random I/Q interleaving technology includes both spreading and randomness properties.

Figure 38:
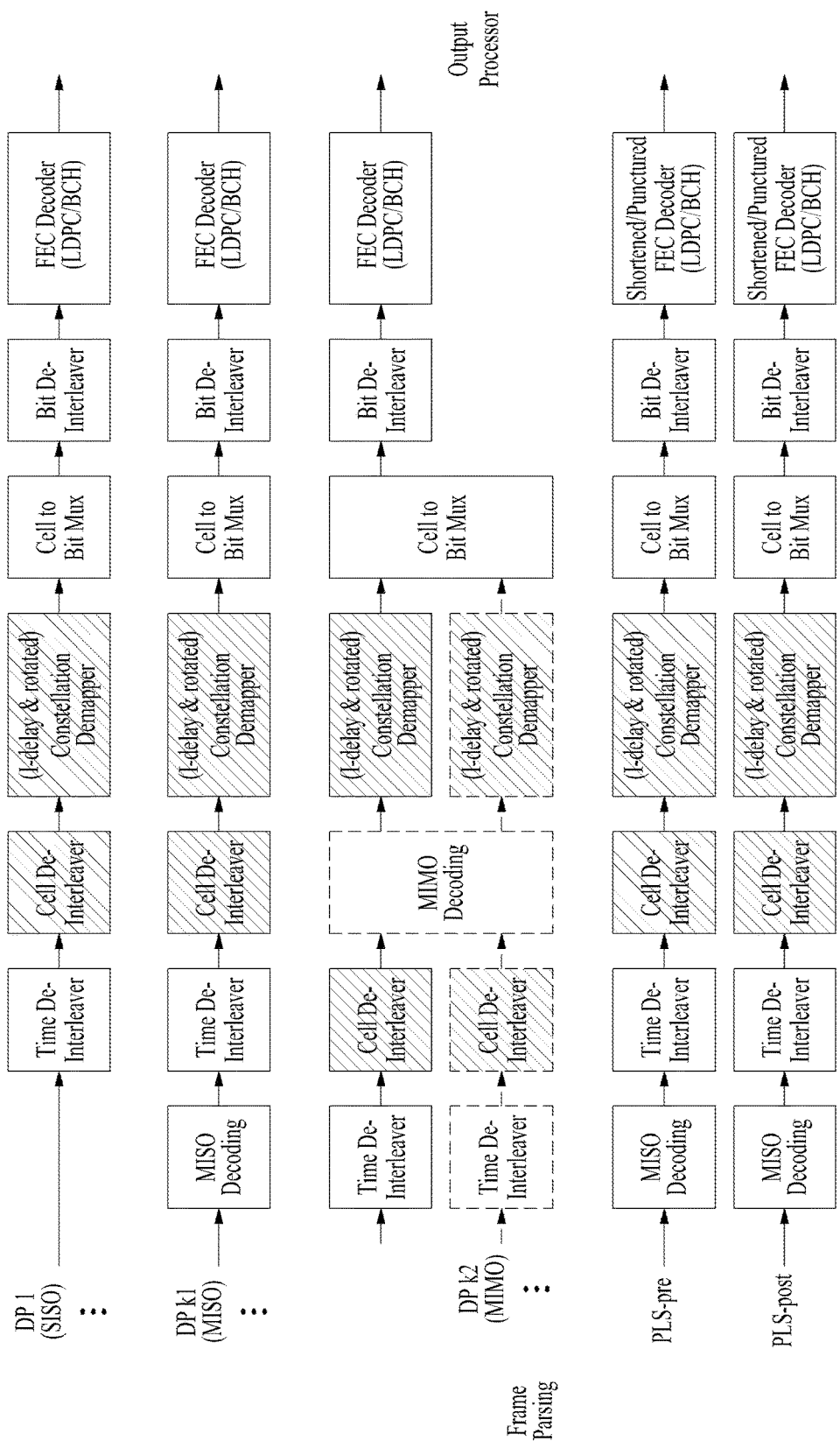
FIG. 38 is a detailed block diagram of a demapping & decoding module according to another embodiment of the present invention.

FIG. 38 is a detailed block diagram of a demapping & decoding module according to another embodiment of the present invention.

As described above, a cell deinterleaver may deinterleave cells spread within one FEC block, to original positions thereof. The cell deinterleaver performs an inverse operation of the operation of the cell interleaver of the transmitter. In addition, an I-delay block of a constellation demapper delays I components to restore Q components delayed by the transmitter, to original positions thereof.

In the demapping & decoding module according to another embodiment of the present invention, the shaded blocks are modified from the above-described demapping & decoding module.

The demapping & decoding module according to another embodiment of the present invention may include a periodic-random I/Q deinterleaving process. The periodic-random I/Q deinterleaving technology may correspond to operations of the cell deinterleaver and the I-delay block in this figure. In addition, according to an embodiment, when cell deinterleaving is omitted, periodic-random I/Q deinterleaving may be performed after time deinterleaving. Furthermore, according to another embodiment, when the cell deinterleaver is omitted, a time deinterleaver may perform periodic-random I/Q deinterleaving. In this case, the time deinterleaver may perform only the periodic-random I/Q deinterleaving operation, or perform the periodic-random I/Q deinterleaving operation and the above-described operation of the time deinterleaver in the next-generation broadcast system.

Figure 39:
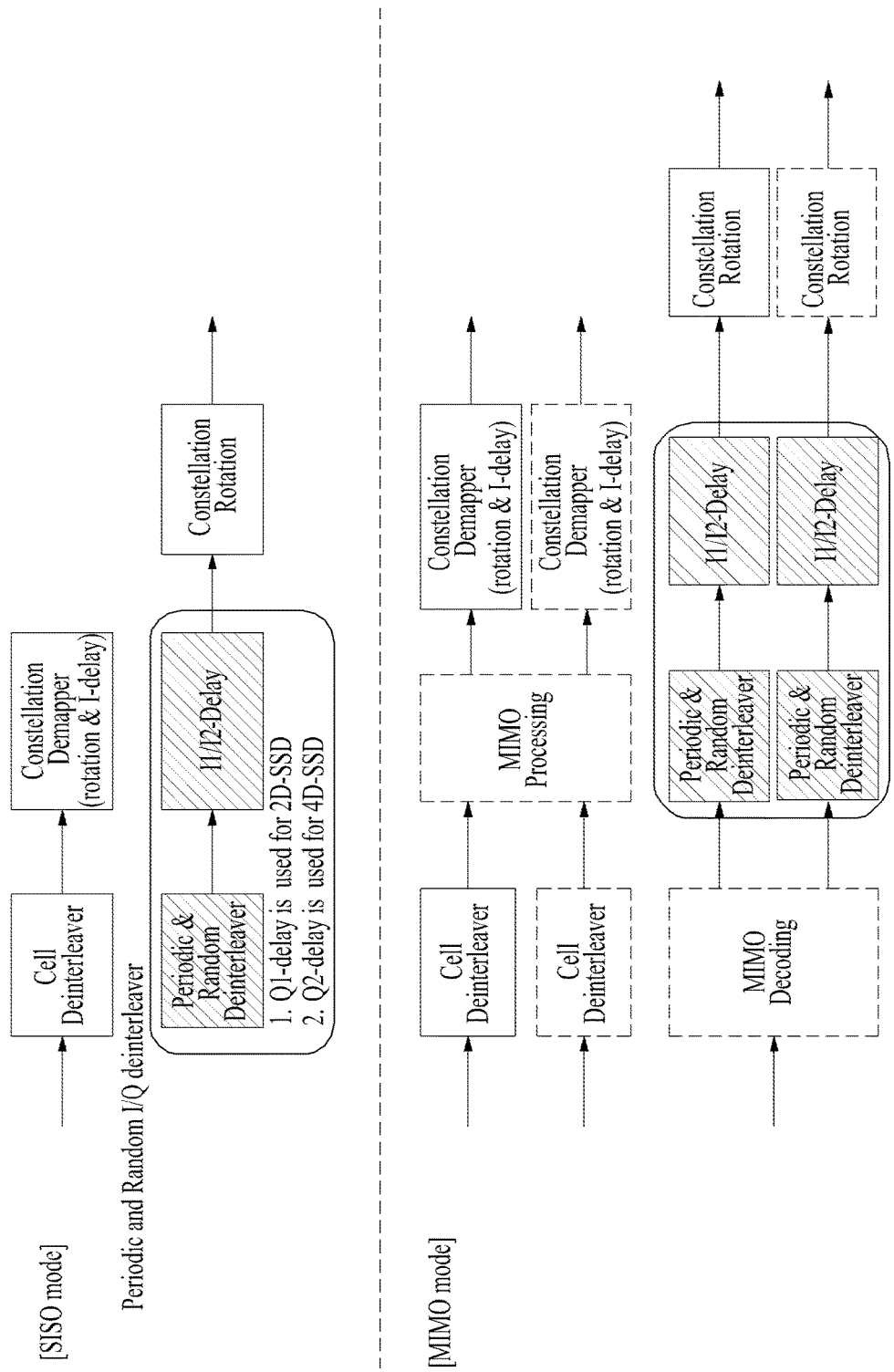
FIG. 39 is a view illustrating a periodic-random I/Q deinterleaving technology according to an embodiment of the present invention.

FIG. 39 is a view illustrating a periodic-random I/Q deinterleaving technology according to an embodiment of the present invention.

This figure illustrates, as described above, an embodiment in which the constellation demapper and the cell deinterleaver are replaced by the above-described periodic-random I/Q deinterleaver and an I1/I2 delay block. Here, the periodic-random I/Q deinterleaving technology may be a concept including the periodic-random I/Q deinterleaver and the I1/I2-delay block. In the following description, the periodic-random I/Q deinterleaver may refer to only the periodic-random I/Q deinterleaver of this figure, or refer to the whole periodic-random I/Q deinterleaving technology including the I1/I2-delay block. The first block diagram illustrates an embodiment replaced in single-input and single-output (SISO) mode, and the second block diagram illustrates an embodiment replaced in multiple-input and multiple-output (MIMO) mode.

An overall operation process of the receiver may follow an inverse (restoration) process compared to the operation of the transmitter. The periodic-random I/Q deinterleaving technology corresponding to the invented periodic-random I/Q interleaving technology may be as described below.

The periodic-random I/Q deinterleaver randomly performs writing operation in an opposite direction to the periodic-random I/Q interleaver of the transmitter, and then periodically performs reading operation. A mathematical expression or algorithm used in this case may be the same as that used by the transmitter.

Output of the periodic-random I/Q deinterleaver is input to the I1/I2-delay block. The I1/I2-delay divides I components and Q components and then delays only the I components. A delay value in this case may be determined to 1 and 2 based on use of 2D-SSD and use of 4D-SSD. The I1-delay block may be used in the case of 2D-SSD, and the I2-delay block may be used in the case of 4D-SSD. Consequently, the influence of the Q1/Q2-delay block operating in the transmitter may be offset by the I1/I2-delay.

Figure 40:
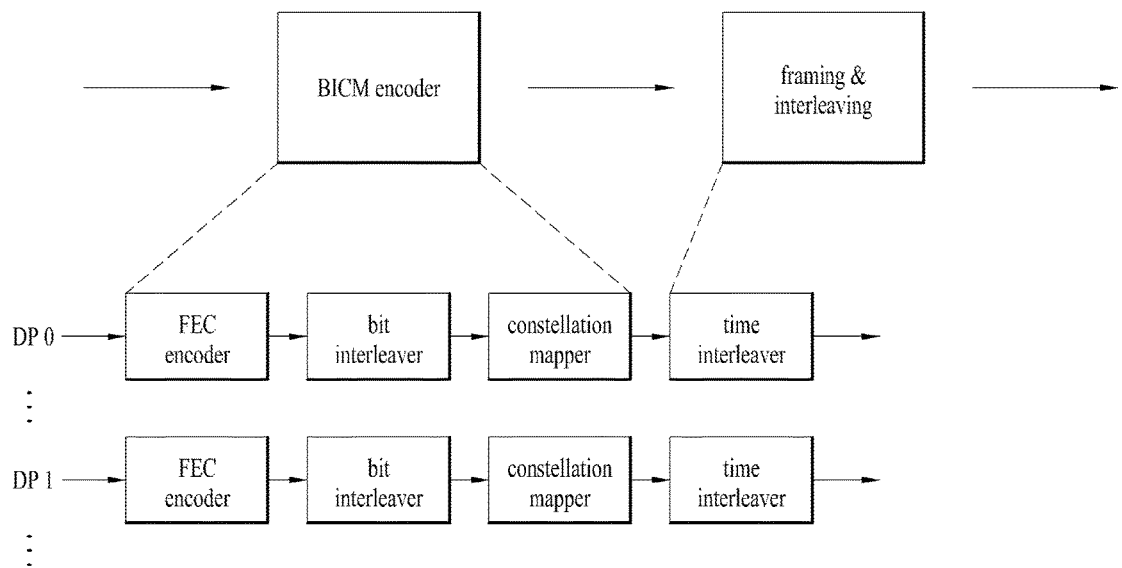
FIG. 40 illustrates a part of a broadcast signal transmitter for next-generation broadcast service according to another embodiment of the present invention.

FIG. 40 illustrates a part of a broadcast signal transmitter for next-generation broadcast service according to another embodiment of the present invention.

Here, a bit interleaved coded modulation (BICM) encoder may correspond to the above-described coding & modulation module. In the current embodiment, the BICM encoder may include an FEC encoder, a bit interleaver, and/or a constellation mapper. According to an embodiment, the BICM encoder may further include a time interleaver. According to an embodiment, the time interleaver may be located after the constellation mapper.

Here, a framing & interleaving module may be a new concept including the above-described frame builder and/or frequency interleaver. The framing & interleaving module according to the current embodiment may include the time interleaver, the frame builder and/or the frequency interleaver. According to an embodiment, the framing & interleaving module may not include the time interleaver. According to an embodiment, the time interleaver may not be included in the BICM encoder or the framing & interleaving module but may be located between the BICM encoder and the framing & interleaving module.

The time interleaver according to an embodiment of the present invention may further include a cell interleaver, a block interleaver, and/or a convolutional interleaver. Here, the cell interleaver may be the above-described cell interleaver. When the cell interleaver is included in the time interleaver, before time interleaving, the cell interleaver may interleave cells in FEC blocks in such a manner that the cells of each FEC block are output in a different order from cells of another FEC block. The block interleaver may perform block interleaving on TI blocks each including one or more FEC blocks. The block interleaver may perform interleaving by linearly writing cells or cell pairs in an FEC block in a column-wise direction, and reading the same in a diagonal-wise direction. In the writing operation, a left part of memory may be filled with virtual FEC blocks and a right part of the memory may be filled with FEC blocks having actual data. In the reading operation, cells or cell pairs of these virtual FEC blocks may not be read but may be skipped. The convolutional interleaver may perform interleaving by spreading the block-interleaved TI blocks to a plurality of signal frames.

The present invention proposes another embodiment of the above-described cell interleaver. The cell interleaver according to another embodiment of the present invention may interleave cells in one FEC block. Due to operation of the cell interleaver, time diversity performance of the time interleaver may be greatly improved. That is, the cell interleaver may improve time diversity of a burst channel environment in association with the time interleaver. In addition, the present invention proposes a cell deinterleaver corresponding to the cell interleaver according to another embodiment of the present invention. Cell interleaving proposed by the present invention may be performed to reduce or eliminate memory used for cell deinterleaving.

The cell interleaver according to another embodiment of the present invention may randomly interleave cells in one FEC block. Such random cell interleaving may be performed through linear writing and random reading using an interleaving pattern.

Initially, the cell interleaver may linearly write cells of an FEC block in the memory (linear writing). Here, the linearly writing operation may refer to an operation for sequentially writing the cells in the memory by the cell interleaver.

After that, the cell interleaver may randomly read the cells linearly written in the memory (random reading). This random reading operation may be performed using an interleaving pattern. Here, the interleaving pattern may be called an interleaving sequence, permutation sequence, interleaving seed, permutation function, memory address, random sequence, or the like.

The cell interleaver may change the permutation sequence used for the random reading operation, ever FEC block. Alternatively, according to an embodiment, the permutation sequence may be changed every pair of FEC blocks. As the permutation sequence is changed every FEC block, randomness property of the cell interleaver may be improved.

Here, the permutation sequences for the FEC blocks may be generated by shifting one basic permutation sequence. In this case, the basic permutation sequence may be a pseudo-random sequence.

When only one PLP is present (S-PLP), the above-described time interleaver may not include the cell interleaver. When only one PLP is present, cell interleaving may not be performed.

The cell deinterleaver according to another embodiment of the present invention may be a module of the receiver corresponding to the above-described cell interleaver. The cell deinterleaver according to another embodiment of the present invention may perform an inverse operation of the operation of the above-described cell interleaver.

According to an embodiment, this cell deinterleaver may have a ping-pong structure. In this case, the cell deinterleaver may use memory of an FEC decoder instead of using additional memory for the ping-pong structure. Accordingly, the receiver may not need additional memory for the cell deinterleaver even when the cell deinterleaver has a ping-pong structure. This efficient use of memory is enabled because the above-described cell interleaver has interleaved the cells through linear writing & random reading operation. A detailed description of cell deinterleaving operation will be given below.

Figure 41:
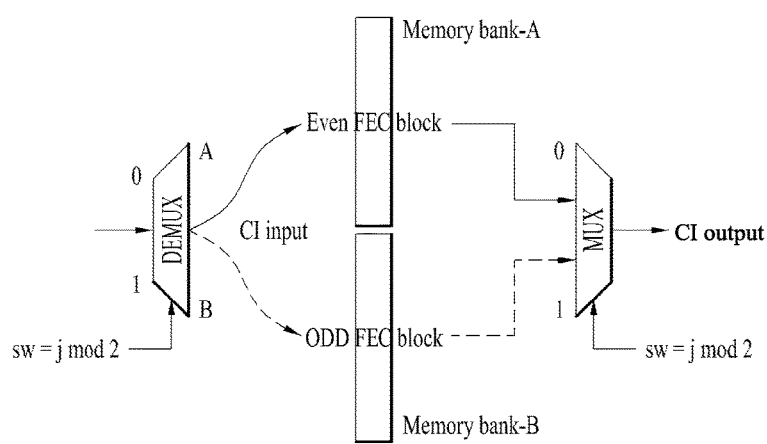
FIG. 41 is a view illustrating a basic switch structure according to an embodiment of the present invention.

FIG. 41 is a view illustrating a basic switch structure according to an embodiment of the present invention.

As described above, according to an embodiment, a cell interleaver may have a ping-pong structure. A demux may send FEC blocks to specific memory banks based on whether the FEC blocks are odd-numbered or even-numbered. The even-numbered FEC blocks may be sent to memory bank A, and the odd-numbered FEC blocks may be sent to memory bank B. The sent FEC blocks may be cell-interleaved and then sent to a mux. The mux may align and output the received interleaved FEC blocks.

Here, mod may denote modulo operation, and j may have an integer value between 0 and $N_{FEC\_block}-1$. In this case, $N_{FEC\_block}-1$ may denote the number of FEC blocks in an interleaving unit.

FIG. 42 is a view mathematically expressing linear writing & random reading operation of the cell interleaver according to another embodiment of the present invention.

Equation t42010 of the figure shows an input vector of the cell interleaver. $X_j$ may be an input vector of a $j^{th}$ FEC block. $X_j(p)$ values included in $X_j$ may individually indicate cells of the $j^{th}$ FEC block. Here, p may have a value from 0 to $N_{cells}-1$. In this case, $N_{cells}$ may denote the number of cells in the FEC block.

Equation t42020 of the figure shows an output vector, i.e., an interleaved vector, of the cell interleaver. $F_j$ may be an output vector of the $j^{th}$ FEC block. $F_j(p)$ values included in $F_j$ may individually indicate interleaved cells of the $j^{th}$ FEC block. Here, p may have a value from 0 to $N_{cells}$. That is, the cells of the input vector $X_j$ may be interleaved by the cell interleaver and thus the order thereof may be changed into the form of $F_j$.

Equation t42030 of the figure may be a mathematical expression of linear writing & random reading operation of the cell interleaver. Due to the linear writing & random reading operation, the order of the cells of the input FEC block may be changed as indicated by the value of a permutation sequence. In the illustrated equation, the order of a $k^{th}$ cell $F_j(k)$ of the output vector may be changed to be the same as the order of a $C_j(k)^{th}$ cell $X_j(C_j(k))$ of the input vector. That is, the order may be randomly changed in such a manner that the $k^{th}$ cell becomes the $C_j(k)^{th}$ cell.

Here, $C_j(k)$ is a random value generated by the above-described random generator, and may correspond to the above-described permutation sequence. $C_j(k)$ may be a permutation sequence for the $j^{th}$ FEC block. This permutation sequence may be implemented using an arbitrary PRBS generator. The present invention is generally applicable irrespective of the PRBS generator.

Here, j may have an integer value between 0 and $N_{FEC\_block}-1$. $N_{FEC\_block}-1$ may denote the number of FEC blocks in an interleaving unit. In addition, k may have a value from 0 to $N_{cells}-1$.

FIG. 43 is a view mathematically expressing a permutation sequence generating method of the cell interleaver according to another embodiment of the present invention cell interleaver.

As described above, a permutation sequence may be changed every FEC block. These permutation sequences may be generated by differently shifting one basic permutation sequence. This shifting process may be performed using a shift value to be described below.

T(k) may be a basic permutation sequence generated by the above-described random generator. This basic permutation sequence may also be called a main interleaving pattern. This basic permutation sequence may be used by a main cell interleaver. That is, the basic permutation sequence is used to perform cell interleaving on the first FEC block of a TI block.

$S_j$ may be a shift value used for the $j^{th}$ FEC block. $S_j$ may be added to T(k) and thus used to generate different permutation sequences for different FEC blocks. This shift value may be implemented using an arbitrary PRBS generator. That is, the present invention is generally applicable irrespective of the PRBS generator. According to an embodiment, the shift value may be subtracted from T(k) to generate different permutation sequences for different FEC blocks.

After the shift value is reflected in the basic permutation sequence, modulo operation with $N_{cells}$ may be performed. $N_{cells}$ may denote the number of cells in a corresponding FEC block. Due to modulo operation with $N_{cells}$, constant shifting may be performed on the basic permutation sequence. As such, different permutation sequences may be generated for different FEC blocks.

Figure 44:
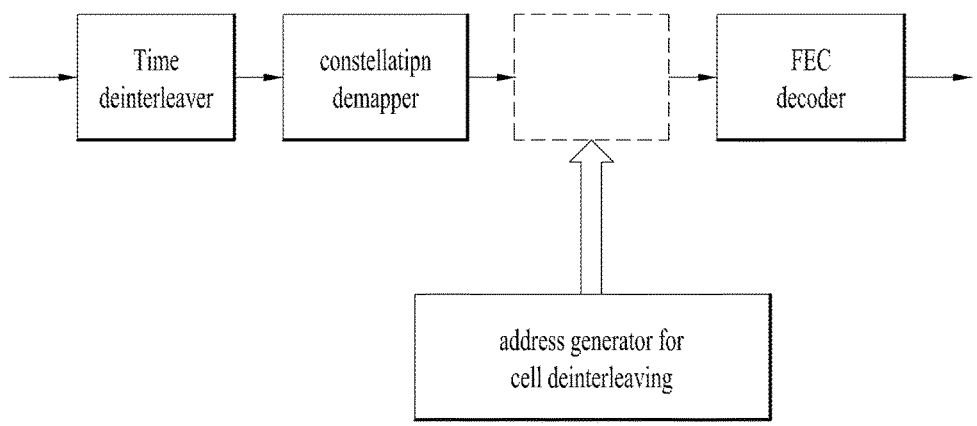
FIG. 44 illustrates a part of a broadcast signal receiver for next-generation broadcast service including a cell deinterleaver according to another embodiment of the present invention.

FIG. 44 illustrates a part of a broadcast signal receiver for next-generation broadcast service including a cell deinterleaver according to another embodiment of the present invention.

The cell deinterleaver according to another embodiment of the present invention may be a block corresponding to the above-described cell interleaver. The cell deinterleaver may perform an inverse operation of the operation of the cell interleaver of the transmitter. The cell deinterleaver may restore cells interleaved in one FEC block to original positions thereof. An algorithm of cell deinterleaving operation may be performed inversely from the algorithm of cell interleaving operation.

That is, the cell deinterleaver may randomly write cells of an FEC block in memory and then linearly read the written cells (random writing & linear reading). The random writing operation may be performed using a permutation sequence. The linear reading operation may refer to an operation for sequentially reading the cells written in the memory.

In addition, the cell deinterleaver according to another embodiment of the present invention may not perform cell deinterleaving on output of a time deinterleaver. Cell deinterleaving may be performed when the output of the time deinterleaver is stored in FEC decoding memory after an additional decoding process, e.g., constellation demapping, is performed thereon. When data is stored in the FEC decoding memory, the data may be stored in consideration of cell deinterleaving using address values generated by an address generator. That is, memory of an FEC decoder may be used for cell deinterleaving. Consequently, the receiver may not need additional memory for cell deinterleaving, and thus efficient data processing operation of the receiver may be enabled.

According to an embodiment, the cell deinterleaver according to another embodiment of the present invention may be located in the time deinterleaver or located after the time deinterleaver.

Figure 45:
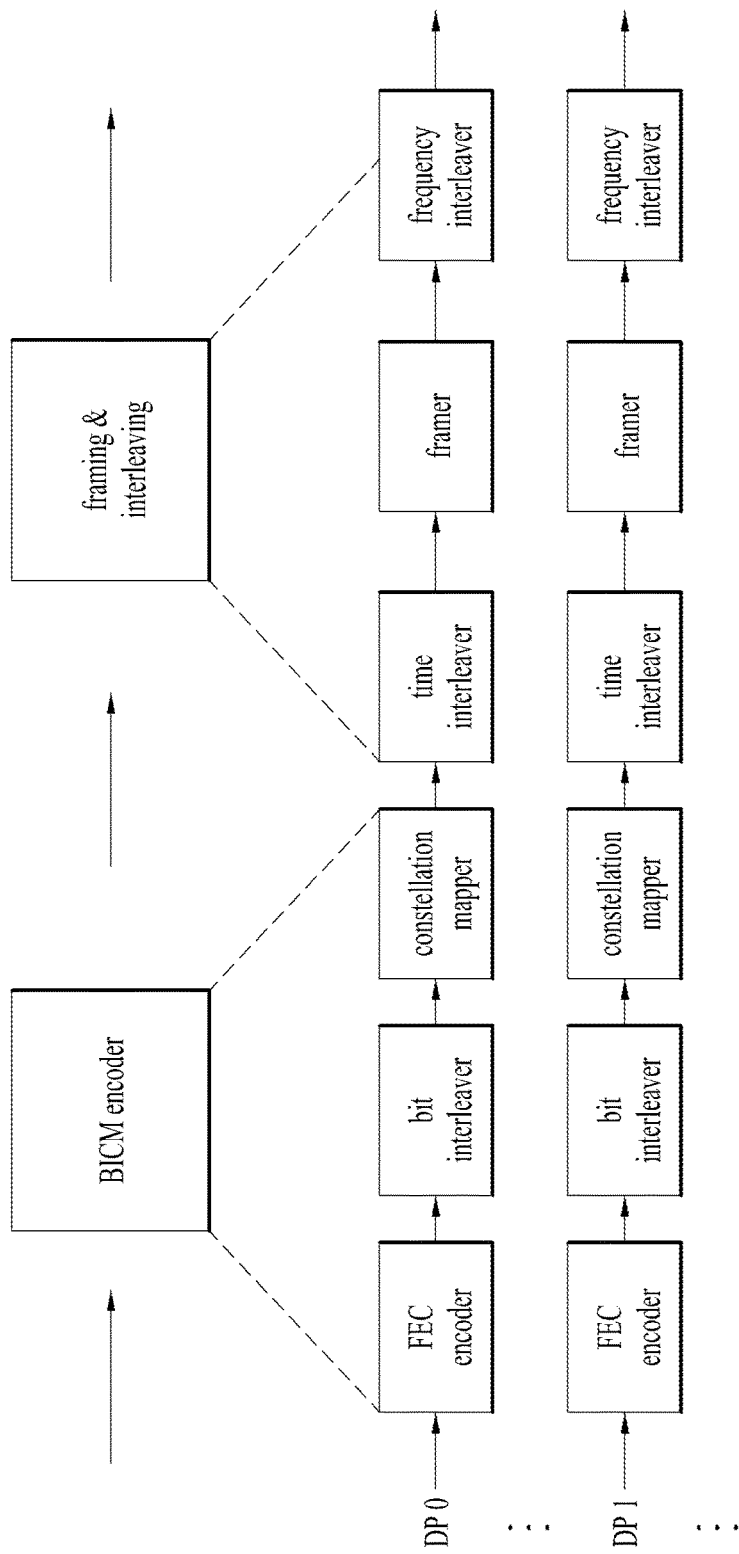
FIG. 45 illustrates a portion of a configuration of a broadcast signal transmission apparatus for a next generation broadcast service according to another embodiment of the present invention.

FIG. 45 illustrates a portion of a configuration of a broadcast signal transmission apparatus for a next generation broadcast service according to another embodiment of the present invention.

An illustrated bit interleaved coded modulation (BICM) encoder may correspond to the above-described coding and modulation module. In the present embodiment, the BICM encoder may include an FEC encoder, a bit interleaver, and/or a constellation mapper. An illustrated framing & interleaving module may correspond to a new concept that simultaneously indicates the time interleaver, the frame builder, and/or the frequency interleaver described above. Here, the frame builder may be referred to as a framer.

According to a given embodiment, the time interleaver may be included in the BICM encoder rather than the framing & interleaving module. In this case, the framing & interleaving module may not include the time interleaver. In addition, in the BICM encoder, the time interleaver may be positioned after the constellation mapper. According to another embodiment, the time interleaver may be positioned between the BICM encoder and the framing & interleaving module. In this case, the framing & interleaving module may not include the time interleaver.

In the broadcast signal transmission apparatus for the next generation broadcast service according to present embodiment, the above-described cell interleaver may be included in the time interleaver. In other words, the time interleaver according to the present embodiment may include the cell interleaver, a block interleaver, and/or a convolutional interleaver. Each block may be omitted or replaced by another block having a similar or the same function.

In the present embodiment, prior to block interleaving, the cell interleaver may interleave cells in an FEC block such that cells may be output in a different order for each FEC block. The block interleaver may block-interleave a TI block that includes at least one FEC block. The convolutional interleaver may spread block-interleaved TI blocks to a plurality of signal frames and interleave the blocks.

Here, cell interleaving may be referred to as inter-frame interleaving since a spreading property between frames may be maximized according to cell interleaving. According to a given embodiment, when the number of interleaving units is 1 ($N_{IU}=1$), cell interleaving may not be performed. Here, block interleaving may be referred to as intra-frame interleaving since a spreading property may be maximized in one frame according to block interleaving. According to a given embodiment, the block interleaver may perform a simple linear write operation when the number of interleaving units is 1 ($N_{IU}=1$), and perform a twisted write operation when $N_{IU}$ is greater than 1. Details will be described below.

The present invention proposes another example of the above-described cell interleaver. The cell interleaver according to the present embodiment may interleave cells in one FEC block. Time diversity performance of the time interleaver may be greatly enhanced by an operation of the cell interleaver. In other words, the cell interleaver may enhance time diversity in an environment of a burst channel by being linked with the time interleaver. In addition, the cell interleaver according to the present embodiment may operate to remove a memory used for a cell deinterleaver of a receiver and to reduce power for the receiver. A detailed operation of the cell interleaver according to the present embodiment will be described below.

Figure 46:
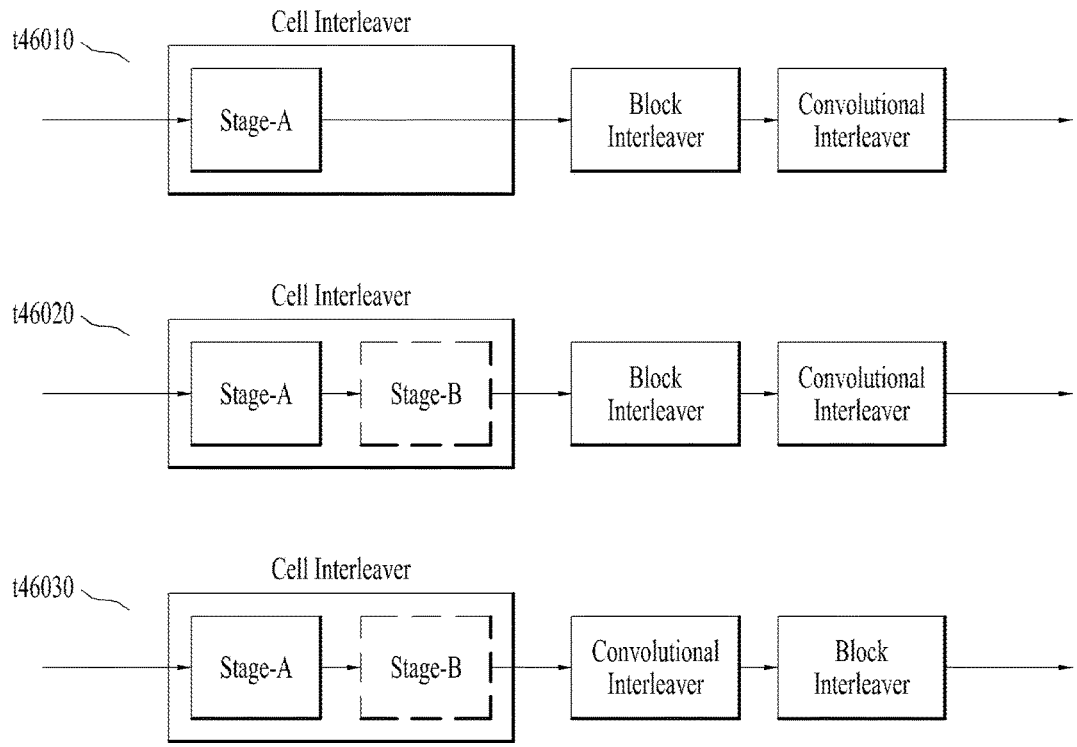
FIG. 46 illustrates possible structures of a time interleaver according to another embodiment of the present invention.

FIG. 46 illustrates possible structures of a time interleaver according to another embodiment of the present invention.

As described in the foregoing, the time interleaver according to the present embodiment may include a cell interleaver, a block interleaver, and/or a convolutional interleaver. According to a given embodiment, an internal structure of the time interleaver may be changed. Three possible internal structures of the time interleaver are illustrated. However, the present invention is not limited thereto, and the internal structure of the time interleaver may be changed within a technical spirit of the present invention.

In a first time interleaver structure (t46010), the time interleaver may include the cell interleaver, the block interleaver, and/or the convolutional interleaver in order. In this case, the cell interleaver may perform only an operation corresponding to stage A.

In a second time interleaver structure (t46020), the time interleaver may include the cell interleaver, the block interleaver, and/or the convolutional interleaver in order. In this case, the cell interleaver may perform operations corresponding to stages A and B. Although not illustrated, the time interleaver may include a cell interleaver that performs only an operation corresponding to stage B.

In a third time interleaver structure (t46030), the time interleaver may include the cell interleaver, the convolutional interleaver, and/or the block interleaver in order. In other words, in the present invention, positions of the block interleaver and the convolutional interleaver included in the time interleaver may be reversed. This may be applied to other embodiments of the time interleaver.

According to a given embodiment, the operation corresponding to stage B may be performed by the block interleaver. According to a given embodiment, particular interleaving may be further performed between the cell interleaver and the block interleaver.

Figure 47:
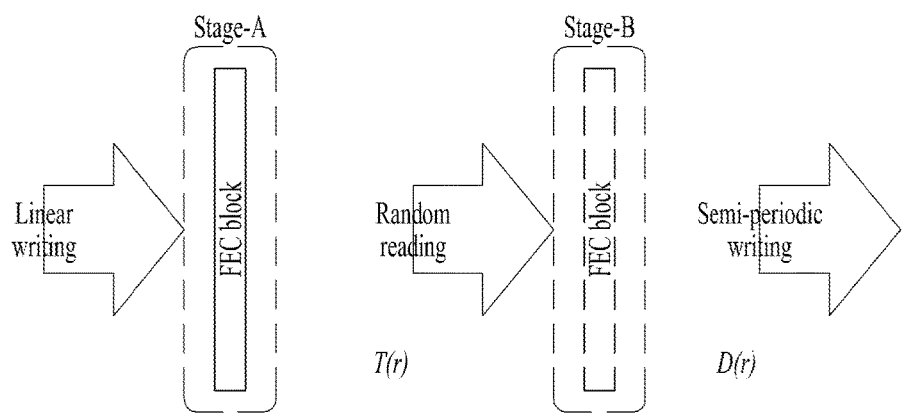
FIG. 47 illustrates an operation of a time interleaver according to another embodiment of the present invention.

FIG. 47 illustrates an operation of a time interleaver according to another embodiment of the present invention.

As described in the foregoing, the cell interleaver in the time interleaver may perform an operation corresponding to stage A and/or stage B.

A description will be given of the stage A operation of the cell interleaver.

The stage A operation of the cell interleaver may correspond to an operation in which the cell interleaver randomly interleaves cells in FEC blocks. Specifically, the cell interleaver may linearly write cells in one FEC block to a memory, and randomly read cells from the memory. Here, the memory may be referred to as a buffer.

First, the cell interleaver may perform an operation of linearly writing cells in an FEC block to the memory. Here, the linear write operation may refer to an operation in which the cell interleaver writes cells to the memory in order.

Thereafter, the cell interleaver may randomly read cells which are linearly written to the memory. This random read operation may be performed using an interleaving pattern. Here, the interleaving pattern may be referred to as an interleaving sequence, a permutation sequence, an interleaving seed, a permutation function, a memory address, a random sequence, etc.

The cell interleaver may change the permutation sequence which is used for the random read operation for each FEC block. When the permutation sequence is changed for each FEC block, a random characteristic of the cell interleaver may be enhanced. Alternatively, according to a given embodiment, the permutation sequence may be changed for each pair of FEC blocks. In this case, the same permutation sequence may be used for even-numbered FEC blocks and odd-numbered FEC blocks.

Here, permutation sequences for respective FEC blocks may be generated by shifting one basic permutation sequence. In this instance, the basic permutation sequence may be a pseudorandom sequence.

A description will be given of the stage B operation of the cell interleaver.

The stage B operation of the cell interleaver may correspond to an operation in which the cell interleaver interleaves interleaved FEC blocks according to a semi-periodic scheme. Specifically, the cell interleaver may write cells of an FEC block read from stage A to a memory using the semi-periodic scheme. Here, the memory may be referred to as a buffer. In this instance, an additional memory (buffer) may not be required for stage B.

In an operation of a block deinterleaver and/or a convolutional deinterleaver which are blocks at a receiving side corresponding to the block interleaver and/or convolutional interleaver, an additional memory is needed at the receiving side. However, a semi-periodic pattern according to the present invention may exclude the above-mentioned additional memory. The semi-periodic pattern may be generated by observing a pattern of FEC blocks output after the block deinterleaver and/or the convolutional deinterleaver.

FIG. 48 shows mathematical expressions of the operation corresponding to stage A in the operation of the cell interleaver according to another embodiment of the present invention.

G(r) of a first equation (t48010) shown in the figure may correspond to an input vector of the cell interleaver. G(r) may correspond to an input vector that indicates an rth FEC block. Respective components of G(r) may correspond to cells of the corresponding FEC block. The respective cells may have indices of 0 to $N_{cells-1}$. In other words, the number of cells in the FEC block may be expressed by $N_{cells}$.

T(r) of a second equation (t48020) shown in the figure may correspond to an output vector of the cell interleaver, that is, an interleaved vector. Respective components of T(r) may indicate interleaved cells of the rth FEC block. The interleaved cells may have indices of 0 to $N_{cells-1}$.

A third equation (t48030) shown in the figure may correspond to a mathematical expression of a linear write & random read operation of stage A. According to the linear write & random read operation, an order of cells of an input FEC block may be changed according to a value of a permutation sequence. According to the equation shown in the figure, $g_{r,Lr(q)}$ equals $t_{r,q}$. In other words, an order may be changed such that an $L_{r(q)}$th interleaved cell is identical to a qth cell which is to be interleaved. Here, q is an index of a cell in the FEC block, and thus may have a value in a range of 0 to $N_{cells-1}$.

$L_{r(q)}$ of a fourth equation (t48040) shown in the figure is a random value generated by the above-described random generator, and may correspond to the above-described permutation sequence. $L_{r(q)}$ may be a permutation sequence for the rth FEC block. The permutation sequences may be implemented using an arbitrary PRBS generator. The present invention may be widely applied irrespective of the PRBS generator.

$L_{r(q)}$ corresponding to the permutation sequence has an index r, and thus it can be understood that different permutation sequences are applied to respective FEC blocks. Here, $L_{r(0)}$ may correspond to the above-described basic permutation sequence, and P(r) may correspond to the above-described shift value. As in the above-described permutation sequence generation process, the permutation sequence $L_{r(q)}$ may be generated by adding the shift value to the basic permutation sequence, and calculating the added value modulo $N_{cells}$. In this way, different permutation sequences may be generated for the respective FEC blocks.

In the S-PLP mode corresponding to one PLP, the above-described shift value P(r) of the fourth equation may satisfy an equation P(r)=P(0), and have a fixed constant value. In the M-PLP mode corresponding to a plurality of PLPs, P(r) may vary with a value r. In other words, in the S-PLP mode, the permutation sequence may have a fixed value.

FIG. 49 shows mathematical expressions of the operation corresponding to stage B in the operation of the cell interleaver according to another embodiment of the present invention.

As described in the foregoing, T(r) of a first equation (t49010) shown in the figure may correspond to an interleaved vector according to the stage A operation. A second equation (t49020) shown in the figure may correspond to an interleaved output vector according to the stage B operation, and respective components thereof may correspond to interleaved cells. The cells are in the FEC block, and thus may have values of 0 to $N_{cells-1}$.

A third equation (t49030) shown in the figure may correspond to a mathematical expression of an interleaving operation of stage B. According to the equation, $d_{r,Q(q)}$ equals $t_{r,q}$. In other words, an order may be changed such that a Q(q)th interleaved cell is identical to a qth cell which is to be interleaved. Here, q is an index of a cell in the FEC block, and thus may have a value in a range of 0 to $N_{cells-1}$.

In stage B, a semi-periodic pattern Q for a write operation may be equally applied to all FEC blocks unlike stage A. The semi-periodic pattern Q does not use an additional memory (buffer).

Figures 50, 51:
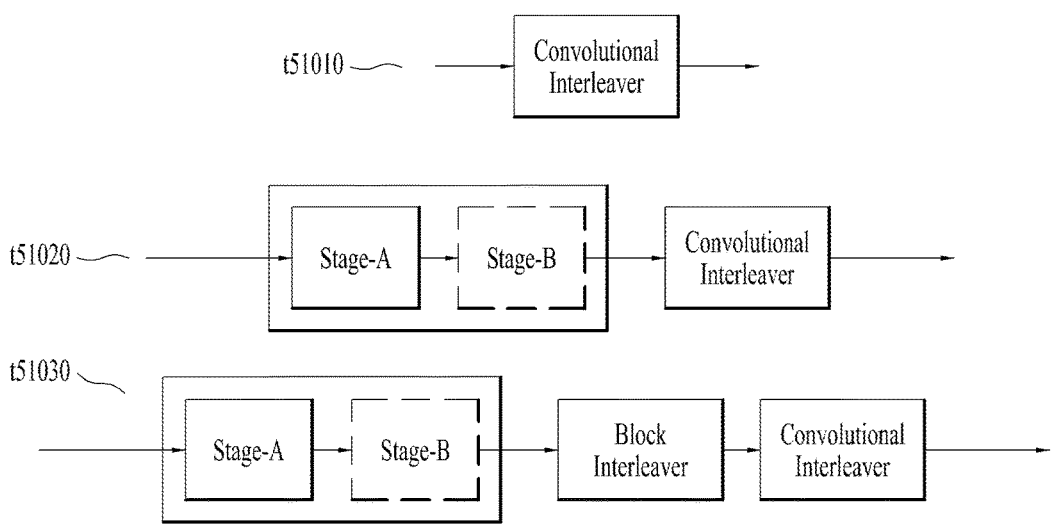
FIG. 50 shows a mathematical expression of a semi-periodic pattern generation operation of stage B in the operation of the cell interleaver according to another embodiment of the present invention.
FIG. 51 illustrates a case in which one PLP is used in the structure of the time interleaver according to another embodiment of the present invention.

FIG. 50 shows a mathematical expression of a semi-periodic pattern generation operation of stage B in the operation of the cell interleaver according to another embodiment of the present invention.

The above-described semi-periodic pattern used for stage B may be generated by an address generator. A mathematical expression of an operation of the address generator is as shown in the figure.

Referring to block deinterleaving and/or convolutional deinterleaving, a speed of reading cells from a memory needs to be double a speed of writing cells to the memory in order to avoid collision of addresses between an output cell and an output cell in a deinterleaving process for a single memory. In this process, an additional memory (buffer) may be required.

The semi-periodic pattern may be generated to remove the additional memory. This operation may be characterized in that interleaving is performed in advance by a transmitter that expects an output of a receiver which is twice or more as fast as a previous one.

In this figure, $N_{FEC\_TI\_max}$ may denote the maximum number of FECs in one TI block. $N_{IU}$ may denote the number of interleaving units (IUs). $L_{IU}$ may denote a length of an IU, and have a value of $L_{IU,min}$ or $L_{IU,min}+1$. Here, $L_{IU,min}$ may denote a minimum value of the length of the IU. $L_{IU,min}$ may be defined as a value obtained by applying a floor function to $N_{cells}/N_{IU}$. Here, $a=2N_{FEC\_TI\_max}$, $C_{r\_cnt}$ and/or $u_2$ may be reset for each FEC block.

The mathematical expression shown in the figure may be used to express an address generation operation of the address generator for a twisted write operation of the block interleaver to be described below.

FIG. 51 illustrates a case in which one PLP is used in the structure of the time interleaver according to another embodiment of the present invention.

The structure of the time interleaver described above may be applied to a case in which a plurality of PLPs is used, that is, M-PLP. When one PLP is used, that is, in S-PLP, the time interleaver may have a structure different from that of a case in which a plurality of PLPs is used. The number of PLPs may be identified through a PLP_NUM field value corresponding to a signaling field related thereto. A case in which PLP_NUM is 1 may correspond to a case in which the number of PLPs is 1.

The figure shows examples of an internal structure of the time interleaver which may be configured when the number of PLPs is 1 (t51010, t51020, and t51030). According to a given embodiment, the time interleaver may have another form of internal structure when the number of PLPs is 1.

In a first example (t51010), the time interleaver may perform only convolution interleaving for one PLP. In other words, the time interleaver may include only an arbitrary convolutional interleaver.

In a second example (t51020), the time interleaver may perform cell interleaving and/or convolutional interleaving for one PLP. In other words, the time interleaver may include the cell interleaver and/or the convolutional interleaver. Here, the cell interleaver may perform only an operation corresponding to stage A or an operation corresponding to stage B or stages A and B.

In a third example (t51030), the time interleaver may perform cell interleaving, block interleaving, and/or convolutional interleaving for one PLP. In other words, the time interleaver may include the cell interleaver, the block interleaver, and/or the convolutional interleaver. Similarly, the cell interleaver may perform only an operation corresponding to stage A or an operation corresponding to stage B or stages A and B.

Figures 52, 53:
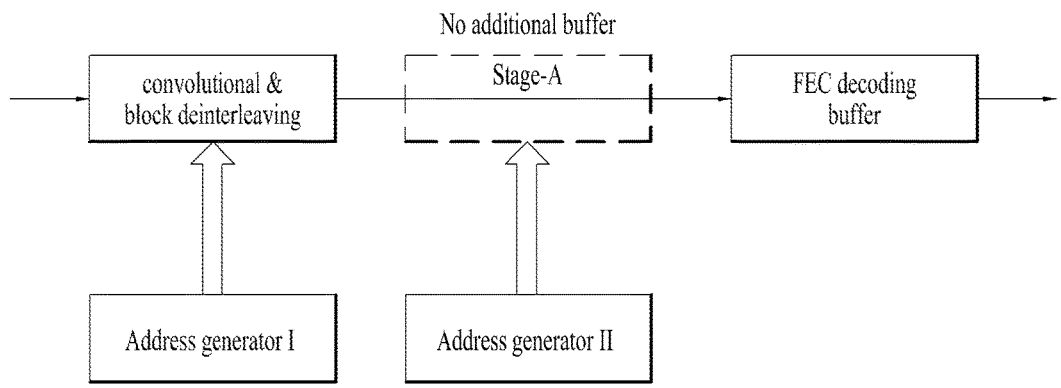
FIG. 52 illustrates an FEC decoding memory and an internal structure of a time deinterleaver according to another embodiment of the present invention.
FIG. 53 illustrates a mathematical expression of an operation according to stage B of the cell deinterleaver according to another embodiment of the present invention.

FIG. 52 illustrates an FEC decoding memory and an internal structure of a time deinterleaver according to another embodiment of the present invention.

The present invention proposes a cell deinterleaver which corresponds to the above-described cell interleaver according to the other embodiment of the present invention. The cell deinterleaver according to the present embodiment may be a module of the receiver corresponding to the above-described cell interleaver.

The time deinterleaver at the receiving side may include a convolutional deinterleaver, a block deinterleaver, and/or a cell deinterleaver in order which correspond to the above-described time interleaver at the transmitting side. Here, the cell deinterleaver may perform an operation corresponding to stage A. According to a given embodiment, the cell deinterleaver may perform operations corresponding to stage B and stage A in order. In other words, the operation corresponding to stage B may be omitted.

According to a given embodiment, the operation corresponding to stage B may be performed by the block deinterleaver. According to another given embodiment, the block deinterleaver may perform a reverse operation of a twisted write operation to be described below. According to an embodiment of the above-described time interleaver at the transmitting side, positions of the convolutional deinterleaver and the block deinterleaver in the time deinterleaver may be reversed.

The cell deinterleaver according to the present embodiment may perform an operation of restoring positions of cells in one FEC block. This operation may be performed by the same algorithm as that used for cell interleaving in the transmitter.

The cell deinterleaver according to the present embodiment may perform a reverse operation of the above-described cell interleaver. When operations of stage A and stage B are performed by the cell interleaver of the transmitter, the cell deinterleaver may perform reverse operations of stage B and stage A in order.

When the operation of stage B is performed in the cell interleaver of the transmitter, the cell deinterleaver of the receiver may perform a reverse operation of stage B. Cell interleaving according to stage B may be omitted. Thus, in this case, cell deinterleaving according to stage B may be omitted.

In the deinterleaving operation according to stage B, an additional memory may not be used, and a memory which is used for convolutional deinterleaving and block deinterleaving may be used. In other words, the deinterleaving operation according to stage B may be applied to an operation of reading one FEC block from the memory of convolutional deinterleaving and block deinterleaving. In this way, the additional memory may not be used. Here, convolutional deinterleaving and block deinterleaving may be performed using a read clock which is basically double a previous one for single-memory deinterleaving. An address value necessary for this process may be obtained from address generator I illustrated in the figure. Address generator I may generate an address for convolutional deinterleaving and block deinterleaving.

The cell deinterleaver may perform deinterleaving according to stage A. Deinterleaving according to stage A may be performed without a separate additional memory. The cell deinterleaver may randomly deliver a deinterleaved FEC block, which is obtained by successively deinterleaving cells in stage A, to an FEC decoding memory (buffer). An address value necessary for this process may be obtained from address generator II illustrated in the figure. This deinterleaving corresponds to a reverse operation of interleaving according to stage A of the transmitter, and the cell deinterleaver may perform a random write & linear read operation. Output FEC blocks are directly delivered to the FEC decoding memory, and thus an additional memory may not be used.

Consequently, unlike the transmitter, the cell deinterleaver may not use a cell deinterleaving memory. The receiving side may not further include an additional memory for cell deinterleaving, and thus it is possible to reduce the number of memories and minimize power used for cell deinterleaving.

FIG. 53 illustrates a mathematical expression of an operation according to stage B of the cell deinterleaver according to another embodiment of the present invention.

As described in the foregoing, the cell deinterleaver of the receiver may perform the operation according to stage B. This operation may correspond to a reverse operation of the operation according to stage B of the cell interleaver of the transmitter. In the stage B operation of the cell deinterleaver, the cell deinterleaver may count the number of cells to be read in convolutional & block deinterleaving. A mathematical expression for this operation is as illustrated in the figure. However, a detailed operation may be expressed by an equation using another scheme.

In this figure, $N_{FEC\_TI\_max}$ may denote the maximum number of FECs in one TI block. In addition, w may denote the number of iterations, and be determined by $L_{IU}(0)$ and the value a described above. $C_{p(k)}$ may denote the number of cells read from kth IU in pth iteration. Here, a may equal $2N_{FEC\_TI\_max}$.

Figure 54:
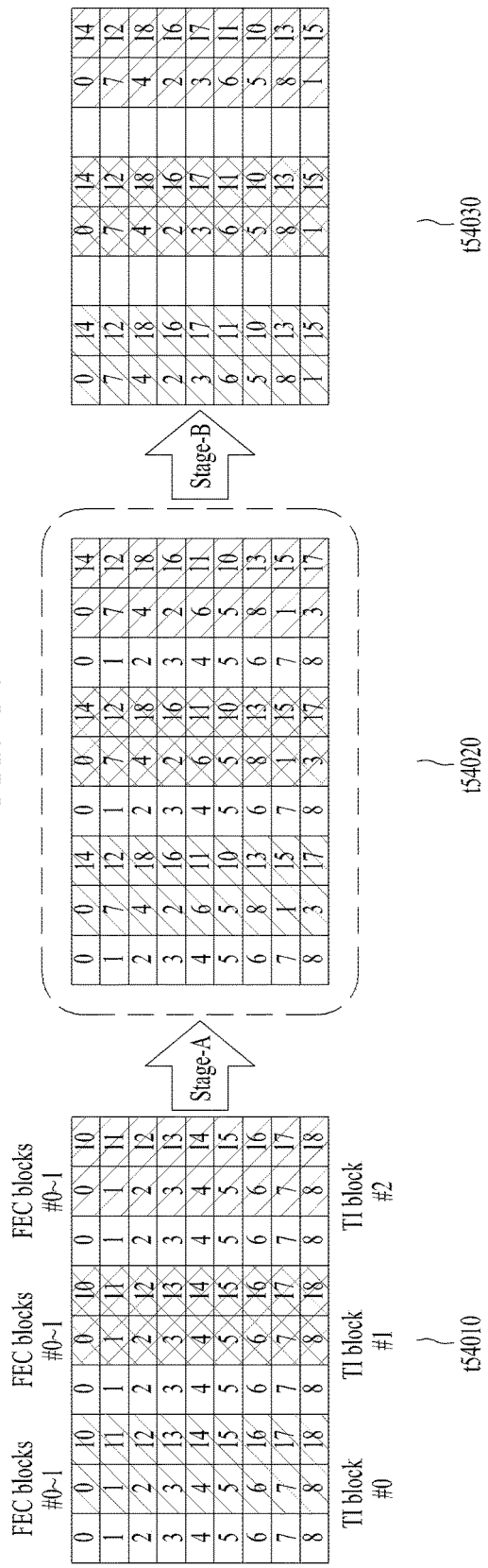
FIG. 54 illustrates an example of an operation of the cell interleaver according to another embodiment of the present invention.

FIG. 54 illustrates an example of an operation of the cell interleaver according to another embodiment of the present invention.

In this example, it may be presumed that $N_{TI\_block}=3$, $N_{FEC\_TI\_max}=2$, $N_{cells}=9$, and $N_{IU}=2$. $L_{IU,min}$ has a value of 4 according to the above-described definition, and an equation $\{L_{IU}(0), L_{IU}(1)\}=\{5, 4\}$ may be satisfied. The value a may correspond to 4 according to the above-described definition.

A permutation sequence used in stage A will be arbitrarily defined for brevity. The permutation sequence for stage A may be arbitrarily defined as $L_0=\{0, 7, 4, 2, 6, 5, 8, 1, 3\}$, $L_1=\text{mod}(L_0+4, 9)=\{4, 2, 8, 6, 1, 0, 3, 5, 7\}$. A permutation sequence used in stage B may be defined as $Q=\{0, 1, 2, 3, 5, 6, 7, 8, 4\}$.

In the operation of the cell interleaver illustrated in the figure, three TI blocks (#0, #1, and #2), each of which has two FEC blocks, are to be subjected to stage A in t54010. Then, t54020 is obtained after the three TI blocks are subjected to stage A, and t54030 is obtained after the three TI blocks are subjected to stage B.

Cells of the TI blocks corresponding to t54010, in which stage A is to be performed, are interleaved by a permutation sequence value after stage A is performed (t54020), and an order thereof is changed. Here, after stage A is performed, position values of the cells are provisional outputs, and a memory (buffer) may not be used in actual implementation. Instead, the respective cells may be delivered to a memory on a cell-by-cell basis through stage B. Similarly, in stage B, an order of cells may be changed according to Q.

According to a given embodiment, performance of stage A may correspond to performance of cell interleaving that performs only the operation of stage A. In addition, performance of stage B may correspond to a twisted write operation to be described below. In this case, cell interleaving may be to be performed in t54010. In addition, t54020 may be obtained after cell interleaving, and t54030 may be obtained after the twisted write operation is performed.

Figure 55:
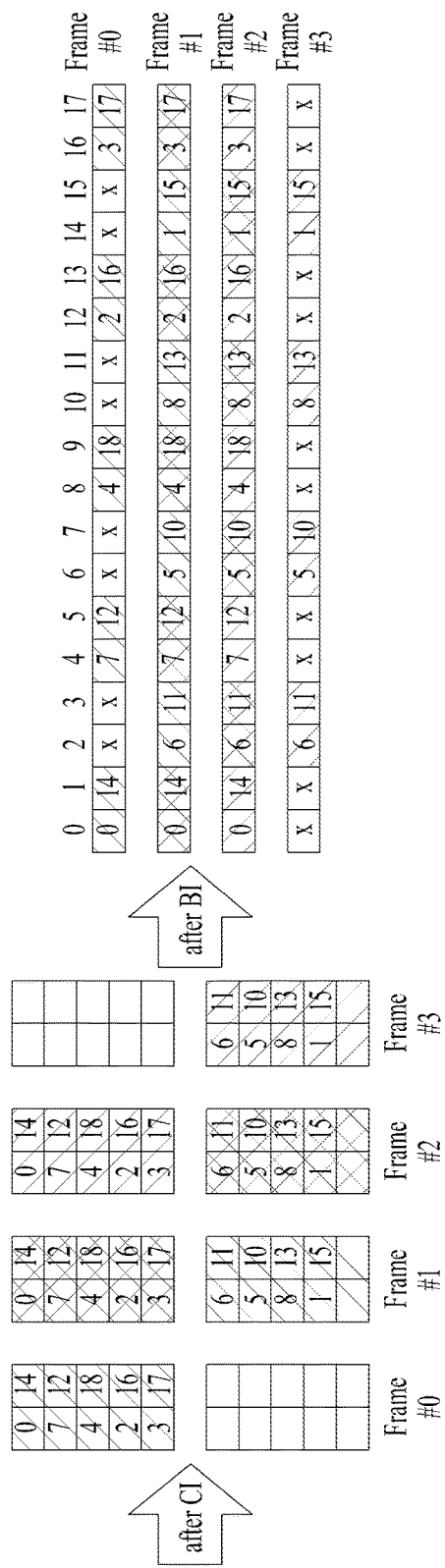
FIG. 55 illustrates an example of convolutional interleaving and block interleaving operations of the time interleaver according to another embodiment of the present invention.

FIG. 55 illustrates an example of convolutional interleaving and block interleaving operations of the time interleaver according to another embodiment of the present invention.

After cell interleaving of stage A and/or stage B according to the above-described process, block interleaving or convolutional interleaving may be performed as described above. According to a given embodiment, convolutional interleaving may be performed prior to block interleaving as described above.

When convolutional interleaving is performed prior to block interleaving, cells of FEC blocks may have an order illustrated in the figure. After convolutional interleaving is performed, interleaved cells may be divided into parts and disposed in a plurality of frames. In this way, cells in a plurality of FEC blocks may be spread into a plurality of frames. Thereafter, block interleaving may be performed such that cells in respective frames form blocks and an order thereof is changed.

Here, block interleaving and convolutional interleaving illustrated in the figure are merely examples. A detailed operation corresponding to a case in which convolutional interleaving is performed after block interleaving may be different from that illustrated in the figure.

Figure 56:
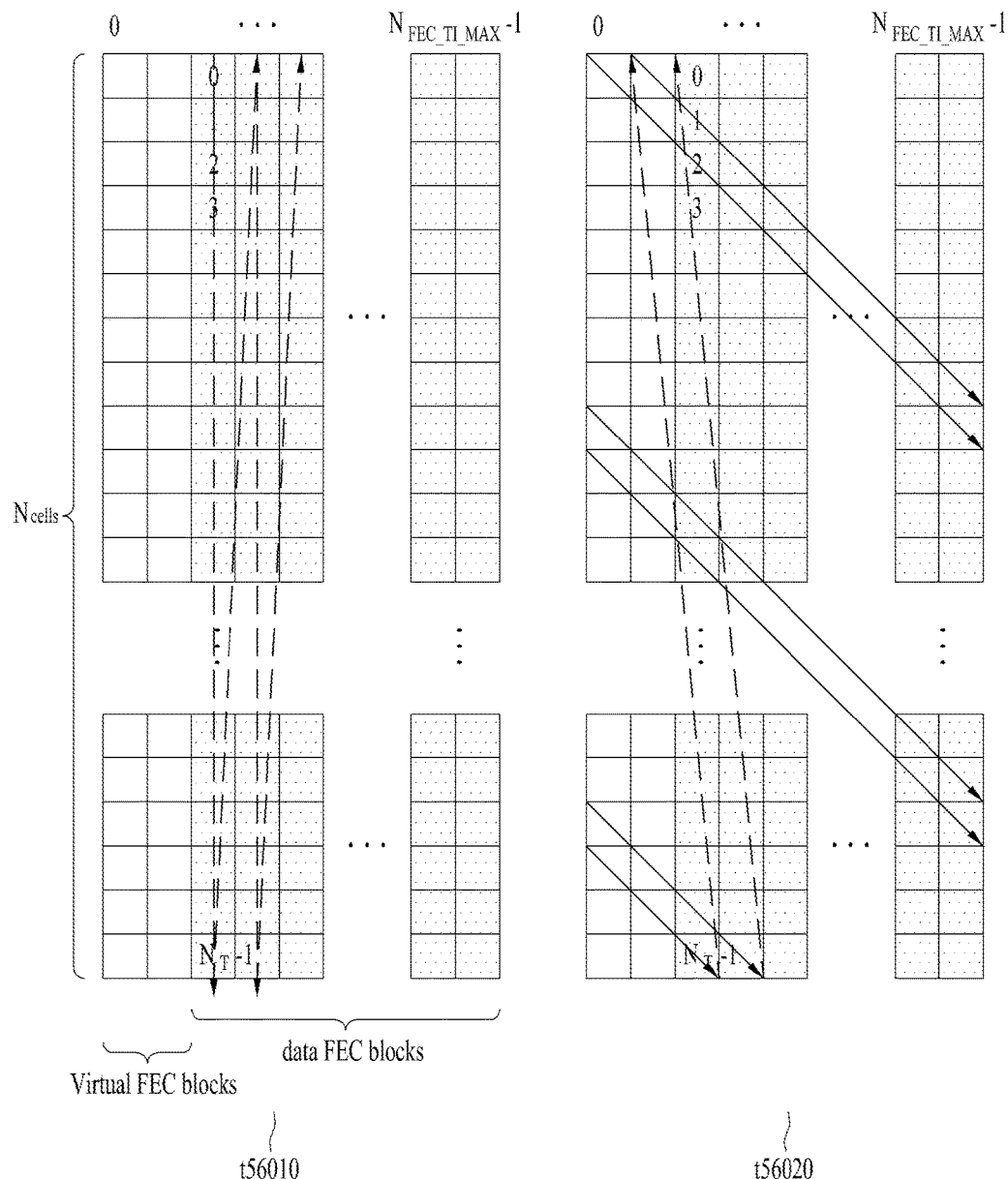
FIG. 56 illustrates another example of the block interleaving operation of the time interleaver according to another embodiment of the present invention.

FIG. 56 illustrates another example of the block interleaving operation of the time interleaver according to another embodiment of the present invention.

Unlike the above description, this figure illustrates an example corresponding to a case in which convolutional interleaving is performed after block interleaving. In this case, the block interleaver may block-interleave TI blocks including at least one FEC block. In addition, the convolutional interleaver may spread the block-interleaved TI blocks into a plurality of signal frames, and interleave the blocks.

The block interleaver may perform interleaving by linearly writing cells or cell pairs in the FEC block in the column direction (t56010), and reading cells or cell pairs in a diagonal direction (t56020). Here, a reading/writing unit serving as a reference unit may be referred to as a memory unit (MU). As described above, the MU may correspond to one cell or two cells (pair). The number of cells in the MU may vary with a constellation used in a constellation mapper. According to a given embodiment, a pair of two contiguous cells may form the MU and be written and read when QPSK is used, and one cell may form the MU and be written and read when another constellation is used.

In a write operation, a left portion of a memory may be filled with virtual FEC blocks and a right portion thereof may be filled with FEC blocks including actual data. According to a given embodiment, the right portion on the memory may be filled with the virtual FEC blocks, and the left portion thereof may be filled with the FEC blocks including actual data. In a read operation, the block interleaver may read MUs in a diagonal direction. The read operation may be performed in a diagonal direction toward the bottom right, and started from a first row and a first column on the left side. Cells or cell pairs (that is, MUs) of the virtual FEC blocks may be skipped without being read in the read operation.

Figure 57:
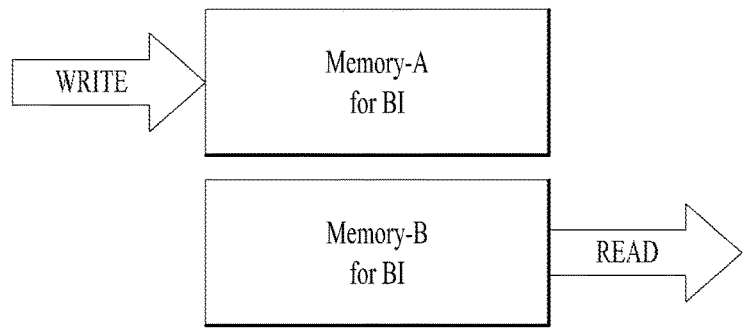
FIG. 57 illustrates a block interleaving operation of the time interleaver according to another embodiment of the present invention.

FIG. 57 illustrates a block interleaving operation of the time interleaver according to another embodiment of the present invention.

When block interleaving is performed, MUs may be written/read according to the above-described operation. In this instance, the block interleaver may write a TI block to memory A. The TI block may include at least one FEC block. A TI block previously written to memory A may be read according to the above-described read operation simultaneously with a subsequent TI block being written to memory B by the block interleaver according to the above-described write operation.

When block interleaving is performed prior to convolutional interleaving, a read TI block may be delivered to the convolutional interleaver. Block interleaving may be performed according to this first in first out (FIFO) scheme.

Figure 58:
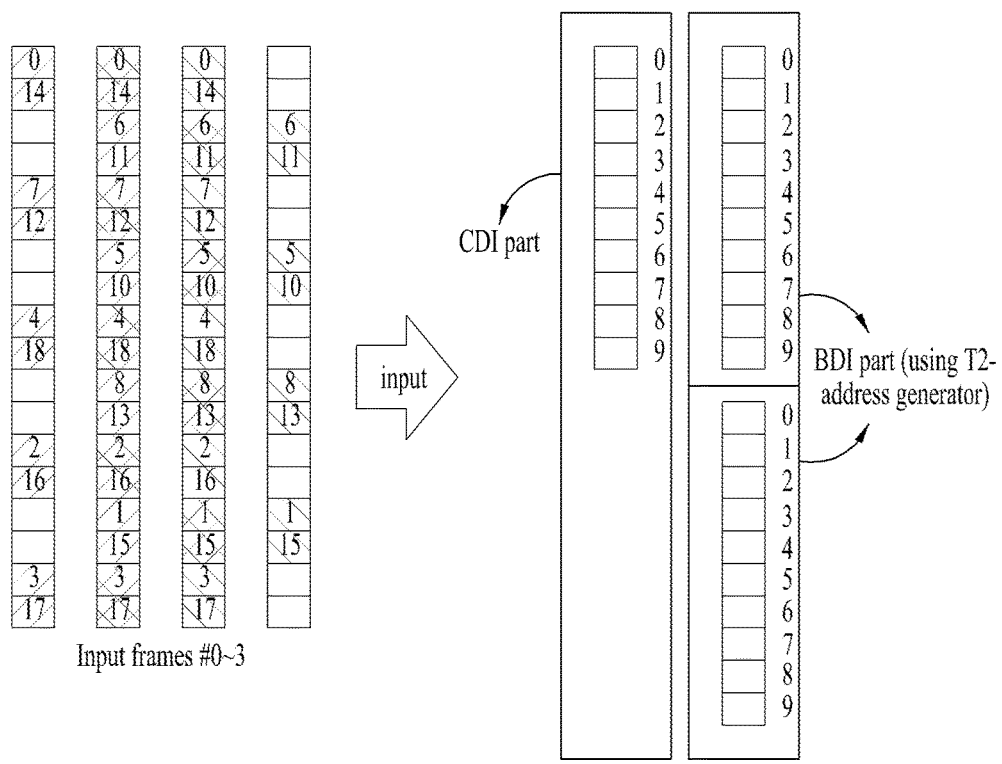
FIG. 58 illustrates an example of block deinterleaving and convolutional deinterleaving operations of the time deinterleaver according to another embodiment of the present invention.

FIG. 58 illustrates an example of block deinterleaving and convolutional deinterleaving operations of the time deinterleaver according to another embodiment of the present invention.

Frames on the left have a cell configuration corresponding to a case in which block interleaving is performed after the above-described convolutional interleaving of the transmitting side. The frames having this cell configuration may be input to the block deinterleaver and the convolutional deinterleaver of the time deinterleaver.

When convolutional deinterleaving is performed after block deinterleaving, a memory may include a plurality of subblocks. A size of each subblock may be defined as $L_{BI} = \max_k L_{IU}(k) N_{FEC\_TI\_max}$. In the present embodiment, the size of each subblock may be set to 10. In addition, the number of subblocks of the memory is $N_{BI} = N_{IU}(N_{IU}+1)/2 = 3$, and a total of three subblocks may be included.

Each subblock may be used for deinterleaving according to an address which is generated by an address generator. Here, as described in the foregoing, a clock rate of the read operation may be double a clock rate of the write operation.

According to a given embodiment, each subblock may use a T2-address generator or a linear address generator. A first subblock may be used for convolutional deinterleaving, and subsequent second and third subblocks may be used for block deinterleaving.

Figure 59:
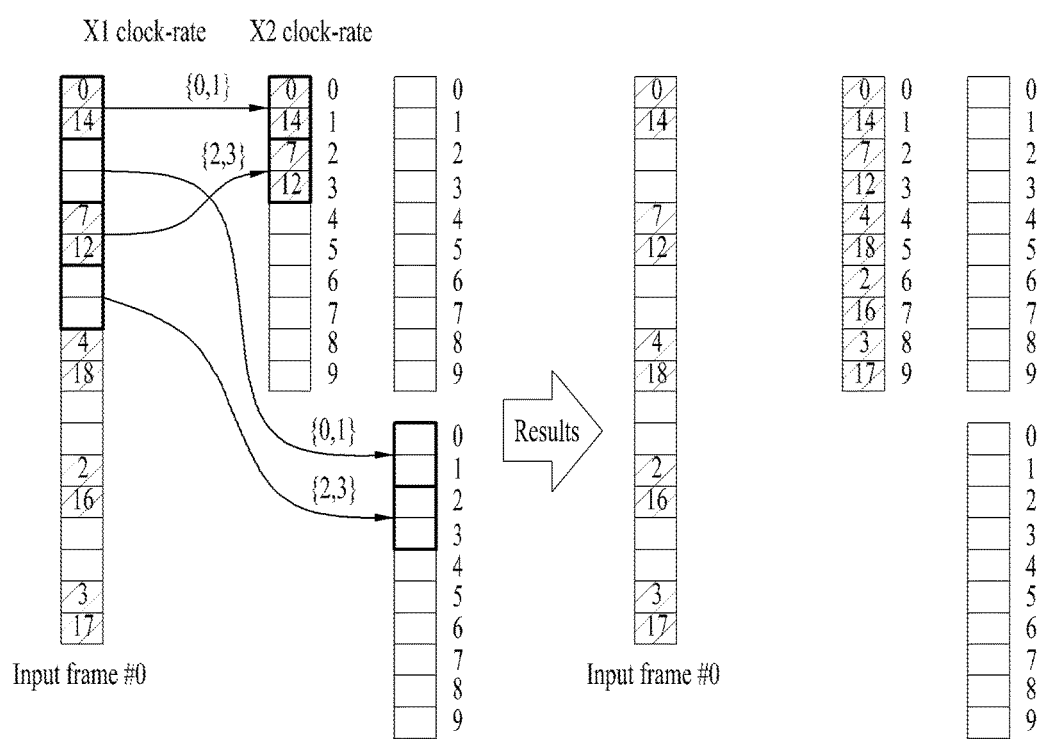
FIG. 59 illustrates an example of block deinterleaving and convolutional deinterleaving operations of the time deinterleaver according to another embodiment of the present invention.

FIG. 59 illustrates an example of block deinterleaving and convolutional deinterleaving operations of the time deinterleaver according to another embodiment of the present invention.

A description will be given of the block deinterleaving and convolutional deinterleaving operations performed when a 0th input frame is input. Here, an address value for a write operation may be obtained from an address generator. In the present embodiment, an address value for a read operation may correspond to {0, 1, 2, 3, 4, 5, 6, 7, 8, 9}.

The read operation may be performed according to X1 clock rate. Cells of data of input frame #0 may be written to {0, 1}th and {2, 3}th sub-memory blocks. Here, a plurality of cells rather than one cell may be written as a unit. In the present embodiment, a pair of two cells may be written as a unit. Respective cell pairs may be written to different sub-memory blocks. These operations are performed such that the respective cells restore an order which is formed before interleaving is performed at the transmitting end. As a result of the read operation, eight contiguous input cells may be rearranged as illustrated on the right side. According to this scheme, 0th, 14th, 7th cells, . . . may be positioned in order in a first sub-memory.

Figure 60:
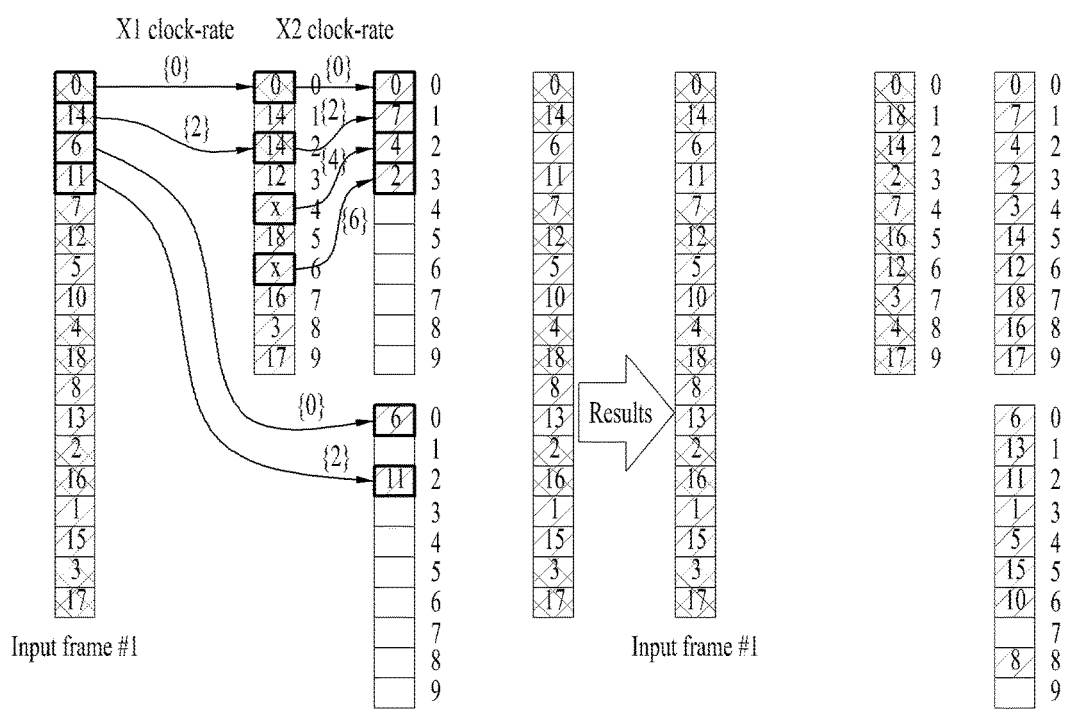
FIG. 60 illustrates an example of block deinterleaving and convolutional deinterleaving operations of the time deinterleaver according to another embodiment of the present invention.

FIG. 60 illustrates an example of block deinterleaving and convolutional deinterleaving operations of the time deinterleaver according to another embodiment of the present invention.

A description will be given of the block deinterleaving and convolutional deinterleaving operations performed when a first input frame is input. Here, an address value for a write operation may be obtained from an address generator. An overall operation is similar to a case in which the 0th input frame is input. In the present embodiment, an address value for a read operation may correspond to {0, 2, 4, 6, 8, 1, 3, 5, 7, 9}.

Cells of a 0th input frame, which is written to a first sub-memory block by a previous operation, may be written to a second sub-memory block simultaneously with 0 and 14 of the first input frame being written to the first sub-memory block. In this instance, a written period corresponds to 2, and every second cells may be read and written to the sub-memory block again. In addition, 6 and 11 of the first input frame may be written to a third sub-memory block. According to this scheme, four contiguous input cells may be rearranged as on the right side.

In particular, in this operation, it can be understood that the read operation needs to be twice as fast as the write operation. In this instance, the number of cells read from a sub-block in each iteration may be determined by the stage B operation of the cell interleaver of the transmitting side, and counted through an operation of the cell deinterleaver of the receiving side.

Figure 61:
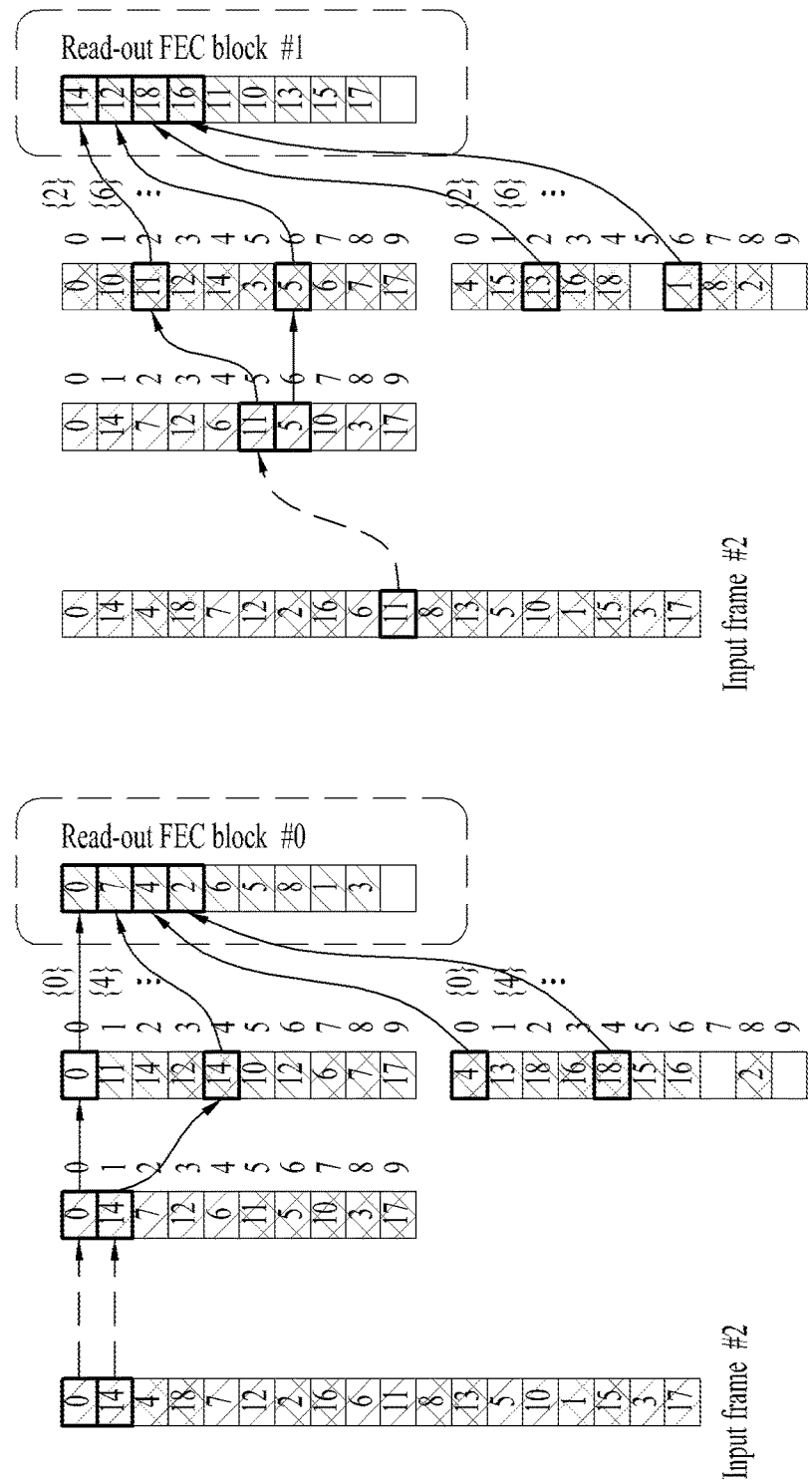
FIG. 61 illustrates an example of block deinterleaving and convolutional deinterleaving operations of the time deinterleaver according to another embodiment of the present invention.

FIG. 61 illustrates an example of block deinterleaving and convolutional deinterleaving operations of the time deinterleaver according to another embodiment of the present invention.

A description will be given of the block deinterleaving and convolutional deinterleaving operations performed when a second input frame is input. Here, an address value for a write operation may be obtained from an address generator. An overall operation is similar to a case in which the 0th input frame is input. In the present embodiment, an address value for a read operation may correspond to {0, 4, 8, 3, 7, 2, 6, 1, 5, 9}, an address value useful for reading a 0th FEC block may correspond to {0, 4, 8, 3, 7}, and an address value useful for reading a first FEC block may correspond to {2, 6, 1, 8, 9}.

Similarly, the number of cells read from a sub-block in each iteration may be determined by the stage B operation of the cell interleaver of the transmitting side, and counted through an operation of the cell deinterleaver of the receiving side. According to a given embodiment, the number of cells read from the sub-block may be determined by a twisted write operation of the transmitting side.

A TI memory on the left side may be obtained after the 0th FEC block is read, and a TI memory on the right side may be obtained after the first FEC block is output. Referring to cells of the read FEC block, a finally output value is a virtual value, and thus it can be understood that the final number of cells of the #0 FEC block is 9 in total. In addition, it can be understood that an order of output cells is the same as an output order of stage A at the transmitter or an output order after cell interleaving. Therefore, as a result, it can be understood that cell deinterleaving may be performed without an additional memory at the receiver. In other words, as described in the foregoing, while the memory is used in the transmitter for the stage B operation, the memory may not be used in the receiver.

Figure 62:
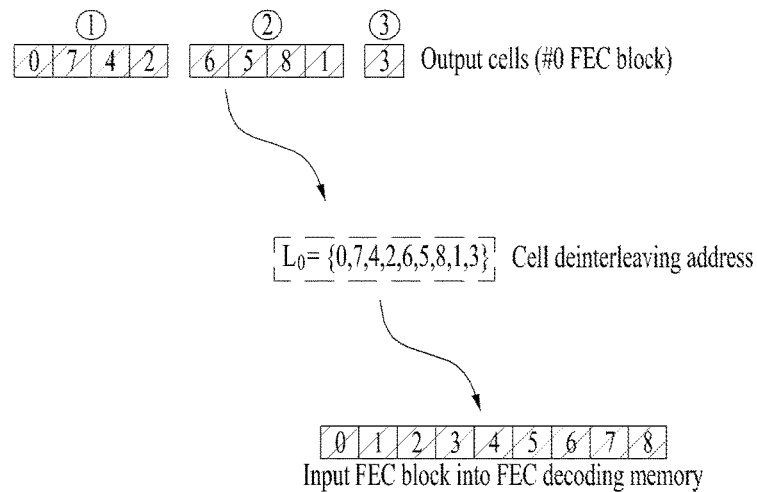
FIG. 62 illustrates an example of a cell deinterleaving operation of the time deinterleaver according to another embodiment of the present invention.

FIG. 62 illustrates an example of a cell deinterleaving operation of the time deinterleaver according to another embodiment of the present invention.

According to the above-described embodiment, the 0th output FEC block may be delivered to the FEC decoding memory (buffer). In this process, respective output cells of the 0th FEC block may be successively cell-deinterleaved, and delivered to the FEC decoding memory. In this process, as described in the foregoing, an additional memory for cell deinterleaving is not required since the FEC decoding memory may be used instead.

As described in the above embodiment, the 0th output FEC block may have nine cells since the last one cell is a virtual cell. The read cells of the 0th FEC block may be written to the FEC decoding memory using an address value $L_0$. In the present embodiment, $L_0$ may correspond to $\{0, 7, 4, 2, 6, 5, 8, 1, 3\}$. Here, PRBS used for cell deinterleaving is in synchronization with the output cells of the FEC block, and thus cell deinterleaving may be performed without an additional memory.

Figure 63:
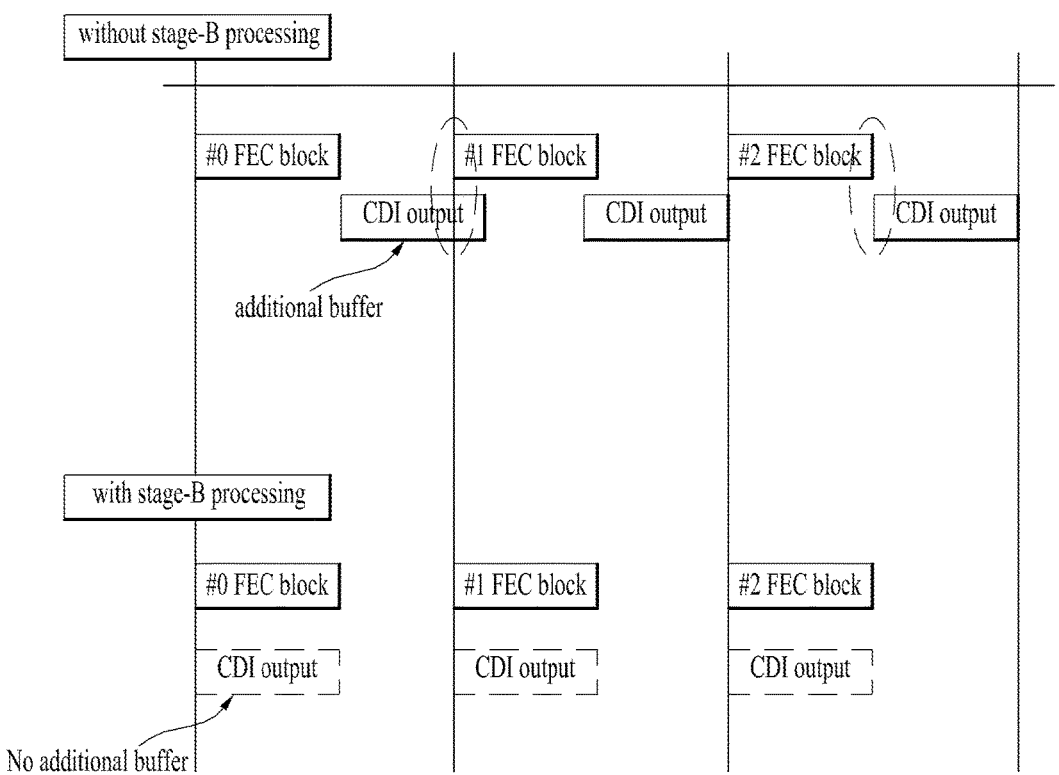
FIG. 63 illustrates a diagram according to the stage B operation of the time deinterleaver according to another embodiment of the present invention.

FIG. 63 illustrates a diagram according to the stage B operation of the time deinterleaver according to another embodiment of the present invention.

When the stage B operation is not performed, and a 0th FEC block is output as illustrated in the figure, an additional memory may be required for cell deinterleaving. In other words, a buffer is further needed to cell-deinterleave the output FEC block. Thereafter, the same description is applied to first and second FEC blocks.

When the stage B operation is performed, a 0th FEC block may be output and cell deinterleaving may be performed at the same time as illustrated in the figure. Here, as described in the foregoing, the FEC decoding memory is used, and thus an additional memory need not be used. Here, a clock rate for a read operation may be twice a clock rate for a write operation.

The stage B operation is typically advantageous in that an additional memory may not be used at a receiving side. In this way, it is possible to remove an overlapping point (jitter) between the cell deinterleaver and the block & convolutional deinterleaver. In addition, a whole time deinterleaving operation and detailed operations thereof corresponding to block & convolutional deinterleaving and cell deinterleaving may be simplified. As a result, overhead may be reduced at the receiving side.

Figure 64:
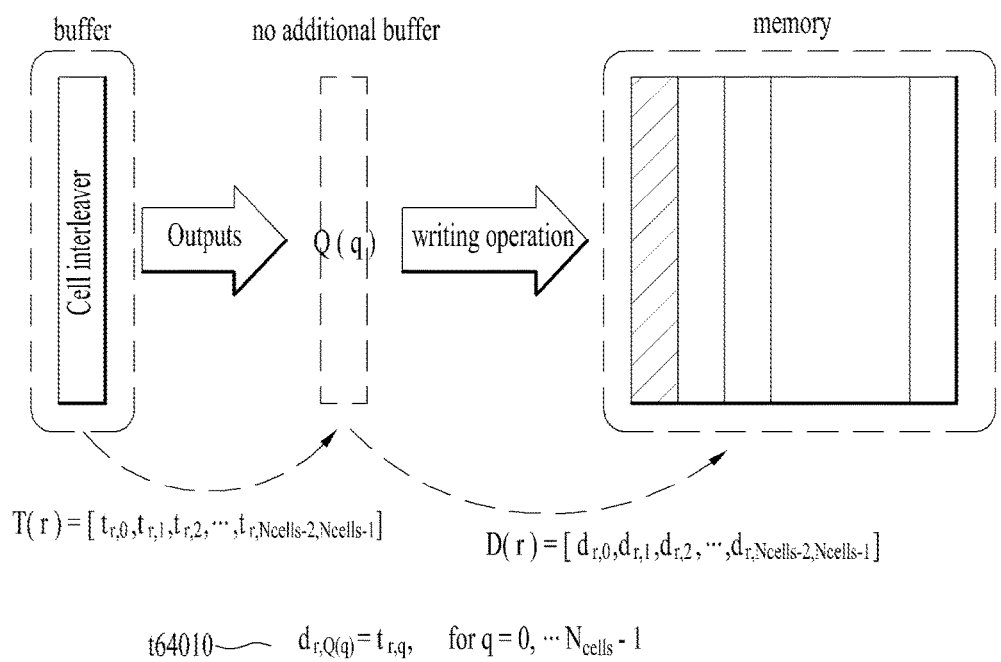
FIG. 64 illustrates an operation of the block interleaver in the time interleaver according to another embodiment of the present invention.

FIG. 64 illustrates an operation of the block interleaver in the time interleaver according to another embodiment of the present invention.

As described in the foregoing, the block interleaver may perform interleaving by writing cells to a memory and reading cells according to column-wise writing and diagonal-wise reading.

According to a given embodiment, the block interleaver may perform block interleaving by performing a twisted write operation rather than the above-described operation.

In an example of the twisted write operation, the block interleaver may store an FEC block output from the cell interleaver in a memory according to the twisted write operation. Here, an additional memory may not be required at the transmitting side for the twisted write operation. The twisted write operation at the transmitting side may be used such that an additional memory is not required when the cell deinterleaver operates in the receiver. A twisted write pattern can be recognized by observing a pattern of FEC blocks output after an operation of the convolutional deinterleaver. In addition, twisted block interleaving may further enhance spreading property.

Here, T(r) is an rth FEC block, and may correspond to an input FEC block. Respective elements may correspond to cells in the FEC block. D(r) is an FEC block obtained by interleaving T(r), and may correspond to an output FEC block. Respective elements may correspond to cells in the FEC block after interleaving.

In an equation (t64010) shown in the figure, interleaving may be performed such that a qth input cell $t_{r,q}$ in an rth FEC block is equal to a Q(q)th cell in the output FEC block ($d_{r,Q(q)}$). Here, q is an index for interleaving, and may have a value in a range of 0 to $N_{cells}-1$. Here, Q(q) is an address value for the twisted write operation, and may be generated by an address generator. Q(q) may be equally applied to all FEC blocks. In the twisted write operation, an additional buffer may not be required.

FIG. 65 illustrates an operation of the block interleaver in the time interleaver varying with the number of IUs according to another embodiment of the present invention.

As described in the foregoing, when a value of $N_{IU}$ is 1 according to a given embodiment, twisted block interleaving may not be performed. Here, when block interleaving is performed according to a linear write/diagonal read operation rather than a twisted write operation, a value of $N_{IU}$ may not affect the operation of the block interleaver.

When a value of $N_{IU}$ is 1 (t65010), the twisted write operation may not be used. In this case, a simple linear write operation may be performed. In the present embodiment, it can be presumed that $N_{FEC\_TI\_max}=2$, $N_{cells}=9$, and $N_{IU}=1$. $L_{IU,min}$ may have a value of 4 according to the above-described definition, and $L_{IU}(0)$ may equal 9. A value of a may correspond to 4 according to the above-described definition. A sequence for interleaving may be generated by an address generator. Here, the simple linear write operation is performed, and thus Q may have an address value of $\{0, 1, 2, 3, 4, 5, 6, 7, 8\}$.

When a value of $N_{IU}$ is greater than or equal to 2 (t65020), the twisted write operation may be used. In this case, the above-described twisted write operation may be performed. In the present embodiment, it can be presumed that $N_{FEC\_TI\_max}=2$, $N_{cells}=9$, and $N_{IU}=2$. $L_{IU,min}$ may have a value of 4 according to the above-described definition, and $\{L_{IU}(0), L_{IU}(1)\}$ may equal $\{5, 4\}$. A value of a may correspond to 2 according to the above-described definition. In this case, a sequence for interleaving may be generated by the address generator. Here, the twisted write operation needs to be performed, and thus Q may have an address value of $\{0, 1, 5, 6, 2, 3, 7, 8, 4\}$. It can be understood that an order of cells in FEC blocks written to a memory is changed.

Figure 66:
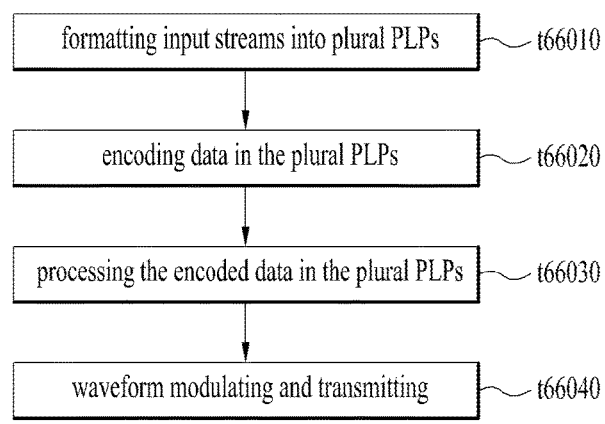
FIG. 66 illustrates a method of transmitting a broadcast signal according to an embodiment of the present invention.

FIG. 66 illustrates a method of transmitting a broadcast signal according to an embodiment of the present invention.

The method of transmitting the broadcast signal according to the present embodiment may include formatting an input stream into a plurality of PLPs, encoding data of the plurality of PLPs, processing encoded data of the plurality of PLPs, and/or modulating and transmitting a waveform.

In the present embodiment, first, an input formatting block may format an input stream into a plurality of PLPs (t66010). Here, the input formatting block may correspond to the above-described input formatting module. As described above, the input stream may correspond to a stream such as a TS, a GS, an IP, etc. The PLPs may correspond to the above-described DPs.

Thereafter, data in the respective plurality of PLPs may be encoded by an encoder (t66020). Here, encoding may correspond to a concept including a series of above-described operations such as FEC encoding, bit interleaving, etc. Processes included in encoding may be changed according to a given embodiment. According to a given embodiment, the encoder may include an FEC encoder, a bit interleaver, and a constellation mapper. According to a given embodiment, the encoder may be referred to as a BICM encoder.

The encoded data in the plurality of PLPs may be processed by a framing & interleaving block (t66030). Here, the framing & interleaving block is as described above. According to the present processing, at least one signal frame may be output.

Data of the at least one signal frame may be modulated by waveform modulation (t66040). Waveform modulation may be performed by a waveform generation block, which may be referred to as an OFDM module, a waveform module, etc. according to a given embodiment. A broadcast signal including waveform-modulated data may be transmitted by an operation of the waveform generation block. The waveform generation block may include at least one antenna according to a given embodiment.

In a method of transmitting a broadcast signal according to another embodiment of the present invention, processing the encoded data by the above-described framing & interleaving block may include time-interleaving the data in the plurality of PLPs by the time interleaver, frame-mapping the time-interleaved data to at least one signal frame by the framer, and/or frequency-interleaving data of the signal frame by the frequency interleaver.

The time interleaver, the framer, and/or the frequency interleaver may be included in the above-described framing & interleaving block. According to a given embodiment, the time interleaver may be included in the BICM encoder, or located outside the BICM encoder to time-interleave an output of the BICM encoder. Here, the framer may correspond to the above-described frame builder or a cell mapper therein. The framer may map PLP data obtained by variously processing at least one signal frame.

In a method of transmitting a broadcast signal according to another embodiment of the present invention, the time-interleaving by the time interleaver may include cell-interleaving the data in the PLPs by the cell interleaver, block-interleaving the data in the PLPs by the block interleaver, and/or convolutional interleaving the data in the PLPs by the convolutional interleaver.

The cell interleaver, the block interleaver, and/or the convolutional interleaver may be included in the above-described time interleaver.

In a method of transmitting a broadcast signal according to another embodiment of the present invention, the cell-interleaving may include permuting cells in one FEC block in the PLPs. The cell interleaver may perform cell interleaving by linearly writing cells in the FEC block and randomly reading the written cells. The random read operation may be performed by a permutation sequence for the FEC block. The permutation sequence may be generated by shifting one pseudorandom sequence.

In a method of transmitting a broadcast signal according to another embodiment of the present invention, the block-interleaving may include writing one TI block to a first memory, and reading the TI block written to the first memory simultaneously with writing a subsequent TI block to a second memory. Here, the TI block may include at least one FEC block.

In a method of transmitting a broadcast signal according to another embodiment of the present invention, the writing the TI block to the first memory or the second memory may include writing FEC blocks to a memory column-wise. In this instance, a virtual FEC block may be positioned in front of the written FEC block in the memory.

In a method of transmitting a broadcast signal according to another embodiment of the present invention, the reading the written TI block may include reading MUs of the written FEC block diagonal wise. Here, an MU may refer to a basic processing unit of a memory, and one MU may correspond to one cell. According to a given embodiment, one MU may include a plurality of cells or two contiguous cells. Here, the diagonal-wise reading may correspond to diagonal reading. During the read operation, virtual MUs included in the virtual FEC block may be skipped without being read.

A method of transmitting a broadcast signal according to another embodiment of the present invention may further include MIMO-encoding encoded data in the plurality of PLPs by an MIMO encoder. The MIMO encoder may be referred to as an MIMO precoder, and positioned between the encoder and the framing & interleaving block according to a given embodiment.

A description will be given of a method of receiving a broadcast signal according to an embodiment of the present invention. The method of receiving the broadcast signal according to the present embodiment is not illustrated.

The method of receiving the broadcast signal according to the present embodiment may include receiving and demodulating the broadcast signal, processing data in a signal frame, decoding data in a PLP, and/or output-processing the data in the PLP.

First, a waveform block may receive a broadcast signal having at least one signal frame. The waveform block may be a block on a receiving side corresponding to the waveform generation block on the transmitting side. The waveform block may demodulate data in the signal frame.

Thereafter, a parsing & deinterleaving block may process the demodulated data in the at least one signal frame. The parsing & deinterleaving block may be a block on the receiving side corresponding to the framing & interleaving block on the transmitting side. The parsing & deinterleaving block may perform a reverse operation of the framing & interleaving block. A plurality of PLPs may be output by this processing operation.

Thereafter, a decoder may decode data in the plurality of PLPs. Here, the decoder may be a block on the receiving side corresponding to the encoder or the BICM encoder on the transmitting side. The decoder may further include a constellation demapper, a bit deinterleaver, and/or an FEC decoder.

An output processing block may perform output processing on the decoded data in the PLPs. The output processing block may be a block on the receiving side corresponding to the above-described input processing block on the transmitting side. An output stream may be output by the output processing.

In a method of receiving a broadcast signal according to another embodiment of the present invention, the processing by the parsing & deinterleaving block may include frequency-deinterleaving data in at least one signal frame by a frequency deinterleaver, frame-parsing a PLP from the at least one signal frame by a frame parser, and/or time-deinterleaving data in the PLP by a time deinterleaver.

The parsing & deinterleaving block may include the frequency deinterleaver, the frame parser, and/or the time deinterleaver. The frequency deinterleaver, the frame parser, and/or the time deinterleaver are modules on the receiving side corresponding to the frequency interleaver, the framer, and the time interleaver on the transmitting side, and may perform reverse operations of the respective modules on the transmitting side.

In a method of receiving a broadcast signal according to another embodiment of the present invention, the time-deinterleaving may include convolutional deinterleaving data in a plurality of PLPs by a convolutional deinterleaver, block-deinterleaving the data in the plurality of PLPs by a block deinterleaver, and cell-deinterleaving the data in the plurality of PLPs by a cell deinterleaver.

The time deinterleaver may include the convolutional deinterleaver, the block deinterleaver, and/or the cell deinterleaver. The convolutional deinterleaver, the block deinterleaver, and/or the cell deinterleaver are modules on the receiving side corresponding to the convolutional interleaver, the block interleaver, and the cell interleaver on the transmitting side, and may perform reverse operations of the respective modules on the transmitting side.

In a method of receiving a broadcast signal according to another embodiment of the present invention, the above-described cell-deinterleaving may include permuting cells in one FEC block in the PLPs. The cell deinterleaver may perform cell deinterleaving by randomly writing cells in the FEC block and diagonally reading the written cells. The cell deinterleaving may be performed using a permutation sequence for the FEC block. The permutation sequence may be generated by shifting one pseudorandom sequence.

In a method of receiving a broadcast signal according to another embodiment of the present invention, the block-deinterleaving may include writing one TI block to a first memory, and reading the TI block written to the first memory simultaneously with writing a subsequent TI block to a second memory. Here, the TI block may include at least one FEC block.

In a method of receiving a broadcast signal according to another embodiment of the present invention, the writing the TI block to the first memory or the second memory may further include writing FEC blocks to a memory diagonal-wise. In this instance, a virtual FEC block may be positioned in front of the written FEC block in the memory. Here, the diagonal-wise writing may correspond to diagonal writing.

In a method of receiving a broadcast signal according to another embodiment of the present invention, the reading the written TI block may include reading MUs of the written FEC block column-wise. During the read operation, virtual MUs included in the virtual FEC block may be skipped without being read.

A method of receiving a broadcast signal according to another embodiment of the present invention may further include MIMO-decoding data in the plurality of PLPs by an MIMO decoder. The MIMO decoder may be positioned between the parsing & deinterleaving block and the BICM decoder according to a given embodiment.

The above-described steps may be omitted or replaced by other steps of performing the same/similar operations according to a given embodiment.

Figure 67:
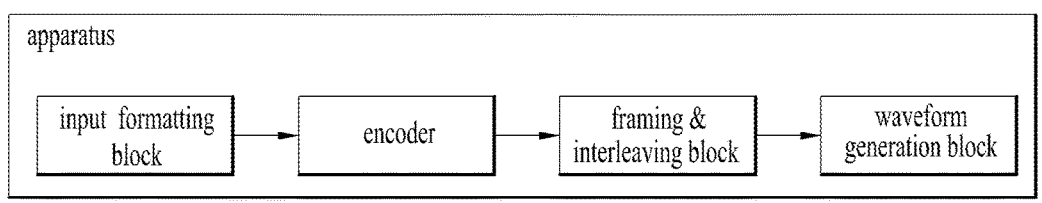
FIG. 67 illustrates an apparatus for transmitting a broadcast signal according to an embodiment of the present invention.

FIG. 67 illustrates an apparatus for transmitting a broadcast signal according to an embodiment of the present invention.

The broadcast signal transmission apparatus according to the present embodiment may include the input formatting block, the encoder, the framing & interleaving block, and/or the waveform generation block described above. The time interleaver may further include the cell interleaver, the block interleaver, and/or the convolutional interleaver. The encoder may further include the FEC encoder, the bit interleaver, and/or the constellation mapper. Each of the blocks and modules is as described above.

The broadcast signal transmission apparatus according to the present embodiment and the modules/blocks therein may perform the above-described embodiments of the method of transmitting the broadcast signal according to the present invention.

A description will be given of an apparatus for receiving a broadcast signal according to an embodiment of the present invention. The broadcast signal reception apparatus according to the present embodiment is not illustrated.

An apparatus for receiving broadcast content according to an embodiment of the present invention may include the waveform block, the frame parser, the time deinterleaver, the decoder, and/or the output processing block described above. The time deinterleaver may include the convolutional deinterleaver, the block deinterleaver, and/or the cell deinterleaver. The decoder may further include the constellation demapper, the bit deinterleaver, and/or the FEC decoder. Each of the blocks and modules is as described above.

The broadcast signal reception apparatus according to the present embodiment and the modules/blocks therein may perform the above-described embodiments of the method of receiving the broadcast signal according to the present invention.

The broadcast signal transmission apparatus, the broadcast signal reception apparatus, and the modules/blocks in the apparatus, etc. may be processors that execute continuous performance processes stored a memory, or hardware elements positioned inside/outside the apparatus according to a given embodiment.

The above-described modules may be omitted or replaced by other modules that perform the same/similar operations according to a given embodiment.

Although the description of the present invention is explained with reference to each of the accompanying drawings for clarity, it is possible to design new embodiment(s) by merging the embodiments shown in the accompanying drawings with each other. And, if a recording medium readable by a computer, in which programs for executing the embodiments mentioned in the foregoing description are recorded, is designed in necessity of those skilled in the art, it may belong to the scope of the appended claims and their equivalents.

An apparatus and method according to the present invention may be non-limited by the configurations and methods of the embodiments mentioned in the foregoing description. And, the embodiments mentioned in the foregoing description can be configured in a manner of being selectively combined with one another entirely or in part to enable various modifications.

In addition, a method according to the present invention can be implemented with processor-readable codes in a processor-readable recording medium provided to a network device. The processor-readable medium may include all kinds of recording devices capable of storing data readable by a processor. The processor-readable medium may include one of ROM, RAM, CD-ROM, magnetic tapes, floppy discs, optical data storage devices, and the like for example and also include such a carrier-wave type implementation as a transmission via Internet. Furthermore, as the processor-readable recording medium is distributed to a computer system connected via network, processor-readable codes can be saved and executed according to a distributive system.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

Various embodiments have been described in the best mode for carrying out the invention.

The present invention is available in a series of broadcast signal provision fields.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of receiving broadcast signals, the method including:
   receiving, by a waveform block, broadcast signals having at least one signal frame and demodulating, by the waveform block, the received broadcast signals;
   frame parsing, by a frame parser, plural PLPs (Physical Layer Pipes) from the at least one signal frame in the demodulated broadcast signals;
   time deinterleaving, by a time deinterleaver, data in the plural PLPs, wherein the time deinterleaving comprises:
   convolutional deinterleaving, by a convolutional deinterleaver, the data in the plural PLPs;
   block deinterleaving, by a block deinterleaver, the convolutional deinterleaved data in the plural PLPs, wherein the block deinterleaving further includes:
   writing data corresponding to a TI (Time Interleaving) block, wherein the TI block includes at least one of the FEC blocks in one of the PLPs, and
   writing data corresponding to a subsequent TI block while reading the written data; and
   cell deinterleaving, by a cell deinterleaver, the block deinterleaved data in the plural PLPs, wherein the cell deinterleaving further includes:
   permutating cells within a FEC(Forward Error Correction) block in the plural PLPs, by random-writing the cells in the FEC block and linear-reading the written cells by using a permutation sequence for the FEC block,
   wherein the permutation sequence for the FEC block is determined by shifting a pseudo random sequence;
   decoding, by a decoder, the time interleaved data in the plural PLPs; and
   output processing, by an output processing block, the decoded data in the plural PLPs to output output streams.

2. The method of claim 1, the method further includes:
   frequency deinterleaving, by a frequency deinterleaver, the demodulated broadcast signals.

3. The method of claim 1, wherein the writing a TI block further includes:
   writing the FEC blocks in the TI block diagonal-wise based on position of virtual cells.

4. The method of claim 3, wherein the virtual cells are skipped during the reading process.

5. The method of claim 1, wherein the method further includes:
   MIMO (Multi Input Multi Output) decoding, by a MIMO decoder, the data in the plural PLPs from the parsing and deinterleaving block.

6. An apparatus for receiving broadcast signals, the apparatus including:
   a waveform block that receives broadcast signals having at least one signal frame and demodulates the received broadcast signals;
   a frame parser that parses plural PLPs (Physical Layer Pipes) from the at least one signal frame in the demodulated broadcast signals;
   a time deinterleaver that time deinterleaves data in the plural PLPs by convolutional deinterleaving, wherein the time deinterleaver comprises:
   a convolutional deinterleaver that deinterleaves the data in the plural PLPs;
   a block deinterleaver that deinterleaves the convolutional deinterleaved data in the plural PLPs, wherein the block deinterleaver writes data corresponding to a TI (Time Interleaving) block, wherein the TI block includes at least one of the FEC blocks in one of the PLPs, and
   writes data corresponding to a subsequent TI block while reading the written data; and
   a cell deinterleaver that deinterleaves the block deinterleaved data in the plural PLPs, wherein the cell deinterleaver permutates cells in a FEC(Forward Error Correction) block in the plural PLPs, by random-writing the cells in the FEC block and linear-reading the written cells by using a permutation sequence for the FEC block,
   wherein the permutation sequence for the FEC block is determined by shifting a pseudo random sequence;
   a decoder that decodes data in the plural PLPs; and
   an output processing block that output processes the decoded data in the plural PLPs to output streams.

7. The apparatus of claim 6, the apparatus further includes:
   a frequency deinterleaver that frequency deinterleaves the demodulated broadcast signals.

8. The apparatus of claim 6,
   wherein the block deinterleaver writes the FEC blocks in the TI block diagonal-wise based on position of virtual cells.

9. The apparatus of claim 8, wherein the virtual cells are skipped during the reading process.

10. The apparatus of claim 6, wherein the apparatus further includes:
    a MIMO (Multi Input Multi Output) decoder that MIMO decodes the data in the plural PLPs from the parsing and deinterleaving block.

* * * * *

UNITED STATES PATENT AND TRADEMARK OFFICE
CERTIFICATE OF CORRECTION

PATENT NO. : 9,787,328 B2  
APPLICATION NO. : 14/744490  
DATED : October 10, 2017  
INVENTOR(S) : Jongseob Baek et al.

Page 1 of 1

It is certified that error appears in the above-identified patent and that said Letters Patent is hereby corrected as shown below:

In the Claims

Column 66, Lines 14-15, Claim 6, replace "a time deinterleaver that time deinterleaves data in the plural PLPs by convolutional deinterleaving, wherein" with --a time deinterleaver that time deinterleaves data in the plural PLPs, wherein--

Signed and Sealed this  
Seventh Day of April, 2020

Andrei Iancu  
*Director of the United States Patent and Trademark Office*